(12) United States Patent
Kim et al.

(10) Patent No.: US 12,207,541 B2
(45) Date of Patent: *Jan. 21, 2025

(54) DISPLAY PANEL, DISPLAY APPARATUS, AND METHOD OF MANUFACTURING DISPLAY APPARATUS

(71) Applicant: Samsung Display Co., Ltd., Yongin-si (KR)

(72) Inventors: Dongwon Kim, Yongin-si (KR); Sangwoo Kim, Yongin-si (KR); Yongseok Kim, Yongin-si (KR); Gyujeong Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/544,340

(22) Filed: Dec. 18, 2023

(65) Prior Publication Data

US 2024/0244944 A1 Jul. 18, 2024

Related U.S. Application Data

(63) Continuation of application No. 17/391,049, filed on Aug. 2, 2021, now Pat. No. 11,849,628.

(30) Foreign Application Priority Data

Dec. 23, 2020 (KR) .......................... 10-2020-0182420

(51) Int. Cl.
*H10K 77/10* (2023.01)
*G06F 1/16* (2006.01)
(Continued)

(52) U.S. Cl.
CPC .......... *H10K 77/111* (2023.02); *G06F 1/1652* (2013.01); *H10K 50/844* (2023.02); *H10K 71/00* (2023.02)

(58) Field of Classification Search
CPC .... H10K 77/111; H10K 50/844; H10K 71/00; G06F 1/1652
See application file for complete search history.

(56) References Cited

U.S. PATENT DOCUMENTS 10,673,016 B2 6/2020 Kwon et al.
11,849,628 B2 * 12/2023 Kim ...................... G06F 3/0448
(Continued)

FOREIGN PATENT DOCUMENTS

| CN | 111293235 | 6/2020 |
|---|---|---|
| KR | 10-2016-0013489 | 2/2016 |
| KR | 20200409423 | 3/2018 |

OTHER PUBLICATIONS

Notice of Allowance issued Aug. 9, 2023, in U.S. Appl. No. 17/391,049.

*Primary Examiner* — Anne M Hines
*Assistant Examiner* — Jose M Diaz
(74) *Attorney, Agent, or Firm* — KILE PARK REED & HOUTTEMAN PLLC

(57) ABSTRACT

A display panel includes a substrate including a first and a second region, which are spaced apart from each other with a penetrating portion provided therebetween, and a display element arranged on the substrate and including a first display element overlapping the first region and a second display element overlapping the second region, wherein a first side surface of the substrate that corresponds to an edge of the first region, and a second side surface of the substrate that corresponds to an edge of the second region, define at least portions of the penetrating portion, and an interval between the first and second side surfaces from an upper surface of the substrate, the upper surface facing the display element, is less than an interval between the first and second side surfaces from a lower surface of the substrate that does not face the display element.

11 Claims, 38 Drawing Sheets

(51) Int. Cl.
 *H10K 50/844* (2023.01)
 *H10K 71/00* (2023.01)

(56) References Cited

U.S. PATENT DOCUMENTS

2008/0218369 A1  9/2008  Krans et al.
2020/0409423 A1  12/2020 Hong et al.

* cited by examiner

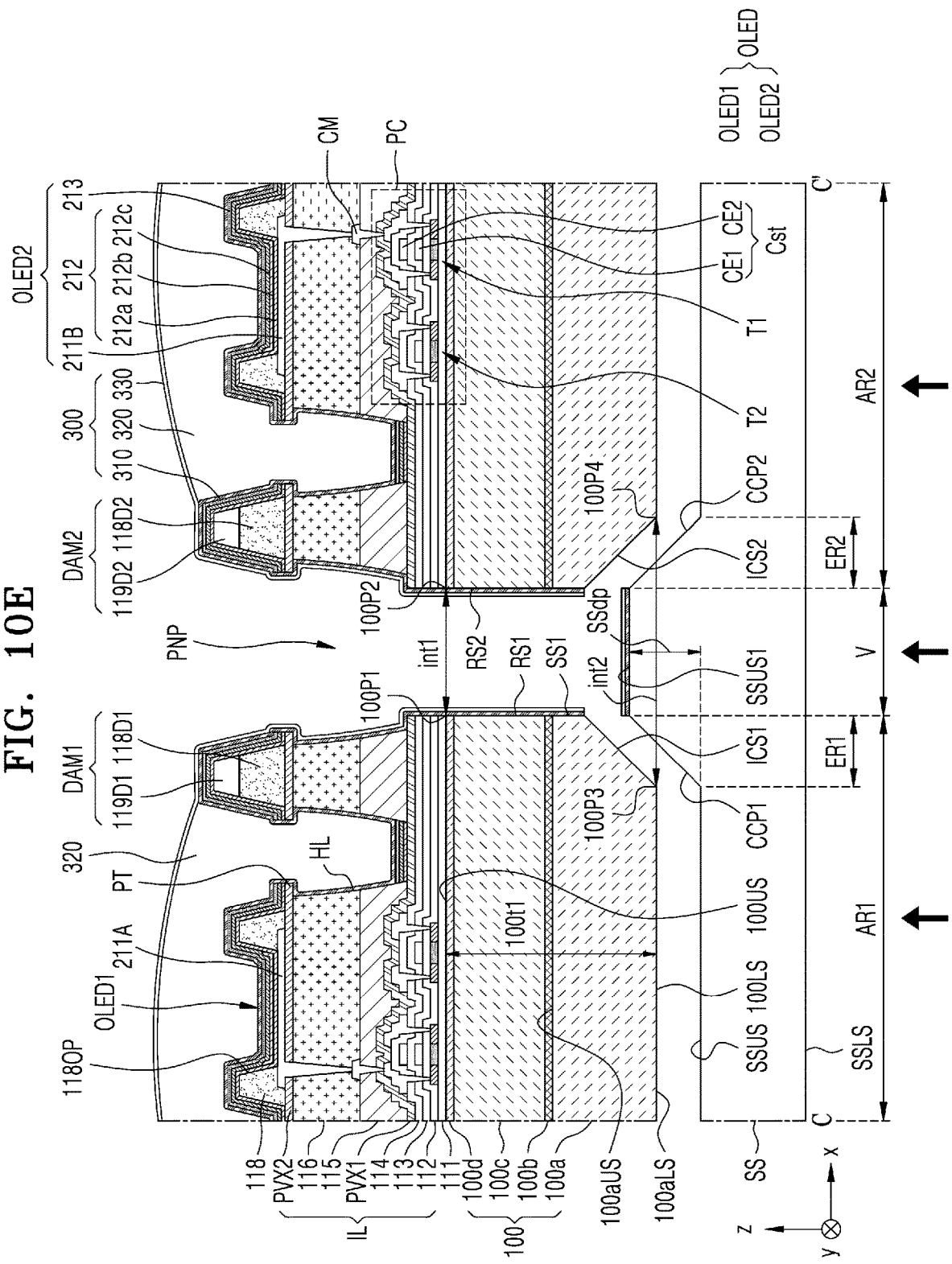

DISPLAY PANEL, DISPLAY APPARATUS, AND METHOD OF MANUFACTURING DISPLAY APPARATUS

CROSS-REFERENCE TO RELATED APPLICATION

This application is a Continuation of U.S. patent application Ser. No. 17/391,049, filed on Aug. 2, 2021 (now U.S. Pat. No. 11,849,628), which claims priority from and the benefit of Korean Patent Application No. 10-2020-0182420, filed on Dec. 23, 2020, each of which is hereby incorporated by reference for all purposes as if fully set forth herein.

BACKGROUND

Field

Embodiments/implementations of the invention relate generally to a display panel, a display apparatus, and a method of manufacturing the display apparatus.

Background

Electronic devices based on mobility are widely used. Recently, tablet personal computers (PCs), in addition to small-sized electronic devices such as mobile phones, have been widely used as mobile electronic devices. Such mobile electronic devices may include display apparatuses to provide various functions, for example, visual information to a user such as an image or a video.

Recently, flexible display apparatuses that are bendable, foldable, or rollable have been studied and developed. In addition, studies and development on stretchable display apparatuses capable of changing in various shapes or display apparatuses capable of displaying an image while being bent at a corner are being actively conducted.

Also, various functions provided onto or associated with display apparatuses are being added. For example, display apparatuses including a component area that performs various functions while displaying an image are being studied.

The above information disclosed in this Background section is only for understanding of the background of the inventive concepts, and, therefore, it may contain information that does not constitute prior art.

SUMMARY

Devices constructed/methods according to embodiments of the invention and implementations of those embodiments are capable of providing a flexible display apparatus that is capable of being bent, rolled, or folded, and that has improved reliability.

Embodiments disclosed herein provide a display panel, a display apparatus, and a method of manufacturing the display apparatus, in which the flexibility of a display panel is increased and reliability is enhanced.

Additional features of the inventive concepts will be set forth in part in the description which follows and, in part, will be apparent from the description, or may be learned by practice of the inventive concepts.

According to an embodiment, a display panel includes a penetrating portion, the display panel includes a substrate including a first region and a second region, which are spaced apart from each other with the penetrating portion provided therebetween, and a display element arranged on the substrate and including a first display element overlapping the first region and a second display element overlapping the second region, wherein a first side surface of the substrate that corresponds to an edge of the first region, and a second side surface of the substrate that corresponds to an edge of the second region, respectively define at least first and second portions of the penetrating portion, and an interval between the first side surface and the second side surface closest to an upper surface of the substrate that faces the display element, is less than an interval between the first side surface and the second side surface closest to a lower surface of the substrate, the lower surface being opposite to the upper surface of the substrate and does not face the substrate.

The substrate may include a first base layer and a first barrier layer arranged on the first base layer, and the first side surface and the second side surface may respectively include a first inclined surface of the first base layer and a second inclined surface of the first base layer.

The first base layer may further include an upper surface of the first base layer that faces the display element, a lower surface of the first base layer that is opposite to the upper surface of the first base layer and connected to the first inclined surface, and a first surface connected to the upper surface of the first base layer and the first inclined surface and crossing the first inclined surface and the upper surface of the first base layer.

The first base layer may further include an upper surface of the first base layer that faces the display element, and a lower surface of the first base layer that is opposite to the upper surface of the first base layer and connected to the first inclined surface, wherein the first inclined surface may be connected to the upper surface of the first base layer.

The substrate may further include a second base layer and second barrier layer, which cover the first barrier layer, wherein the second base layer may contact at least a portion of the first base layer.

The first base layer may include a first base pattern overlapping the first region and a second base pattern overlapping the second region and spaced apart from the first base pattern, the first barrier layer may include a first barrier pattern arranged on the first base pattern and a second barrier pattern arranged on the first base layer and spaced apart from the first barrier pattern, and a shortest distance between the first barrier pattern and the second barrier pattern may be less than a shortest distance between the first base pattern and the second base pattern.

A distance between the first inclined surface and the second inclined surface may decrease in a direction from a lower surface of the first base layer towards an upper surface of the first base layer.

The display panel may further include an encapsulation layer covering the display element and including at least one inorganic encapsulation layer and at least one organic encapsulation layer, wherein the at least one organic encapsulation layer may include a first organic encapsulation layer region and a second organic encapsulation layer region separated each other based on the penetrating portion being disposed therebetween.

The first region may include a first center region, a first connection region extending from the first center region in a first direction, and a second connection region extending in a second direction crossing the first direction, and one of the first connection region and the second connection region may extend from the first center region to the second region.

The substrate may include a front display area, a first side display area extending from the front display area in a first direction, a second side display area extending from the front display area in a second direction crossing the first direction, and a corner display area arranged between the first side display area and the second side display area, the first region and the second region may at least partially overlap the corner display area, and the first region and the second region may extend in a direction away from the front display area.

According to another embodiment, a display apparatus includes a substrate including a component area including a transmission area, and a display area surrounding at least a portion of the component area, a display element arranged on the component area and spaced apart from the transmission area, and a component overlapping the component area, wherein the substrate further includes a first base layer and a first barrier layer arranged on the first base layer, the first base layer includes an inclined surface defining a groove that overlaps the transmission area and faces the component, and a thickness of the first base layer in the groove is less than a thickness of the first base layer in the display area.

According to another embodiment, a method of manufacturing a display apparatus includes preparing a support substrate including a first concave portion and a second concave portion, forming, on the support substrate, a substrate overlapping the first concave portion and the second concave portion, forming, on the substrate, a first pixel electrode overlapping the first concave portion and a second pixel electrode overlapping the second concave portion, and detaching the substrate from the support substrate.

The forming of the substrate may include forming a first base layer that fills the first concave portion and the second concave portion, and forming a first barrier layer on the first base layer.

The method may further include forming a first base pattern arranged on the first concave portion and a second base pattern arranged on the second concave portion and spaced apart from the first base pattern by removing at least a portion of the first base layer.

The forming of the first barrier layer may include forming a first barrier pattern overlapping the first concave portion and a second barrier pattern overlapping the second concave portion and spaced apart from the first barrier pattern.

The method may further include forming a second base layer to contact the first base layer.

The preparing of the support substrate may include forming the first concave portion and the second concave portion on an upper surface of the support substrate.

The method may further include removing a portion of the substrate that overlaps a first upper surface of the support substrate arranged between the first concave portion and the second concave portion.

The first concave portion may include a first center portion, a first connection portion extending from the first center portion in a first direction, and a second connection portion extending in a second direction crossing the first direction, and one of the first connection portion and the second connection portion may extend from the first center portion towards the second concave portion.

The support substrate may further include a front concave portion integrated with the first concave portion and the second concave portion, and the first concave portion and the second concave portion may extend in a direction away from the front concave portion.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIGS. 10B, 10C, 10D, and 10E are cross-sectional views for describing a method of manufacturing a display apparatus according to an embodiment.

DETAILED DESCRIPTION

Figure 1A:
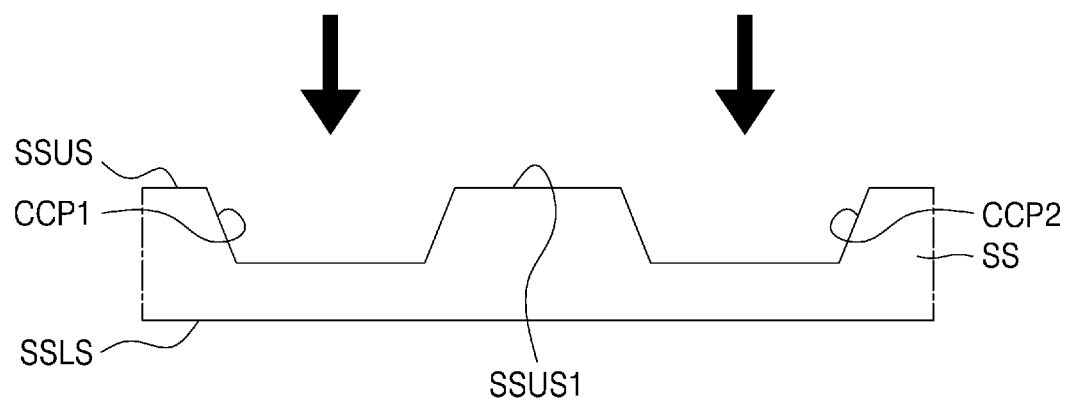
FIGS. 1A, 1B, and 1C are cross-sectional views for describing a method of manufacturing a substrate according to a first embodiment constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

A display apparatus is an apparatus for displaying a moving image or a still image, and may be used as a display screen of not only portable electronic devices, such as a mobile phone, a smartphone, a tablet personal computer (PC), a mobile communication terminal, an electronic notebook, an electronic book, a portable multimedia player (PMP), a navigation device, and an ultra mobile PC (UMPC), but also various products, such as a television, a laptop computer, a monitor, a billboard, and Internet of things (IoT). Also, a display apparatus according to an embodiment may be used for wearable devices, such as a smart watch, a watch phone, a glasses-type display, and a head mounted display (HMD). In addition, a display apparatus according to an embodiment may be used as a panel of a vehicle, a center information display (CID) arranged on a center fascia or dashboard of a vehicle, a room mirror display replacing a side mirror of a vehicle, or a display arranged on a rear surface of a front seat, as entertainment for a back seat of a vehicle.

The display apparatus may be manufactured by forming a multiple layers on a substrate. Such a substrate of the display apparatus may require various thicknesses depending on requirements. For example, when the substrate needs to be cut, the substrate may be manufactured such that a portion thereof has a small thickness and the substrate may be cut by removing a thin portion. In this case, a time taken to etch and remove the substrate may be reduced because the thin portion of the substrate is removed. As another example, in a display apparatus including a component area performing various functions while displaying an image, it is required to increase the light transmittance of a transmission area for transmitting light. In this case, the light transmittance of the transmission area may be increased by reducing a thickness of a substrate corresponding to the transmission area. Hereinafter, a method of forming a substrate having various thicknesses will be described in detail.

Figure 1B:
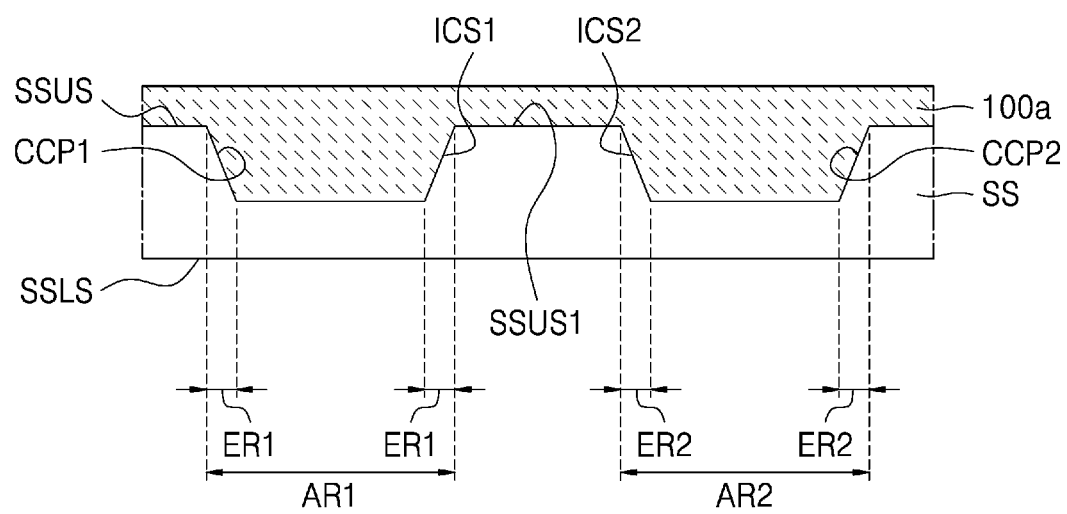
Figure 1C:
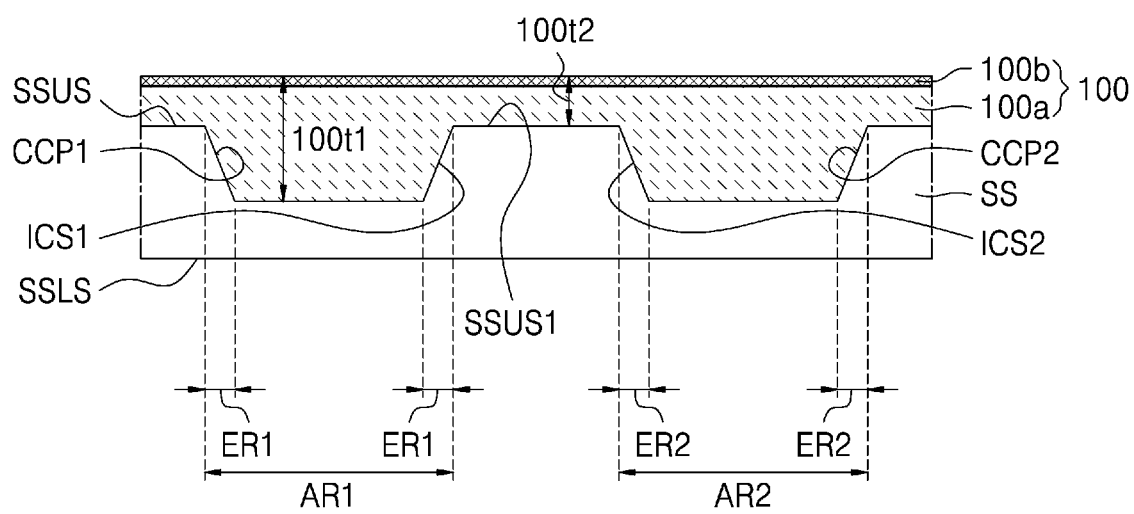

FIGS. 1A through 1C are cross-sectional views for describing a method of manufacturing a substrate 100 according to a first embodiment constructed according to principles of the invention.

Referring to FIG. 1A, a support substrate SS including a first concave portion CCP1 and a second concave portion CCP2 may be prepared. The support substrate SS may include an upper surface SSUS and a lower surface SSLS. The lower surface SSLS of the support substrate SS may be a surface opposite to the upper surface SSUS of the support substrate SS. The support substrate SS may include a material having hardness and rigidity capable of supporting a manufactured display panel, for example, a glass material.

The first concave portion CCP1 and the second concave portion CCP2 may be provided at the upper surface SSUS of the support substrate SS. The first concave portion CCP1 and the second concave portion CCP2 may have shapes dug in a direction from the upper surface SSUS of the support substrate SS to the lower surface SSLS of the support substrate SS. According to an embodiment, the first concave portion CCP1 may be defined to be an inclined side surface of the support substrate SS. According to an embodiment, the second concave portion CCP2 may be defined to be an inclined side surface of the support substrate SS.

According to an embodiment, the first concave portion CCP1 and the second concave portion CCP2 may be spaced apart from each other. In this case, a first upper surface SSUS1 of the support substrate SS may be defined between the first concave portion CCP1 and the second concave portion CCP2.

According to an embodiment, the first concave portion CCP1 and the second concave portion CCP2 may be formed at the upper surface SSUS of the flat support substrate SS. For example, the first concave portion CCP1 and the second concave portion CCP2 may be formed by irradiating a laser beam onto the upper surface SSUS of the support substrate SS. As another example, the first concave portion CCP1 and the second concave portion CCP2 may be formed by etching the upper surface SSUS of the support substrate SS. The etching may be wet etching. As another example, the first concave portion CCP1 and the second concave portion CCP2 may be formed by irradiating a laser beam onto the upper surface SSUS of the support substrate SS and then etching the upper surface SSUS of the support substrate SS.

Referring to FIG. 1B, a substrate overlapping the first concave portion CCP1 and the second concave portion CCP2 may be formed on the support substrate SS. According to an embodiment, a first base layer 100a may be formed on the support substrate SS. The first base layer 100a may fill the first concave portion CCP1 and the second concave portion CCP2. Accordingly, the first base layer 100a may overlap the first concave portion CCP1 and the second concave portion CCP2.

According to an embodiment, the first base layer 100a may also be formed on the first upper surface SSUS1 of the support substrate SS defined between the first concave portion CCP1 and the second concave portion CCP2. The first base layer 100a may be continuously arranged on the first concave portion CCP1, the first upper surface SSUS1 of the support substrate SS, and the second concave portion CCP2.

An upper surface of the first base layer 100a may be flat. According to an embodiment, a thickness of the first base layer 100a in the first concave portion CCP1 may be greater than a thickness of the first base layer 100a on the first upper surface SSUS1 of the support substrate SS.

The first base layer 100a may include a first region AR1 and a second region AR2. The first region AR1 may be a region overlapping the first concave portion CCP1. The first region AR1 may include a first external region ER1 as an edge region. At the first external region ER1, the first base layer 100a may include a first inclined surface ICS1. The first inclined surface ICS1 may be inclined. In FIG. 1B, the first inclined surface ICS1 is shown to be inclined with a constant slope, but according to another embodiment, the first inclined surface ICS1 may be inclined slightly or it may be inclined greatly. A width of the first base layer 100a in the first region AR1 may decrease in a direction from the upper surface SSUS of the support substrate SS to the lower surface SSLS of the support substrate SS.

The second region AR2 may be a region overlapping the second concave portion CCP2. The second region AR2 may include a second external region ER2 as an edge region. At the second external region ER2, the first base layer 100a may include a second inclined surface ICS2. The second inclined surface ICS2 may be inclined. In FIG. 1B, the second inclined surface ICS2 is shown to be inclined with a constant slope, but according to another embodiment, the second inclined surface ICS2 may be inclined slightly or it may be inclined greatly. A width of the first base layer 100a in the second region AR2 may decrease in a direction from the upper surface SSUS of the support substrate SS to the lower surface SSLS of the support substrate SS.

According to an embodiment, a distance between the first inclined surface ICS1 and the second inclined surface ICS2 may increase in a direction from the first upper surface SSUS1 of the support substrate SS to the lower surface SSLS of the support substrate SS.

The first base layer 100a may include a polymer resin, such as polyether sulfone, polyarylate, polyetherimide, polyethylene naphthalate, polyethylene terephthalate, polyphenylene sulfide, polyimide, polycarbonate, cellulose triacetate, or cellulose acetate propionate, or colorless polyimide (CPI). According to an embodiment, the first base layer 100a may include a siloxane-based material.

Referring to FIG. 1C, a first barrier layer 100b may be formed on the first base layer 100a. The first barrier layer 100b may be arranged on the first base layer 100a. The first barrier layer 100b is a barrier layer preventing penetration of an external foreign material and may be a single layer or a multi-layer including an inorganic material, such as silicon nitride ($SiN_x$), silicon oxide ($SiO_2$), and/or silicon oxynitride (SiON).

Next, the substrate 100 may be detached from the support substrate SS.

As such, the substrate 100 according to the first embodiment may include the first base layer 100a and the first barrier layer 100b. Because the support substrate SS includes the first concave portion CCP1 and the second concave portion CCP2, a thickness of the substrate 100 may vary depending on regions. For example, a thickness 100t1 of the substrate 100 in the first region AR1 may be greater than a thickness 100t2 of the substrate 100 between the first region AR1 and the second region AR2. In other words, the thickness 100t1 of the substrate 100 in the first concave portion CCP1 may be greater than the thickness 100t2 of the substrate 100 in the first upper surface SSUS1 of the support substrate SS.

Figure 2A:
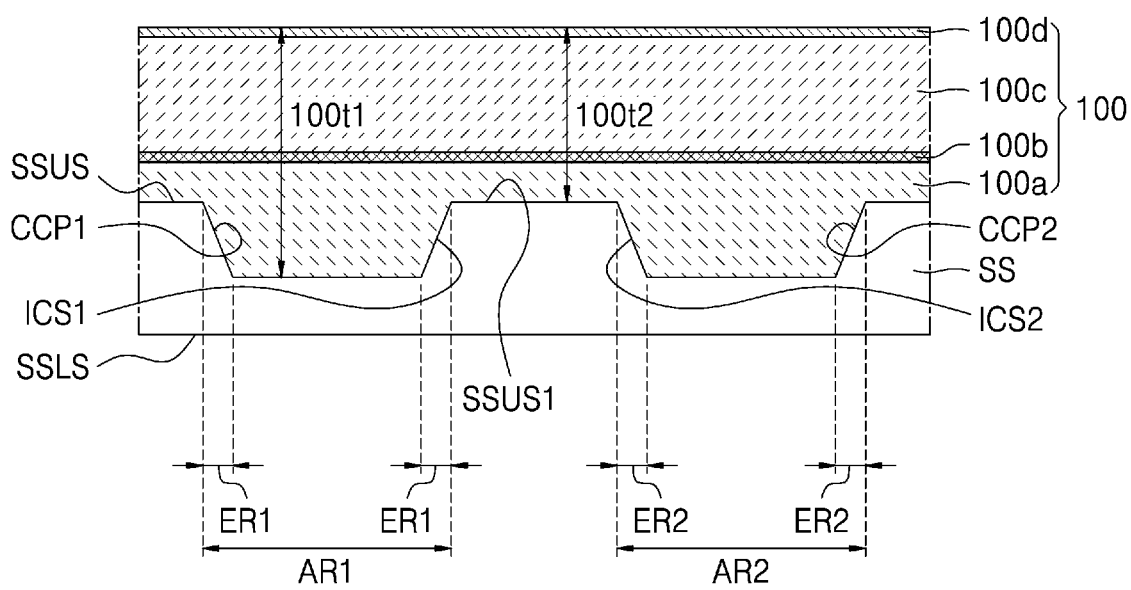
FIG. 2A is a cross-sectional view for describing a method of manufacturing a substrate, according to a second embodiment.
Figure 2B:
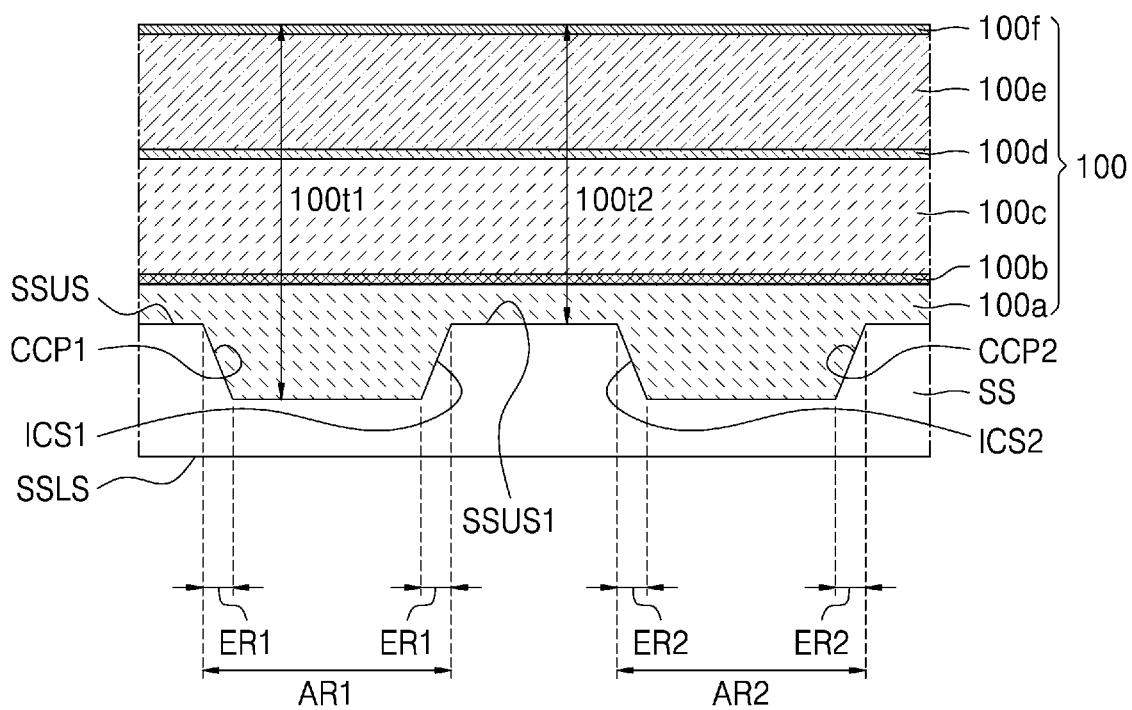
FIG. 2B is a cross-sectional view for describing a method of manufacturing a substrate, according to a third embodiment.

FIG. 2A is a cross-sectional view for describing a method of manufacturing the substrate 100, according to a second embodiment. FIG. 2B is a cross-sectional view for describing a method of manufacturing the substrate 100, according to a third embodiment. In FIGS. 2A and 2B, like reference numerals as FIGS. 1A through 1C denote like elements, and thus redundant descriptions thereof will be omitted for ease in explanation of these figures.

Referring to FIG. 2A, the support substrate SS including the first concave portion CCP1 and the second concave portion CCP2 may be prepared. Next, the substrate 100 overlapping the first concave portion CCP1 and the second concave portion CCP2 may be formed on the support substrate SS.

According to an embodiment, the first base layer 100a may be formed on the support substrate SS and the first barrier layer 100b may be formed on the first base layer 100a.

Next, a second base layer 100c may be formed on the first barrier layer 100b. The second base layer 100c may include a polymer resin, such as polyether sulfone, polyarylate, polyetherimide, polyethylene naphthalate, polyethylene terephthalate, polyphenylene sulfide, polyimide, polycarbonate, cellulose triacetate, or cellulose acetate propionate, or CPI. According to an embodiment, the second base layer 100c may include a siloxane-based material.

Next, a second barrier layer 100d may be formed on the second base layer 100c. The second barrier layer 100d is a barrier layer preventing penetration of an external foreign material, and may be a single layer or a multi-layer including an inorganic material, such as SiNX, SiO2, and/or SiON.

Next, the substrate 100 may be detached from the support substrate SS.

As such, the substrate 100 according to the second embodiment may include the first base layer 100a, the first barrier layer 100b, the second base layer 100c, and the second barrier layer 100d.

Referring to FIG. 2B, a third base layer 100e may be formed on the second barrier layer 100d. The third base layer 100e may include a polymer resin, such as polyether sulfone, polyarylate, polyetherimide, polyethylene naphthalate, polyethylene terephthalate, polyphenylene sulfide, polyimide, polycarbonate, cellulose triacetate, or cellulose acetate propionate, or CPI. According to an embodiment, the third base layer 100e may include a siloxane-based material.

Next, a third barrier layer 100f may be formed on the third base layer 100e. The third barrier layer 100f is a barrier layer preventing penetration of an external foreign material, and may be a single layer or a multi-layer including an inorganic material, such as SiNX, SiO2, and/or SiON.

Next, the substrate 100 may be detached from the support substrate SS.

Accordingly, the substrate 100 according to the third embodiment may include the first base layer 100a, the first barrier layer 100b, the second base layer 100c, the second barrier layer 100d, the third base layer 100e, and the third barrier layer 100f.

As such, the substrate 100 may be formed by alternately stacking a base layer including an organic material and a barrier layer including an inorganic material. In other words, the substrate 100 may be formed by alternately stacking a plurality of base layers and a plurality of barrier layers.

FIGS. 3A through 3D are cross-sectional views for describing a method of manufacturing the substrate 100, according to a fourth embodiment. In FIGS. 3A through 3D, like reference numerals as FIGS. 1A through 1C denote like elements, and thus, redundant descriptions thereof will be omitted for ease in explanation of these figures.

Referring to FIGS. 3A through 3D, the support substrate SS including the first concave portion CCP1 and the second concave portion CCP2 may be prepared. Next, the substrate 100 overlapping the first concave portion CCP1 and the second concave portion CCP2 may be formed on the support substrate SS.

Figure 3A:
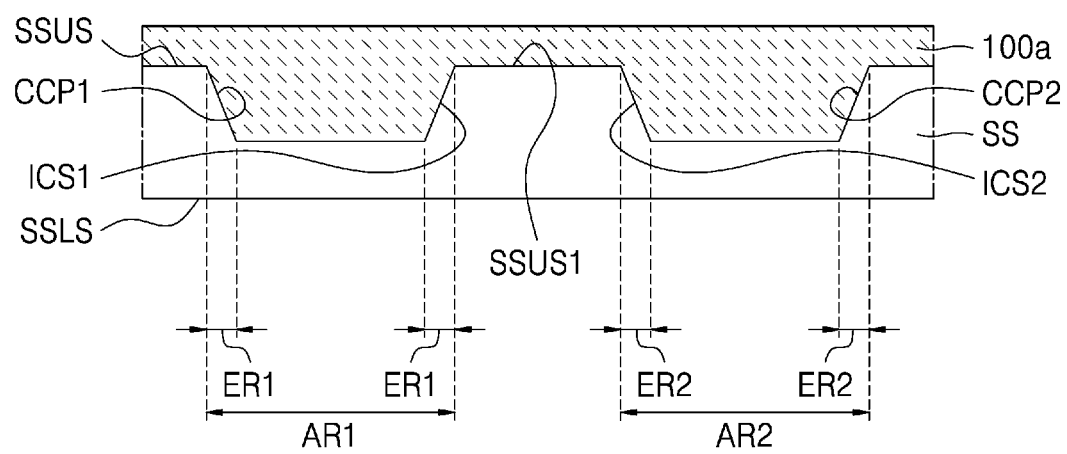
FIGS. 3A, 3B, 3C, and 3D are cross-sectional views for describing a method of manufacturing a substrate, according to a fourth embodiment.

Referring to FIG. 3A, the first base layer 100a may be formed on the support substrate SS. The first base layer 100a may fill the first concave portion CCP1 and the second concave portion CCP2.

Figure 3B:
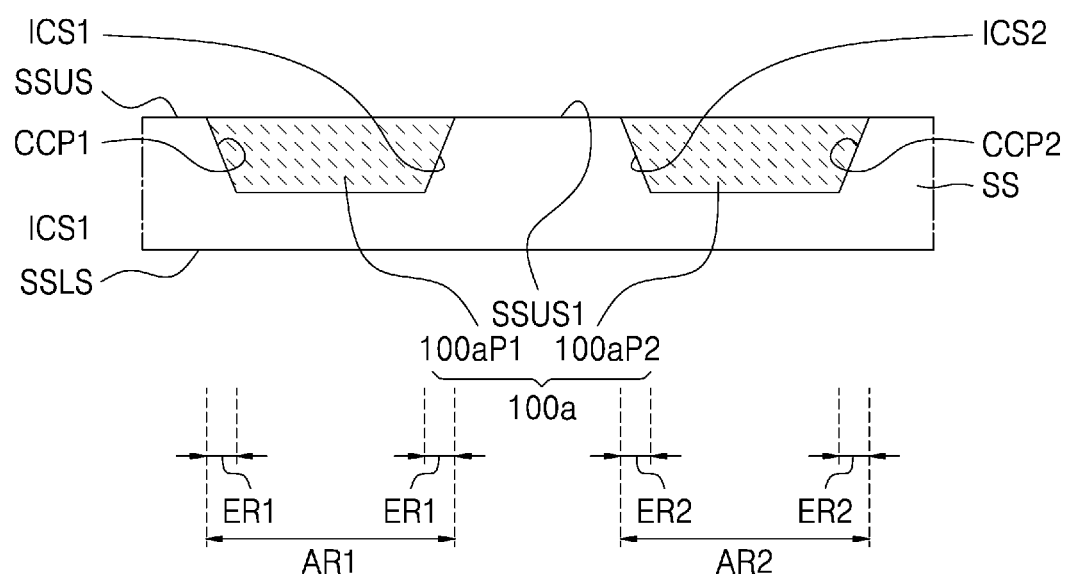

Referring to FIG. 3B, at least a portion of the first base layer 100a may be removed. According to an embodiment, a first base pattern 100aP1 and a second base pattern 100aP2 may be formed. The first base pattern 100aP1 may be arranged in the first concave portion CCP1. The second base pattern 100aP2 may be arranged in the second concave portion CCP2. The first base pattern 100aP1 and the second base pattern 100aP2 may be spaced apart from each other.

The first upper surface SSUS1 of the support substrate SS may be externally exposed. In other words, at least a portion of the first base layer 100a may be removed and thus the first upper surface SSUS1 of the support substrate SS may be externally exposed.

At least the portion of the first base layer 100a may be removed by polishing one surface of the first base layer 100a. In this case, an upper surface of at least one of the first base pattern 100aP1 and the second base pattern 100aP2 may extend in a same direction as the upper surface SSUS of the support substrate SS. According to an embodiment, chemical mechanical polishing (CMP) may be performed on the one surface of the first base layer 100a.

Figure 3C:
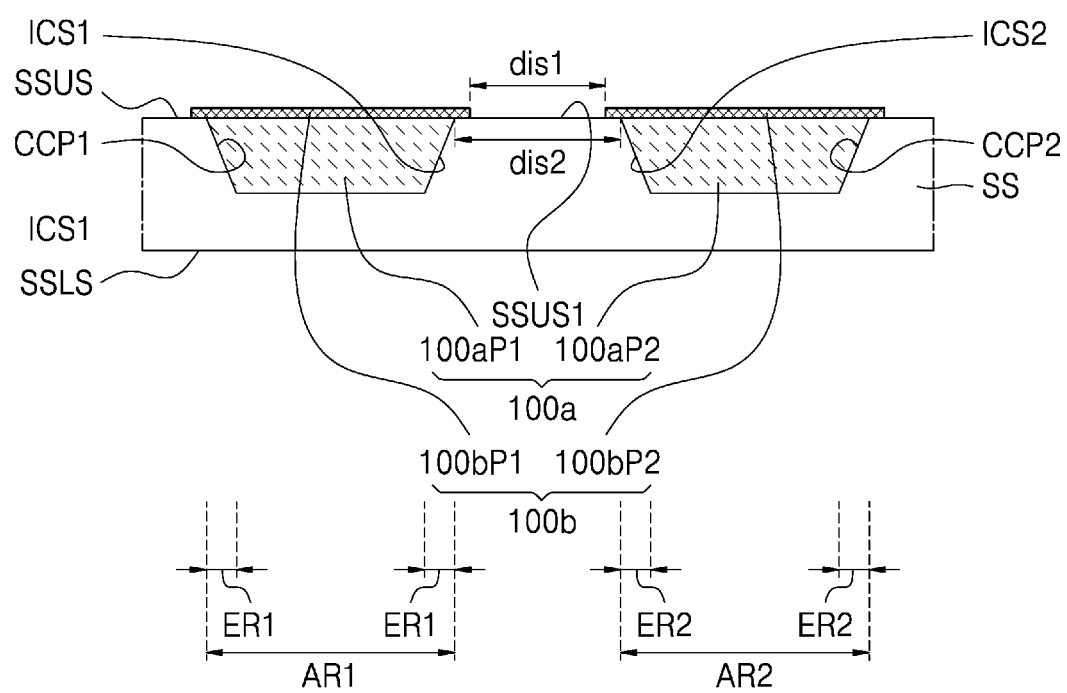

Referring to FIG. 3C, the first barrier layer 100b may be formed on the first base layer 100a. The first barrier layer 100b may include a first barrier pattern 100bP1 and a second barrier pattern 100bP2, which are spaced apart from each other. The first barrier pattern 100bP1 may be formed to overlap the first region AR1. The first barrier pattern 100bP1 may overlap the first concave portion CCP1. According to an embodiment, the first barrier pattern 100bP1 may overlap the first external region ER1 and extend from the first external region ER1 to the first upper surface SSUS1 of the support substrate SS.

The second barrier pattern 100bP2 may be formed to overlap the second region AR2. The second barrier pattern 100bP2 may overlap the second concave portion CCP2. According to an embodiment, the second barrier pattern 100bP2 may overlap the second external region ER2 and extend from the second external region ER2 to the first upper surface SSUS1 of the support substrate SS.

According to an embodiment, a shortest distance dis1 between the first barrier pattern 100bP1 and the second barrier pattern 100bP2 may be less than a shortest distance dis2 between the first base pattern 100aP1 and the second base pattern 100aP2. According to an embodiment, the shortest distance dis2 between the first base pattern 100aP1 and the second base pattern 100aP2 may be defined to be a width of the first upper surface SSUS1 of the support substrate SS.

Figure 3D:
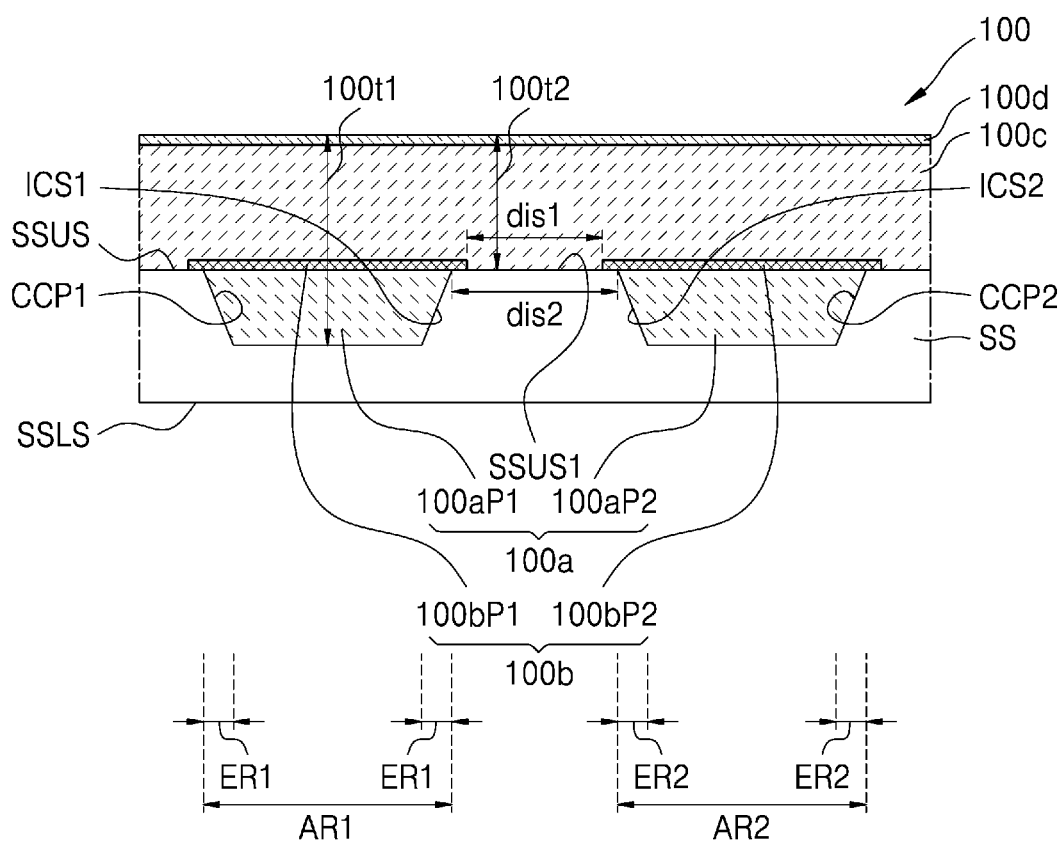

Referring to FIG. 3D, the second base layer 100c may be formed on the first barrier layer 100b. The second base layer 100c may be formed on the first barrier pattern 100bP1, the second barrier pattern 100bP2, and the first upper surface SSUS1 of the support substrate SS. The second base layer 100c may fill between the first barrier pattern 100bP1 and the second barrier pattern 100bP2. Accordingly, the second base layer 100c may be separated from the first base layer 100a. The substrate 100 according to the fourth embodiment may prevent or reduce penetration of an external foreign material through the first base layer 100a and the second base layer 100c.

The second barrier layer 100d may be formed on the second base layer 100c. Next, the substrate 100 may be detached from the support substrate SS.

Figure 4:
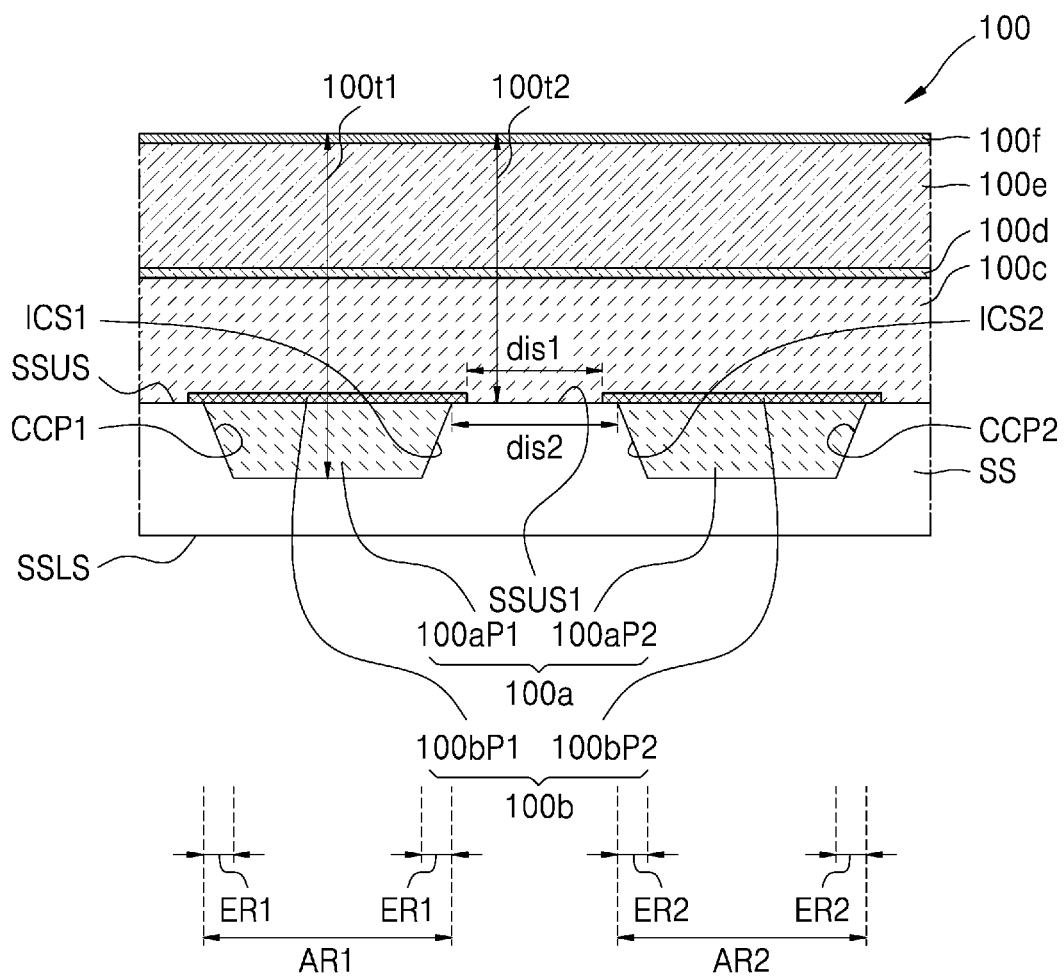
FIG. 4 is a cross-sectional view for describing a method of manufacturing a substrate, according to a fifth embodiment.

FIG. 4 is a cross-sectional view for describing a method of manufacturing the substrate 100, according to a fifth embodiment. In FIG. 4, like reference numerals as FIGS. 3A through 3D denote like elements, and thus, redundant descriptions thereof will be omitted for ease in explanation of these figures.

Referring to FIG. 4, the support substrate SS including the first concave portion CCP1 and the second concave portion CCP2 may be prepared. Next, the substrate 100 overlapping the first concave portion CCP1 and the second concave portion CCP2 may be formed on the support substrate SS.

The first base layer 100a may be formed on the support substrate SS. Next, the first base pattern 100aP1 and the second base pattern 100aP2 may be formed by removing at least a portion of the first base layer 100a. Next, the first barrier layer 100b including the first barrier pattern 100bP1 and the second barrier pattern 100bP2, which are spaced apart from each other, may be formed. Then, the second base layer 100c may be formed on the first barrier layer 100b and the second barrier layer 100d may be formed on the second base layer 100c.

Next, the third base layer 100e may be formed on the second barrier layer 100d. Next, the third barrier layer 100f may be formed on the third base layer 100e. Next, the substrate 100 may be detached from the support substrate SS.

As such, the substrate 100 may be formed by alternately stacking a base layer including an organic material and a barrier layer including an inorganic material. In other words, the substrate 100 may be formed by alternately stacking a plurality of base layers and a plurality of barrier layers.

Figure 5A:
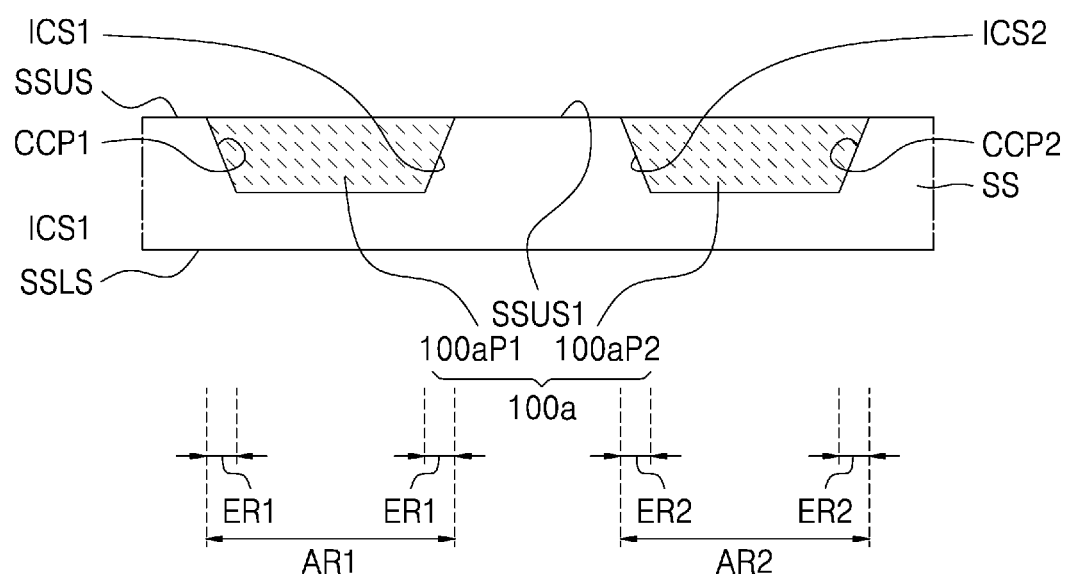
FIGS. 5A, 5B, and 5C are cross-sectional views for describing a method of manufacturing a substrate, according to a sixth embodiment.
Figure 5B:
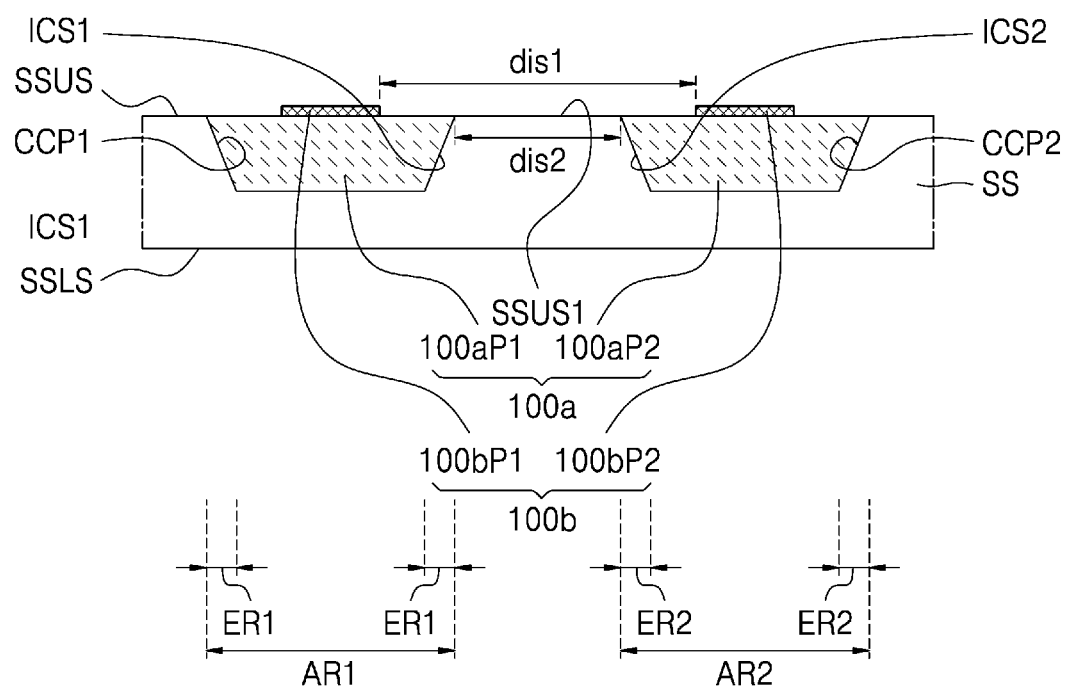
Figure 5C:
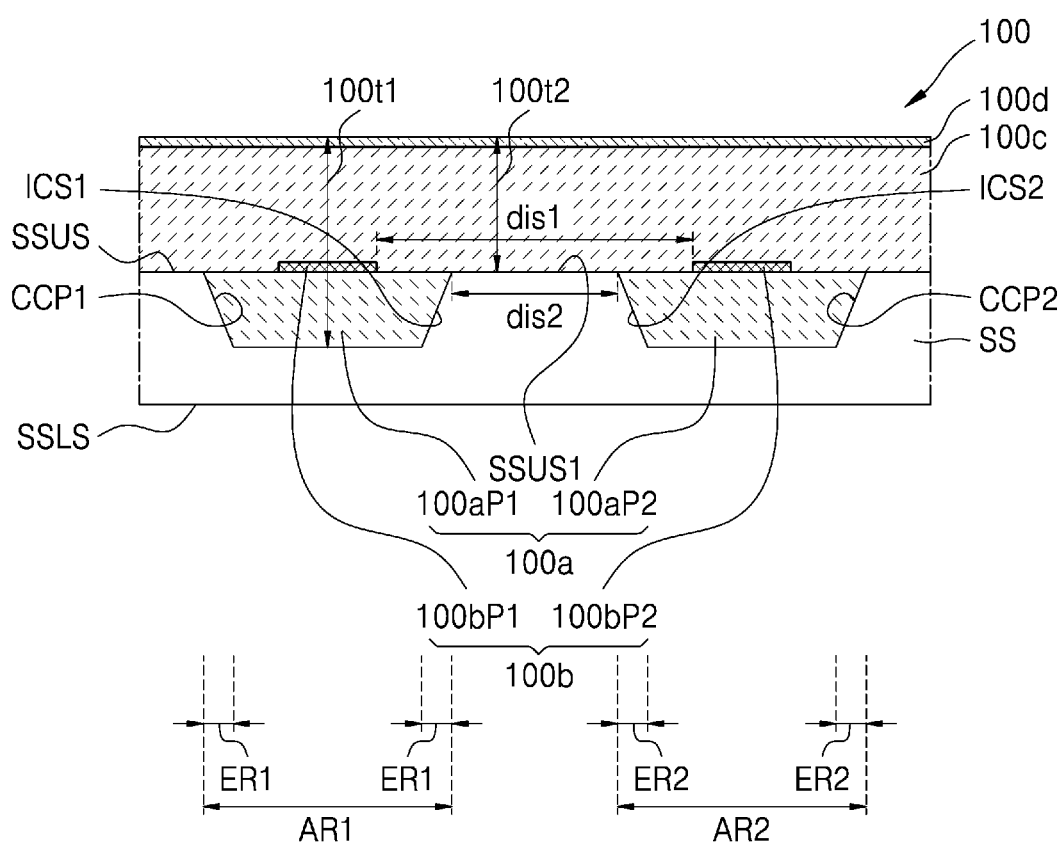

FIGS. 5A through 5C are cross-sectional views for describing a method of manufacturing the substrate 100, according to a sixth embodiment. In FIGS. 5A through 5C, like reference numerals as FIGS. 3A through 3D denote like elements, and thus, redundant descriptions thereof will be omitted for ease in explanation of these figures.

Referring to FIGS. 5A through 5C, the support substrate SS including the first concave portion CCP1 and the second concave portion CCP2 may be prepared. Next, the substrate 100 overlapping the first concave portion CCP1 and the second concave portion CCP2 may be formed on the support substrate SS.

Referring to FIG. 5A, the first base layer 100a may be formed on the support substrate SS. The first base layer 100a may fill the first concave portion CCP1 and the second concave portion CCP2. Next, the first base pattern 100aP1 and the second base pattern 100aP2 may be formed by removing at least a portion of the first base layer 100a.

Referring to FIG. 5B, the first barrier layer 100b may be formed on the first base layer 100a. The first barrier layer 100b may include the first barrier pattern 100bP1 and the second barrier pattern 100bP2, which are spaced apart from each other. The first barrier pattern 100bP1 may be formed to overlap the first region AR1. The first barrier pattern 100bP1 may overlap the first concave portion CCP1. According to an embodiment, the first barrier pattern 100bP1 may be spaced apart from the first upper surface SSUS1 of the support substrate SS. The first barrier pattern 100bP1 may not overlap the first upper surface SSUS1 of the support substrate SS. According to an embodiment, the first barrier pattern 100bP1 may be spaced apart from the first external region ER1. Accordingly, a portion of the first base pattern 100aP1 may be externally exposed.

The second barrier pattern 100bP2 may be formed to overlap the second region AR2. The second barrier pattern 100bP2 may overlap the second concave portion CCP2. According to an embodiment, the second barrier pattern 100bP2 may be spaced apart from the first upper surface SSUS1 of the support substrate SS. The second barrier pattern 100bP2 may not overlap the first upper surface SSUS1 of the support substrate SS. According to an embodiment, the second barrier pattern 100bP2 may be spaced apart from the second external region ER2. Accordingly, a portion of the second base pattern 100aP2 may be externally exposed.

According to an embodiment, the shortest distance dis1 between the first barrier pattern 100bP1 and the second barrier pattern 100bP2 may be greater than the shortest distance dis2 between the first base pattern 100aP1 and the second base pattern 100aP2.

Referring to FIG. 5C, the second base layer 100c may be formed on the first barrier layer 100b. The second base layer 100c may be formed on the first barrier pattern 100bP1, the second barrier pattern 100bP2, and the first upper surface SSUS1 of the support substrate SS. The second base layer 100c may fill between the first barrier pattern 100bP1 and the second barrier pattern 100bP2. The second base layer 100c may contact the first base layer 100a. The substrate 100 according to the sixth embodiment may have an enhanced adhesive force because the first base layer 100a including an organic material and the second base layer 100c including an organic material contact each other.

Next, the substrate 100 may be detached from the support substrate SS.

The substrate 100 described above may be used to manufacture a stretchable display apparatus capable of being changed in various shapes. Alternatively, the substrate 100 may be used to manufacture a display apparatus in which an image is displayed while being bent at a corner. Alternatively, the substrate 100 may be used to manufacture a display apparatus having a component area performing various functions while displaying an image. The display apparatus will be described in detail below.

Figure 6:
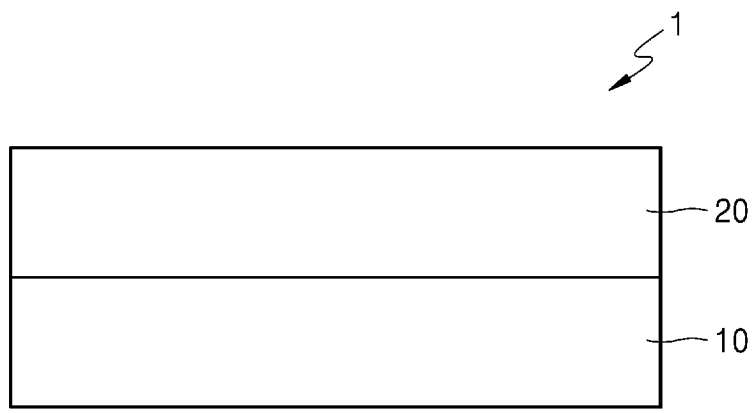
FIG. 6 is a cross-sectional view of a display apparatus according to an embodiment.
Figure 6:
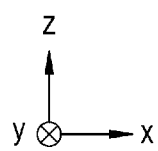

FIG. 6 is a cross-sectional view of a display apparatus 1 according to an embodiment.

Referring to FIG. 6, the display apparatus 1 may include a display panel 10 and a cover window 20. The cover window 20 may be arranged on the display panel 10.

The display panel 10 may display an image. The display panel 10 may include a plurality of pixels and may display an image by using the plurality of pixels.

The plurality of pixels may each include a display element. The display panel 10 may be an organic light-emitting display panel using an organic light-emitting diode including an organic emission layer. Alternatively, the display panel 10 may be a light-emitting diode display panel using a light-emitting diode (LED). A size of the light-emitting diode (LED) may be in micro-scale or nano-scale. For example, the light-emitting diode may be a micro light-emitting diode. Alternatively, the light-emitting diode may be a nanorod light-emitting diode. The nanorod light-emitting diode may include gallium nitride (GaN). According to an embodiment, a color conversion layer may be arranged on the nanorod light-emitting diode. The color conversion layer may include quantum dots. Alternatively, the display panel 10 may be a quantum dot light-emitting display panel using a quantum dot light-emitting diode including a quantum dot emission layer. Alternatively, the display panel 10 may be an inorganic light-emitting display panel using an inorganic light-emitting device including an inorganic semiconductor. Hereinafter, a case in which the display panel 10 is an organic light-emitting display panel using an organic light-emitting diode as a display element will be described in detail.

The cover window 20 may protect the display panel 10. According to an embodiment, the cover window 20 may protect the display panel 10 by being easily bent according to an external force without causing a crack or the like. The cover window 20 may be attached to the display panel 10 by a transparent adhesive member, such as an optically clear adhesive (OCA) film.

The cover window 20 may include glass, sapphire, or plastic. The cover window 20 may be, for example, ultra-thin glass (UTG) or CPI. According to an embodiment, the cover window 20 may have a structure in which a flexible polymer layer is arranged on one surface of a glass substrate or may include only a polymer layer.

Figure 7A:
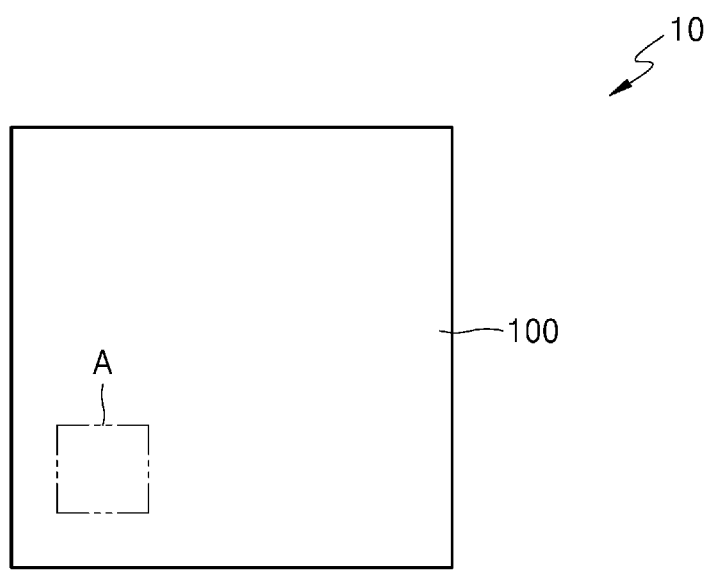
FIG. 7A is a plan view of a display panel according to an embodiment.
Figure 7A:
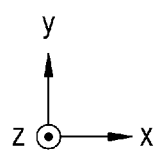
Figure 7B:
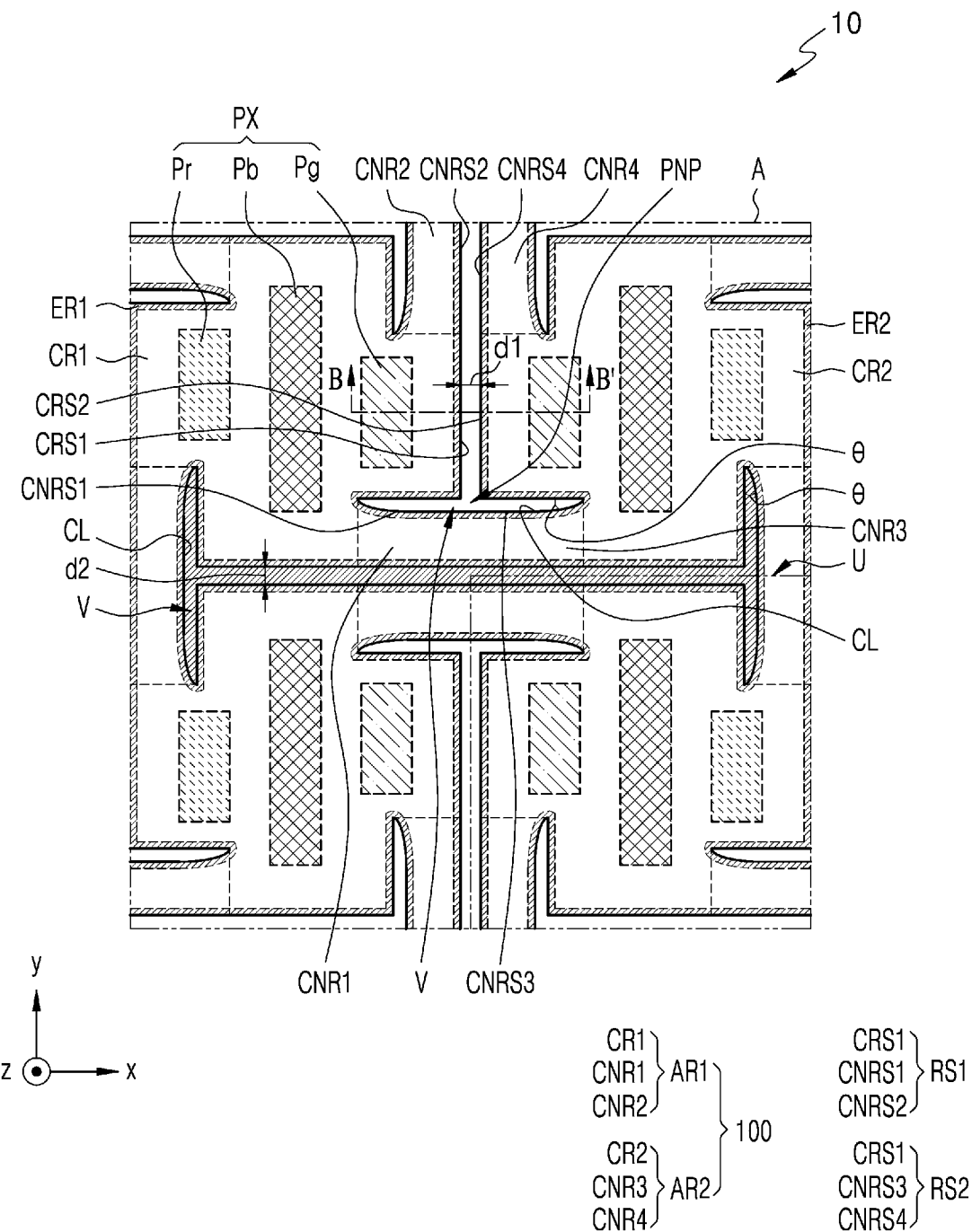
FIG. 7B is an enlarged view of a display panel according to an embodiment.
Figure 7C:
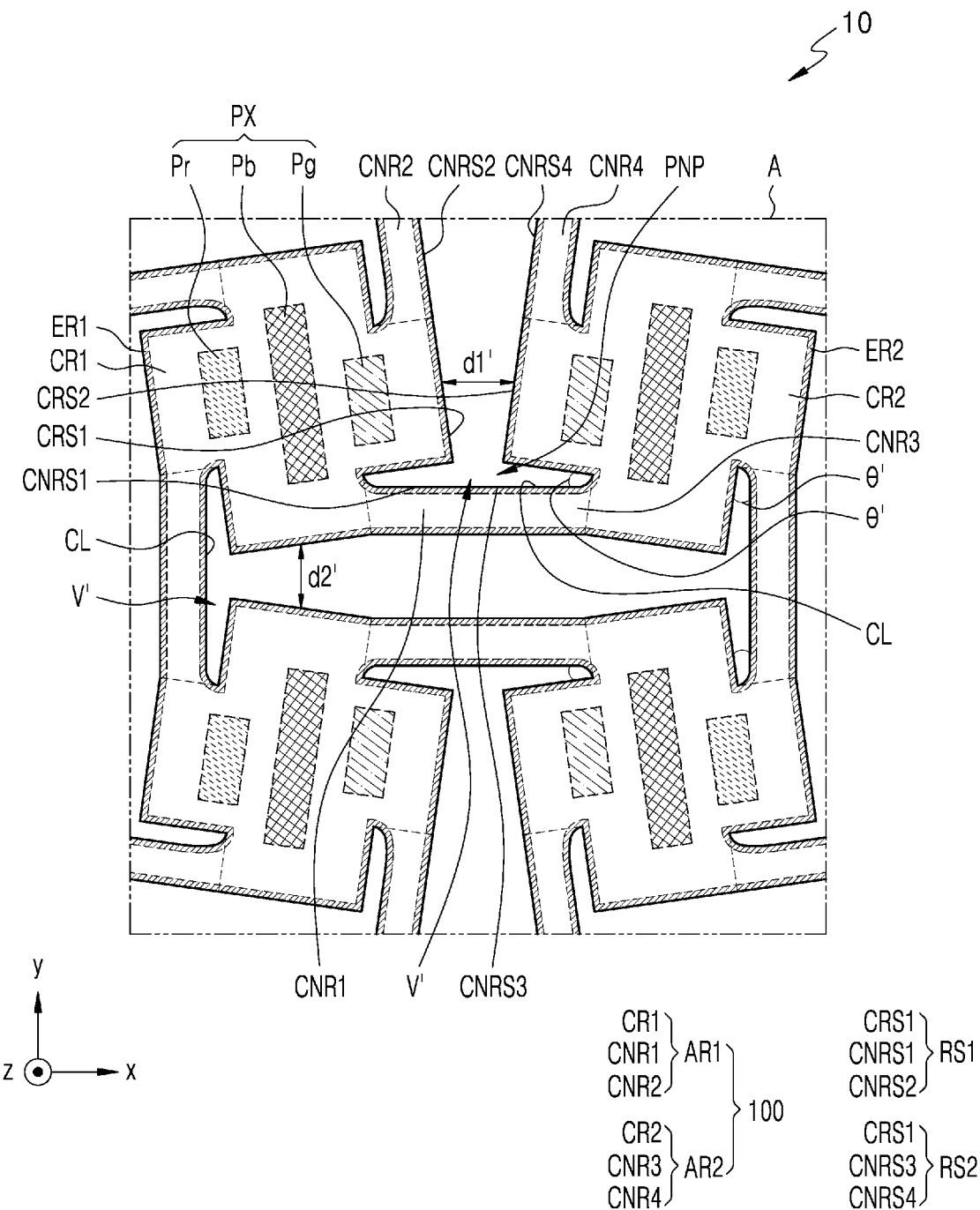
FIG. 7C is a plan view of a display panel elongated in a first direction and a second direction, according to an embodiment.

FIG. 7A is a plan view of the display panel 10 according to an embodiment. FIG. 7B is an enlarged view of the display panel 10 according to an embodiment. FIG. 7C is a plan view of the display panel 10 elongated in a first direction and a second direction, according to an embodiment. FIGS. 7B and 7C are enlarged views of a region A of the display panel 10 of FIG. 7A.

Referring to FIG. 7A, the display panel 10 may include the substrate 100 and a multi-layer film arranged on the substrate 100. The substrate 100 may be the substrate 100 according to one of the first through sixth embodiments.

Referring to FIG. 7B, the display panel 10 may include a penetrating portion PNP. The penetrating portion PNP may penetrate an upper surface and a lower surface of the display panel 10. Accordingly, the substrate 100 and the multi-layer film on the substrate 100 may not be arranged in the penetrating portion PNP. Flexibility of the display panel 10 may be enhanced as the display panel 10 includes the penetrating portion PNP.

The display panel 10 may include the substrate 100 and a pixel PX arranged on the substrate 100. The substrate 100 may include the first region AR1 and the second region AR2. The first region AR1 and the second region AR2 may be spaced apart from each other. The first region AR1 and the second region AR2 may be spaced apart from each other by a first distance d1 or a second distance d2.

The first region AR1 may include the first external region ER1 as an edge region. The first external region ER1 may extend along an edge of the first region AR1. The first external region ER1 may include a first side surface RS1 that is an edge of the first region AR1.

The second region AR2 may include the second external region ER2 as an edge region. The second external region ER2 may extend along an edge of the second region AR2. The second external region ER2 may include a second side surface RS2 that is an edge of the second region AR2.

According to an embodiment, the first side surface RS1 and the second side surface RS2 may respectively include a first inclined surface and a second inclined surface. This will be described later in more detail.

There may be pluralities of the first regions AR1 and second regions AR2. The plurality of first regions AR1 and the plurality of second regions AR2 may form lattice patterns repeatedly arranged in the first direction and the second direction. Here, the first direction and the second direction may cross each other. For example, the first direction and the second direction may form an acute angle. As another example, the first direction and the second direction may form an obtuse angle or a right angle. Hereinafter, a case in which the first direction (for example, an x-axis direction or −x-axis direction) and the second direction (for example, a y-axis direction or −y-axis direction) form a right angle will be described in detail.

According to an embodiment, the first region AR1 and the second region AR2 may be spaced apart from each other in the first direction (for example, the x-axis direction or −x-axis direction). According to another embodiment, the first region AR1 and the second region AR2 may be spaced apart from each other in the second direction (for example, the y-axis direction or −y-axis direction).

The first region AR1 and the second region AR2 may be spaced apart from each other with the penetrating portion PNP therebetween. According to an embodiment, a component of the display panel 10 may not be arranged between the first region AR1 and the second region AR2.

The first region AR1 and the second region AR2 may each include a center region and a connection region. The connection region may extend between neighboring center regions. According to an embodiment, each center region may be connected to four connection regions. The four connection regions connected to one center region extend in different directions, and each connection region may be connected to another center region arranged adjacent to the one center region.

According to an embodiment, the first region AR1 may include a first center region CR1, a first connection region CNR1, and a second connection region CNR2. The first connection region CNR1 may extend in the first direction (for example, the x-axis direction or −x-axis direction). The second connection region CNR2 may extend in the second direction (for example, the y-axis direction or −y-axis direction) crossing the first direction. The first center region CR1, the first connection region CNR1, and the second connection region CNR2 may be integrated.

According to an embodiment, the second region AR2 may include a second center region CR2, a third connection region CNR3, and a fourth connection region CNR4. The third connection region CNR3 may extend in the first direction (for example, the x-axis direction or −x-axis direction). The fourth connection region CNR4 may extend in the second direction (for example, the y-axis direction or −y-axis direction) crossing the first direction. The second center region CR2, the third connection region CNR3, and the fourth connection region CNR4 may be integrated.

One of the first connection region CNR1 and the second connection region CNR2 may extend from the first center region CR1 to the second region AR2. According to an embodiment, the first connection region CNR1 may extend towards the second center region CR2. In this case, the first connection region CNR1 and the third connection region CNR3 may contact each other and be integrated.

The first side surface RS1 of the substrate 100, which is an edge of the first region AR1, and the second side surface RS2 of the substrate 100, which is an edge of the second region AR2, may define at least a portion of the penetrating portion PNP. According to an embodiment, a side surface CRS1 of the first center region CR1, a side surface CNRS1 of the first connection region CNR1, a side surface CNRS3 of the third connection region CNR3, and a side surface CRS2 of the second center region CR2 may define at least a portion of the penetrating portion PNP. According to an embodiment, a side surface CNRS2 of the second connection region CNR2, the side surface CRS1 of the first center region CR1, the side surface CNRS1 of the first connection region CNR1, the side surface CNRS3 of the third connection region CNR3, the side surface CRS2 of the second center region CR2, and a side surface CNRS4 of the fourth connection region CNR4 may define at least a portion of the penetrating portion PNP.

A portion of one center region and connection regions extending therefrom may be defined as one base unit U. The base unit U may be repeatedly arranged in the first direction (for example, the x-axis direction or −x-axis direction) and the second direction (for example, the y-axis direction or −y-axis direction), and the substrate 100 may be understood as being provided as the repeatedly arranged base units U are connected to each other. The two adjacent base units U may be symmetric. For example, two base units U adjacent in a left-and-right direction in FIG. 7B may be symmetric laterally based on a symmetric axis located therebetween and parallel to the y-axis direction. Similarly, two base units U adjacent in a top-and-bottom direction in FIG. 7B may be symmetric longitudinally based on a symmetric axis located therebetween and parallel in the x-axis direction.

The base units U adjacent to each other among the plurality of base units U, for example, the four base units U shown in FIG. 7B, form a closed loop CL therebetween, and the closed loop CL may define a separated region V that is an empty space. The separated region V may be defined by the closed loop CL including edges of a plurality of center regions and edges of a plurality of connection regions. Each separated region V may penetrate the upper surface and the lower surface of the substrate 100. The separated region V may overlap the penetrating portion PNP of the display panel 10.

According to an embodiment, an angle θ between the side surface CRS2 of the second center region CR2 and the side surface CNRS3 of the third connection region CNR3 may be an acute angle. When an external force of pulling the substrate 100 is applied, an angle θ' (θ'>θ) between the side surface CRS2 of the second center region CR2 and the side surface CNRS3 of the third connection region CNR3 may increase as shown in FIG. 7C, an area or shape of a separated region V' may change, and a location of a center region may also change.

When the external force is applied, each center region may rotate in a certain angle via the change of the angle θ', the increase in the area of the separated region V', and/or the change in the shape of the separated region V'. Intervals between the center regions, for example, a first distance d1' and a second distance d2', may vary depending on locations, according to the rotation of each center region.

When the external force of pulling the substrate 100 is applied, stress may be concentrated in the side surface CRS2 of the second center region CR2 and the side surface CNRS3 of the third connection region CNR3, and thus, the closed loop CL defining the separated region V may include a curve to prevent damage to the substrate 100.

The pixel PX may overlap at least portions of the first region AR1 and second region AR2. According to an embodiment, each pixel PX may overlap at least a portion of each center region.

According to an embodiment, the pixel PX may include a red sub-pixel Pr, a green sub-pixel Pg, and a blue sub-pixel Pb. According to another embodiment, the pixel PX may include the red sub-pixel Pr, the green sub-pixel Pg, the blue sub-pixel Pb, and a white sub-pixel. Hereinafter, a case in which the pixel PX overlapping the first region AR1 and the second region AR2 includes the red sub-pixel Pr, the green sub-pixel Pg, and the blue sub-pixel Pb will be described in detail.

According to an embodiment, a sub-pixel is a display element and emit a certain light color by using an organic light-emitting diode. In the present specification, the sub-pixel denotes an emission region realizing an image in a minimum unit. When the organic light-emitting diode is employed as the display element, the emission region may be defined by an opening of a pixel-defining layer described below. The organic light-emitting diode may emit, for example, red, green, or blue light.

A connecting wire may be arranged in the first connection region CNR1 through fourth connection region CNR4, and may supply power or a signal to the pixel PX arranged in the first center region CR1 and the second center region CR2.

Figure 8:
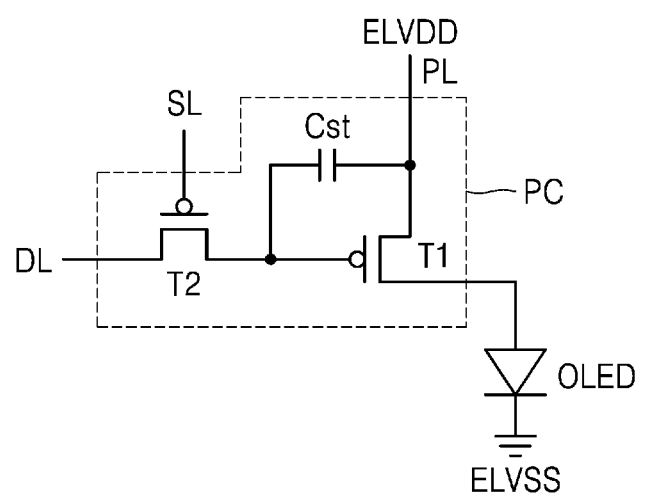
FIG. 8 is an equivalent circuit diagram of a pixel circuit applicable to a display panel.

FIG. 8 is an equivalent circuit diagram of a pixel circuit PC applicable to a display panel.

Referring to FIG. 8, the pixel circuit PC may be connected to a display element, for example, an organic light-emitting diode OLED.

The pixel circuit PC may include a driving thin-film transistor T1, a switching thin-film transistor T2, and a storage capacitor Cst. Also, the organic light-emitting diode OLED may emit red, green, or blue light or may emit red, green, blue, or white light.

The switching thin-film transistor T2 is connected to a scan line SL and a data line DL, and may transmit, to the driving thin-film transistor T1, a data signal or data voltage input from the data line DL based on a scan signal or switching voltage input from the scan line SL. The storage capacitor Cst is connected to the switching thin-film transistor T2 and a driving voltage line PL, and may store a voltage corresponding to a difference between a voltage received from the switching thin-film transistor T2 and a first power voltage ELVDD supplied to the driving voltage line PL.

The driving thin-film transistor T1 is connected to the driving voltage line PL and the storage capacitor Cst, and may be configured to control a driving current flowing through the organic light-emitting diode OLED from the driving voltage line PL in response to a voltage value stored in the storage capacitor Cst. The organic light-emitting diode OLED may emit a light of a certain luminance according to the driving current. An opposing electrode of the organic light-emitting diode OLED may receive a second power voltage ELVSS.

In FIG. 8, the pixel circuit PC includes two thin-film transistors and one storage capacitor, but the pixel circuit PC may include three or more thin-film transistors.

Figure 9:
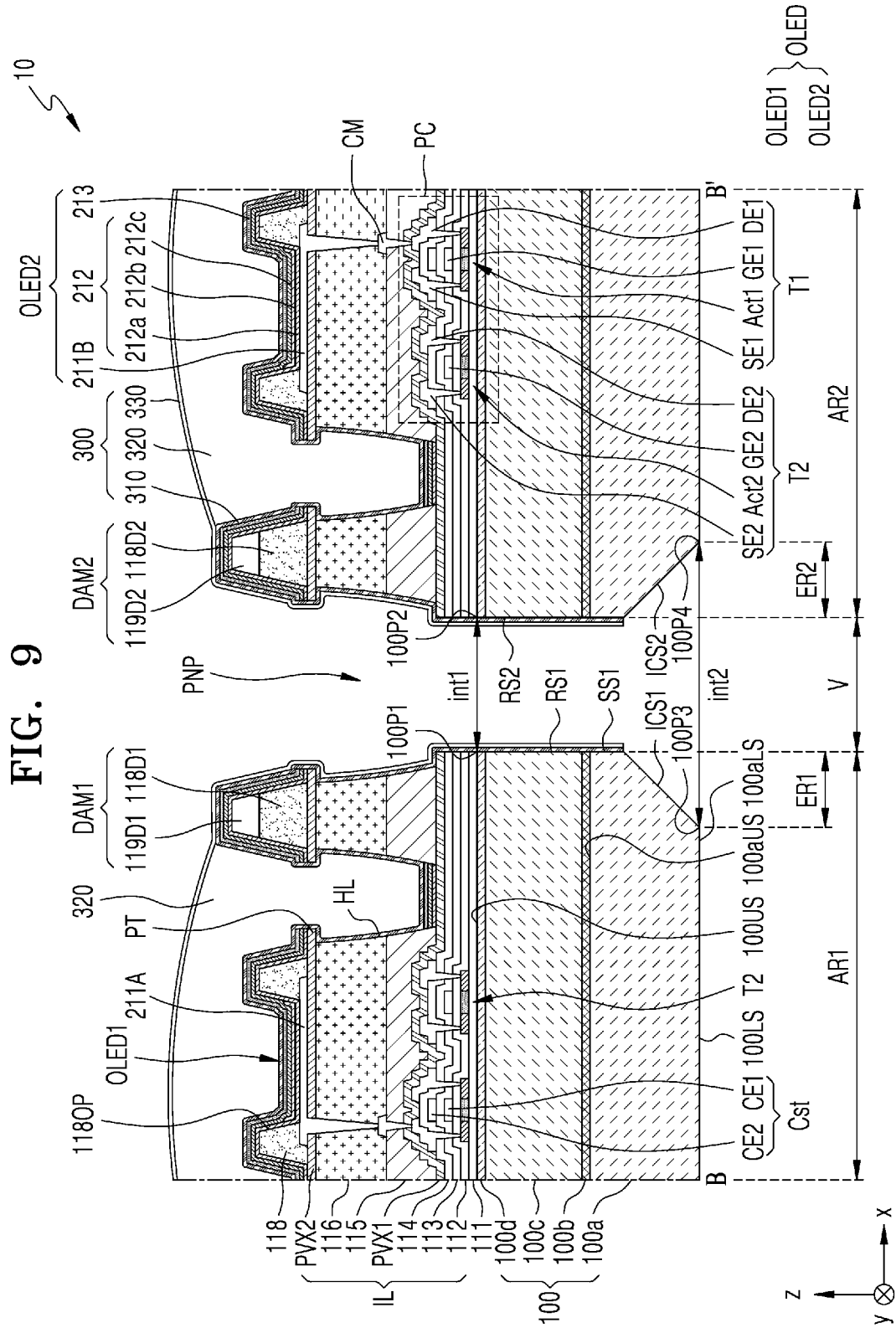
FIG. 9 is a cross-sectional view of a display panel according to an embodiment.

FIG. 9 is a cross-sectional view of the display panel 10 according to an embodiment. FIG. 9 is a cross-sectional view of the display panel 10 taken along a line B-B' of FIG. 7B.

Referring to FIG. 9, the display panel 10 may include the penetrating portion PNP. Components of the display panel 10 may not be arranged in the penetrating portion PNP. The penetrating portion PNP may be defined as an edge of the components of the display panel 10. For example, the penetrating portion PNP may be defined as an edge of the substrate 100.

The display panel 10 may include the substrate 100, a buffer layer 111, the pixel circuit PC, an insulating layer IL, the organic light-emitting diode OLED as a display element, and an encapsulation layer 300. The substrate 100 may include the first region AR1 and the second region AR2, which are spaced apart from each other with the penetrating portion PNP therebetween.

The first side surface RS1 of the substrate 100, which is an edge of the first region AR1, and the second side surface RS2 of the substrate 100, which is an edge of the second region AR2, may define at least a portion of the penetrating portion PNP. According to an embodiment, a space between the first side surface RS1 and the second side surface RS2, which face each other, may be defined as the separated region V of the substrate 100. The separated region V may overlap the penetrating portion PNP.

The substrate 100 may include an upper surface 100US facing the organic light-emitting diode OLED and a lower surface 100LS opposite to the upper surface 100US. A first interval int1 between the first side surface RS1 and the second side surface RS2 from the upper surface 100US of the substrate 100 may be less than a second interval int2 between the first side surface RS1 and the second side surface RS2 from the lower surface 100LS of the substrate 100. The first interval int1 may be an interval from a first point 100P1, where the upper surface 100US of the substrate 100 and the first side surface RS1 contact each other, to a second point 100P2, where the upper surface 100US of the substrate 100 and the second side surface RS2 contact each other. The second interval int2 may be an interval from a third point 100P3, where the lower surface 100LS of the substrate 100 and the first side surface RS1 contact each other, to a fourth point 100P4, where the lower surface 100LS of the substrate 100 and the second side surface RS2 contact each other.

The substrate 100 may include a base layer and a barrier layer on the base layer. According to an embodiment, the substrate 100 may include the first base layer 100a, the first barrier layer 100b, the second base layer 100c, and the second barrier layer 100d, which are sequentially stacked on each other in the stated order. According to an embodiment, the first base layer 100a may include the first inclined surface ICS1 and the second inclined surface ICS2.

The first side surface RS1 and the second side surface RS2 may respectively include the first inclined surface ICS1 and the second inclined surface ICS2. The first inclined surface ICS1 may overlap the first external region ER1 that is an edge region of the first region AR1. The second inclined surface ICS2 may overlap the second external region ER2 that is an edge region of the second region AR2.

According to an embodiment, the first inclined surface ICS1 may be connected to the lower surface 100LS of the substrate 100 at the first region AR1. The second inclined surface ICS2 may be connected to the lower surface 100LS of the substrate 100 at the second region AR2. According to an embodiment, the distance between the first inclined surface ICS1 and the second inclined surface ICS2 may decrease in a direction from the lower surface 100LS of the substrate 100 to the upper surface 100US of the substrate 100. In other words, the substrate 100 may include an inverted tapered shape based on the penetrating portion PNP. Hereinafter, because the second region AR2 is similar to the first region AR1, the first region AR1 will be mainly described in detail.

The first base layer 100a may include an upper surface 100aUS, a lower surface 100aLS, the first inclined surface ICS1, and a first surface SS1 of the first base layer 100a.

The upper surface 100aUS of the first base layer 100a may face the organic light-emitting diode OLED. The lower surface 100aLS of the first base layer 100a may be a surface opposite to the upper surface 100aUS of the first base layer 100a. The first inclined surface ICS1 may contact the lower surface 100aLS of the first base layer 100a.

The first surface SS1 of the first base layer 100a may cross the upper surface 100aUS of the first base layer 100a and the first inclined surface ICS1. The first surface SS1 of the first base layer 100a may contact the upper surface 100aUS of the first base layer 100a and the first inclined surface ICS1. For example, one side of the first surface SS1 of the first base layer 100a may contact the upper surface 100aUS of the first base layer 100a, and the other side of the first surface SS1 of the first base layer 100a may contact the first inclined surface ICS1. The first surface SS1 of the first base layer 100a may be a surface formed via an etching process.

At least one of the first base layer 100a and the second base layer 100c may include a polymer resin, such as polyethersulfone, polyarylate, polyetherimide, polyethylene naphthalate, polyethylene terephthalate, polyphenylene sulfide, polyimide, polycarbonate, cellulose triacetate, cellulose acetate propionate, or CPI. According to an embodiment, at least one of the first base layer 100a and the second base layer 100c may include a siloxane-based material.

The first barrier layer 100b and second barrier layer 100d are barrier layers preventing penetration of an external foreign material, and may each be a single layer or a multi-layer including an inorganic material, such as SiNX, SiO2, and/or SiON.

The buffer layer 111 may be arranged on the substrate 100. The buffer layer 111 may include an inorganic insulating material, such as SiNX, SiON, or SiO2, and may be a single layer or multi-layer including the inorganic insulating material. According to an embodiment, the buffer layer 111 may be omitted.

The pixel circuit PC may include the driving thin-film transistor T1, the switching thin-film transistor T2, and the storage capacitor Cst. The driving thin-film transistor T1, the switching thin-film transistor T2, and the storage capacitor Cst may be arranged on the buffer layer 111. The driving thin-film transistor T1 may include a first semiconductor layer Act1, a first gate electrode GE1, a first source electrode SE1, and a first drain electrode DE1. The switching thin-film transistor T2 may include a second semiconductor layer Act2, a second gate electrode GE2, a second source electrode SE2, and a second drain electrode DE2. The storage capacitor Cst may include a lower electrode CE1 and an upper electrode CE2.

The insulating layer IL may include a first gate insulating layer 112, a second gate insulating layer 113, an interlayer insulating layer 114, a first inorganic layer PVX1, a first organic insulating layer 115, a second organic insulating layer 116, and a second inorganic layer PVX2.

The first semiconductor layer Act1 may be arranged on the buffer layer 111. The first semiconductor layer Act1 may include polysilicon. Alternatively, the first semiconductor layer Act1 may include amorphous silicon, an oxide semiconductor, or an organic semiconductor. The first semiconductor layer Act1 may include a channel region, and drain region and a source region, which are arranged on both sides of the channel region, respectively.

The first gate electrode GE1 may overlap the channel region. The first gate electrode GE1 may include a low-resistance metal material. The first gate electrode GE1 may include a conductive material including molybdenum (Mo), aluminum (Al), copper (Cu), or titanium (Ti), and may be formed in a multi-layer or single layer including the conductive material.

The first gate insulating layer 112 between the first semiconductor layer Act1 and the first gate electrode GE1 may include an inorganic insulating material, such as SiO2, SiNX, SiON, aluminum oxide (Al2O3), titanium oxide (TiO2), tantalum oxide (Ta2O5), hafnium oxide (HfO2), and/or zinc oxide (ZnO).

The second gate insulating layer 113 may be provided to cover the first gate electrode GE1. Like the first gate insulating layer 112, the second gate insulating layer 113 may include an inorganic insulating material, such as SiO2, SiNX, SiON, Al2O3, TiO2, Ta2O5, HfO2, and/or ZnO.

The upper electrode CE2 may be arranged on the second gate insulating layer 113. The upper electrode CE2 may overlap the first gate electrode GE1 therebelow. Here, the upper electrode CE2 and the first gate electrode GE1 of the driving thin-film transistor T1, which overlap with the second gate insulating layer 113 therebetween, may form the storage capacitor Cst. In other words, the first gate electrode GE1 of the driving thin-film transistor T1 may function as the lower electrode CE1 of the storage capacitor Cst.

As such, the storage capacitor Cst and the driving thin-film transistor T1 may overlap. According to some embodiments, the storage capacitor Cst may not overlap the driving thin-film transistor T1.

The upper electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may be a single layer or multi-layer including such a material.

The interlayer insulating layer 114 may cover the upper electrode CE2. The interlayer insulating layer 114 may include SiO2, SiNX, SiON, Al2O3, TiO2, Ta2O5, HfO2, or ZnO. The interlayer insulating layer 114 may be a single layer or multi-layer including the inorganic insulating material described above.

The first drain electrode DE1 and the first source electrode SE1 may each be located on the interlayer insulating layer 114. The first drain electrode DE1 and the first source electrode SE1 may include a material having good conductivity. The first drain electrode DE1 and the first source electrode SE1 may include a conductive material including Mo, Al, Cu, or Ti, and may be formed in a multi-layer or single layer including the conductive material.

According to an embodiment, the first drain electrode DE1 and the first source electrode SE1 may have a multi-layer structure of Ti/Al/Ti.

The second semiconductor layer Act2, the second gate electrode GE2, the second drain electrode DE2, and the second source electrode SE2 are respectively similar to the first semiconductor layer Act1, the first gate electrode GE1, the first drain electrode DE1, and the first source electrode SE1, and thus, detailed descriptions thereof are omitted.

The first organic insulating layer 115 may cover the first drain electrode DE1 and the first source electrode SE1. The first organic insulating layer 115 may include an organic insulating material, such as a general-purpose polymer, for example, polymethylmethacrylate (PMMA) or polystyrene (PS), a polymer derivate having a phenol-based group, an acrylic-based polymer, an imide-based polymer, an aryl ether-based polymer, an amide-based polymer, a fluorine-based polymer, a p-xylene-based polymer, a vinyl alcohol-based polymer, or a blend thereof.

A connection electrode CM may be arranged on the first organic insulating layer 115. Here, the connection electrode CM may be connected to the first drain electrode DE1 or the first source electrode SE1 via a contact hole of the first organic insulating layer 115. The connection electrode CM may include a material having good conductivity. The connection electrode CM may include a conductive material including Mo, Al, Cu, or Ti, and may be formed in a multi-layer or single layer including the conductive material. According to an embodiment, the connection electrode CM may have a multi-layer structure of Ti/Al/Ti.

The second organic insulating layer 116 may cover the connection electrode CM. The second organic insulating layer 116 may include an organic insulating material, such as a general-purpose polymer, for example, PMMA or PS, a polymer derivate having a phenol-based group, an acrylic-based polymer, an imide-based polymer, an aryl ether-based polymer, an amide-based polymer, a fluorine-based polymer, a p-xylene-based polymer, a vinyl alcohol-based polymer, or a blend thereof.

The first organic insulating layer 115 and the second organic insulating layer 116 may include a hole HL. According to an embodiment, the hole HL may be provided as a hole of the first organic insulating layer 115 and a hole of the second organic insulating layer 116 overlap each other. According to another embodiment, the hole HL may be provided at the second organic insulating layer 116. In this case, an upper surface of the first organic insulating layer 115 may be exposed by the hole of the second organic insulating layer 116. Hereinafter, a case in which the hole HL is provided at the first organic insulating layer 115 and the second organic insulating layer 116 will be mainly described in detail.

According to an embodiment, the first inorganic layer PVX1 may be arranged between the interlayer insulating layer 114 and the first organic insulating layer 115. The first inorganic layer PVX1 may cover the first source electrode SE1, the first drain electrode DE1, the second source electrode SE2, and the second drain electrode DE2. According to an embodiment, the first inorganic layer PVX1 may include a contact hole such that the first source electrode SE1 or the first drain electrode DE1 is electrically connected to the connection electrode CM.

According to another embodiment, the first inorganic layer PVX1 may be arranged between the first organic insulating layer 115 and the second organic insulating layer 116. In this case, the first inorganic layer PVX1 may cover the connection electrode CM. At least a portion of the first inorganic layer PVX1 may be exposed by the hole HL. The first inorganic layer PVX1 may be a single-layer film or multi-layer film including an inorganic material, such as SiNX and/or SiO2.

The organic light-emitting diode OLED may be arranged on the second organic insulating layer 116. The organic light-emitting diode OLED may include a first organic light-emitting diode OLED1 and a second organic light-emitting diode OLED2. The first organic light-emitting diode OLED1 may overlap the first region AR1, as a first display element. The second organic light-emitting diode OLED2 may overlap the second region AR2, as a second display element.

The first organic light-emitting diode OLED1 may include a first pixel electrode 211A, an intermediate layer 212, and an opposing electrode 213. The second organic light-emitting diode OLED2 may include a second pixel electrode 211B, the intermediate layer 212, and the opposing electrode 213. The first pixel electrode 211A and the second pixel electrode 211B may each be connected to the connection electrode CM via a contact hole of the second organic insulating layer 116.

The first pixel electrode 211A and the second pixel electrode 211B may include a conductive oxide, such as indium tin oxide (ITO), indium zinc oxide (IZO), zinc oxide (ZnO), indium oxide (In2O3), indium gallium oxide (IGO), or aluminum zinc oxide (AZO). According to another embodiment, the first pixel electrode 211A and the second pixel electrode 211B may include a reflective film including silver (Ag), magnesium (Mg), aluminum (Al), platinum (Pt), palladium (Pd), gold (Au), nickel (Ni), neodymium (Nd), iridium (Ir), chromium (Cr), or a compound thereof. According to another embodiment, the first pixel electrode 211A and the second pixel electrode 211B may further include a film including ITO, IZO, ZnO, or In2O3 on/below the reflective film.

A pixel-defining layer 118 having an opening 118OP exposing each of a center portion of the first pixel electrode 211A and a center portion of the second pixel electrode 211B may be arranged on the first pixel electrode 211A and the second pixel electrode 211B. The pixel-defining layer 118 may include an organic insulating material and/or an inorganic insulating material. The opening 118OP may define an emission region of a light emitted from the organic light-emitting diode OLED. For example, a width of the opening 118OP may correspond to a width of the emission region. Also, the width of the opening 118OP may correspond to a width of a sub-pixel.

The intermediate layer 212 may be arranged on the pixel-defining layer 118. The intermediate layer 212 may include an emission layer 212b arranged at the opening 118OP of the pixel-defining layer 118. The emission layer 212b may include a high-molecular weight organic material or low-molecular weight organic material, which emit a light of certain color.

A first functional layer 212a and a second functional layer 212c may be respectively arranged below and on the emission layer 212b. The first functional layer 212a may include, for example, a hole transport layer (HTL) or may include an HTL and a hole injection layer (HIL). The second functional layer 212c is a component arranged on the emission layer 212b and may be optional. The second functional layer 212c may include an electron transport layer (ETL) and/or an electron injection layer (EIL). Like the opposing electrode 213, the first functional layer 212a and/or the second functional layer 212c may be a common layer formed to entirely cover the substrate 100.

The opposing electrode 213 may include a conductive material with a low work function. The opposing electrode 213 may include a (semi-)transparent layer including Ag, Mg, Al, Pt, Pd, Au, Ni, Nd, Ir, Cr, lithium (Li), calcium (Ca), or an alloy thereof. Alternatively, the opposing electrode 213 may further include a layer including ITO, IZO, ZnO, or In2O3, on the (semi-)transparent layer including the above material.

According to some embodiments, a capping layer may be further arranged on the opposing electrode 213. The capping layer may include lithium fluoride (LiF), an inorganic material, and/or an organic material.

The second inorganic layer PVX2 may be arranged between the organic light-emitting diode OLED and the second organic insulating layer 116. The second inorganic layer PVX2 may include a plurality of inorganic patterns that are spaced apart from each other on the second organic insulating layer 116. The second inorganic layer PVX2 may include a protruding tip PT that protrudes in a center direction of the hole HL. Accordingly, a lower portion of the protruding tip PT may be exposed at the hole HL. In other words, the hole HL may have an undercut structure. The second inorganic layer PVX2 may be a single-layer film or multi-layer film including an inorganic material, such as SiNX and/or SiO2.

The hole HL and the protruding tip PT of the second inorganic layer PVX2 may be a structure for disconnecting the first functional layer 212a and the second functional layer 212c. According to an embodiment, the first functional layer 212a, the second functional layer 212c, and the opposing electrode 213 may be formed on an entire surface of the substrate 100. In this case, the first functional layer 212a and the second functional layer 212c may include an organic material, and external oxygen, moisture, or the like may be introduced from the penetrating portion PNP to the first region AR1 and/or the second region AR2 through at least one of the first functional layer 212a and the second functional layer 212c. Such oxygen or moisture may damage the organic light-emitting diode OLED. The hole HL and the protruding tip PT of the second inorganic layer PVX2 may disconnect the first functional layer 212a and the second functional layer 212c, and a first functional layer pattern and a second functional layer pattern, which are separated from each other, may be arranged inside the hole HL. Accordingly, the introduction of moisture or oxygen from the penetrating portion PNP to the organic light-emitting diode OLED may be prevented and damage to the organic light-emitting diode OLED may be prevented.

A first dam portion DAM1 and a second dam portion DAM2 may be arranged on the second inorganic layer PVX2. The first dam portion DAM1 and the second dam portion DAM2 may protrude in a thickness direction of the substrate 100 from the second inorganic layer PVX2. The first dam portion DAM1 and the second dam portion DAM2 may be arranged adjacent to the penetrating portion PNP.

The first dam portion DAM1 may be arranged between the penetrating portion PNP and the first organic light-emitting diode OLED1. According to an embodiment, the first dam portion DAM1 may surround the first organic light-emitting diode OLED1. The first dam portion DAM1 may be arranged closer to the penetrating portion PNP than the hole HL. The first dam portion DAM1 may include a first pattern layer 118D1 and a first upper pattern layer 119D1. According to an embodiment, the first pattern layer 118D1 may include a same material as the pixel-defining layer 118. The first upper pattern layer 119D1 may include an organic insulating material and/or an inorganic insulating material.

The second dam portion DAM2 may be arranged between the penetrating portion PNP and the second organic light-emitting diode OLED2. According to an embodiment, the second dam portion DAM2 may surround the second organic light-emitting diode OLED2. The second dam portion DAM2 may be arranged closer to the penetrating portion PNP than the hole HL. The second dam portion DAM2 may include a second pattern layer 118D2 and a second upper pattern layer 119D2. According to an embodiment, the second pattern layer 118D2 may include a same material as the pixel-defining layer 118 and first pattern layer 118D1. The pixel-defining layer 118, the first pattern layer 118D1, and the second pattern layer 118D2 may be simultaneously formed. The second upper pattern layer 119D2 may include an organic insulating material and/or an inorganic insulating material. The second upper pattern layer 119D2 may include a same material as the first upper pattern layer 119D1.

The encapsulation layer 300 may be arranged on the opposing electrode 213. According to an embodiment, the encapsulation layer 300 may include at least one inorganic encapsulation layer and at least one organic encapsulation layer. According to an embodiment, FIG. 9 illustrates that the encapsulation layer 300 includes a first inorganic encapsulation layer 310, an organic encapsulation layer 320, and a second inorganic encapsulation layer 330, which are sequentially stacked in the stated order.

The first inorganic encapsulation layer 310 may cover the organic light-emitting diode OLED. The first inorganic encapsulation layer 310 may entirely and continuously cover the substrate 100. The first inorganic encapsulation layer 310 may cover the first organic light-emitting diode OLED1, the hole HL, the first dam portion DAM1, the second dam portion DAM2, and the second organic light-emitting diode OLED2. The first inorganic encapsulation layer 310 may contact the protruding tip PT of the second inorganic layer PVX2. The first inorganic encapsulation layer 310 may contact the first inorganic layer PVX1. Accordingly, the moisture or oxygen may be prevented from being introduced from the penetrating portion PNP to the organic light-emitting diode OLED through a layer including an organic material.

The organic encapsulation layer 320 may be arranged on the first inorganic encapsulation layer 310. The organic encapsulation layer 320 may overlap the first organic light-emitting diode OLED1 and the second organic light-emitting diode OLED2, and may fill the hole HL. According to an embodiment, the organic encapsulation layer 320 may be separated based on the penetrating portion PNP. Because the first dam portion DAM1 and the second dam portion DAM2 protrude in the thickness direction of the substrate 100 from an upper surface of the second inorganic layer PVX2, a flow of the organic encapsulation layer 320 may be controlled.

The second inorganic encapsulation layer 330 may cover the organic encapsulation layer 320. The second inorganic encapsulation layer 330 may entirely and continuously cover the substrate 100. The second inorganic encapsulation layer 330 may contact the first inorganic encapsulation layer 310 on the first dam portion DAM1 and the second dam portion DAM2. Accordingly, the organic encapsulation layer 320 may be separated by the first dam portion DAM1 and the second dam portion DAM2.

The first inorganic encapsulation layer 310 and the second inorganic encapsulation layer 330 may each include one or more organic materials from among $Al_2O_3$, $TiO_2$, $Ta_2O_5$, $HfO_2$, ZnO, $SiO_2$, $SiN_X$, and SiON. The organic encapsulation layer 320 may include a polymer-based material. Examples of the polymer-based material may include an acryl-based resin, an epoxy-based resin, polyimide, and polyethylene. According to an embodiment, the organic encapsulation layer 320 may include acrylate.

A touch electrode layer may be arranged on the encapsulation layer 300, and an optical functional layer may be arranged on the touch electrode layer. The touch electrode layer may obtain coordinate information according to an external input, for example, a touch event. The optical functional layer may reduce reflectance of a light (external light) incident from the outside towards a display apparatus, and/or enhance color purity of a light emitted from the display apparatus. According to an embodiment, the optical functional layer may include a retarder and/or a polarizer. The retarder may be a film type or liquid crystal coating type, and may include a $\lambda/2$ retarder and/or a $\lambda/4$ retarder. The polarizer may also be a film type or a liquid crystal coating type. The film type may include an elongated synthetic resin film, and the liquid crystal coating type may include liquid crystals arranged in a certain arrangement. The retarder and the polarizer may further include a protection film.

According to another embodiment, the optical functional layer may include a black matrix and color filters. The color filters may be arranged considering colors of lights emitted from sub-pixels of the display apparatus, respectively. The color filters may each include red, green, or blue pigment or dye. Alternatively, the color filters may each further include a quantum dot in addition to the above pigment or dye. Alternatively, some of the color filters may not include the pigment or dye, and may include scattered particles such as titanium oxide.

According to another embodiment, the optical functional layer may include a destructive interference structure. The destructive interference structure may include a first reflective layer and a second reflective layer arranged on different layers. A first reflective light and a second reflective light reflected respectively from the first reflective layer and the second reflective layer may be destructively interfered, and accordingly, reflectance of an external light may be reduced.

An adhesive member may be arranged between the touch electrode layer and the optical functional layer. A general adhesive member known in the related art may be employed as the adhesive member without limitation. The adhesive member may be a pressure sensitive adhesive (PSA).

According to an embodiment, the penetrating portion PNP may be defined in the display panel 10 and enhance flexibility of the display panel 10. The penetrating portion PNP may be defined by the first side surface RS1 of the substrate 100, which is the edge of the first region AR1, and the second side surface RS2 of the substrate 100, which is the edge of the second region AR2.

According to an embodiment, the first interval int1 may be less than the second interval int2. Also, the first side surface RS1 and the second side surface RS2 may respectively include the first inclined surface ICS1 and the second inclined surface ICS2. Accordingly, the substrate 100 may be easily detached from a support substrate and reliability of the display panel 10 may be enhanced.

Components formed in the separated region V may need to be removed while the display panel 10 is manufactured so as to form the penetrating portion PNP of the display panel 10. For example, portions of the substrate 100 and insulating layer IL, which overlap the separated region V, may be removed via etching. When the thickness of the substrate 100 is uniform, an amount of the substrate 100 to be removed in the separated region V may increase, and thus a processing time may be increased. According to an embodiment of the disclosure, the first interval int1 may be less than the second interval int2, and the substrate 100 includes the first inclined surface ICS1 and the second inclined surface ICS2. Accordingly, the amount of substrate 100 etched in the separated region V may be reduced, thereby reducing the processing time of the display panel 10.

Figure 10A:
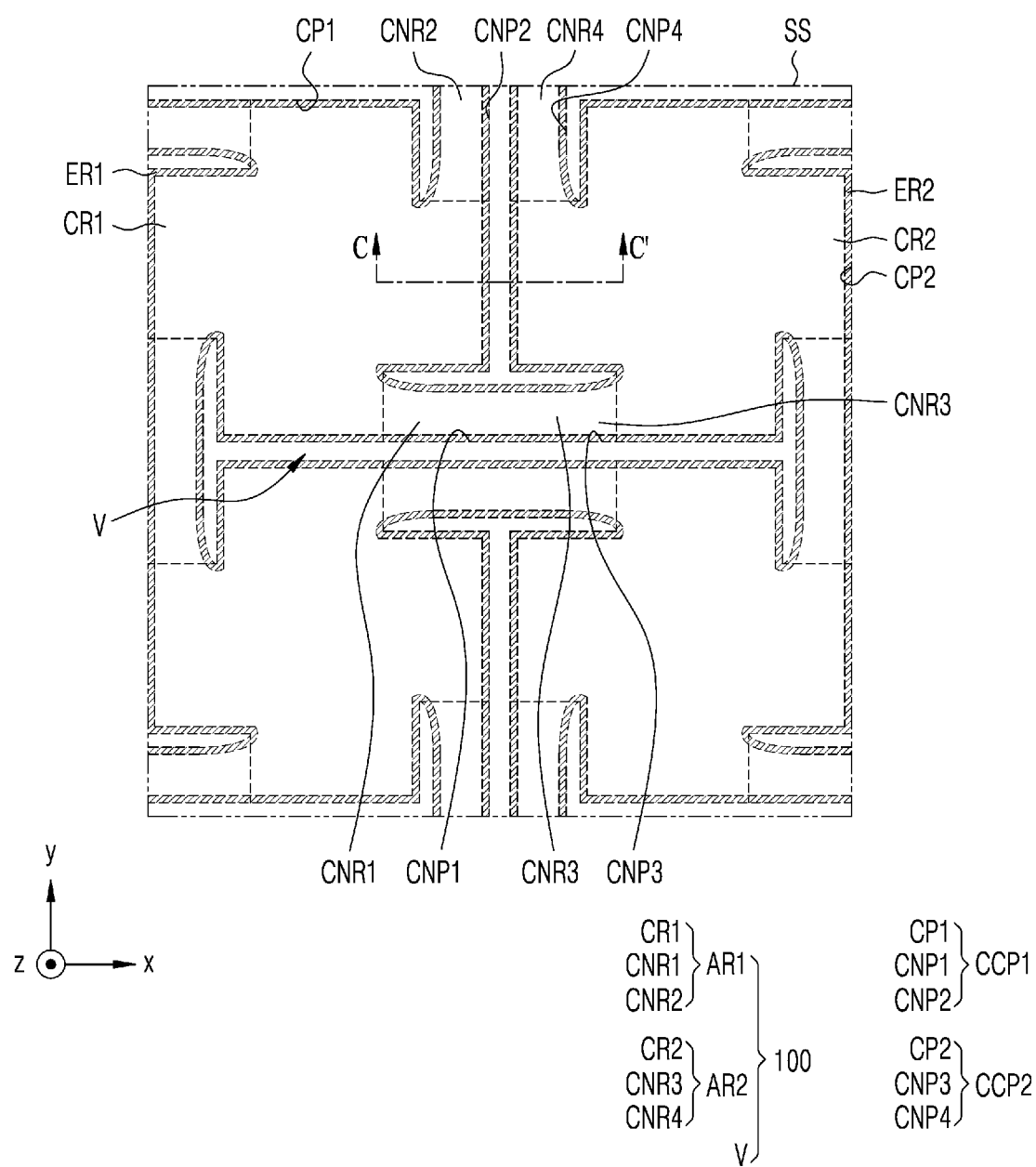
FIG. 10A is a plan view for describing a method of manufacturing a display apparatus, according to an embodiment.

FIG. 10A is a plan view for describing a method of manufacturing a display apparatus according to an embodiment. FIGS. 10B through 10E are cross-sectional views for describing a method of manufacturing a display apparatus according to an embodiment. FIGS. 10B through 10E are cross-sectional views showing the support substrate SS taken along a line C-C' of FIG. 10A, and a multi-layer film formed on the support substrate SS.

Referring to FIG. 10A, the support substrate SS including the first concave portion CCP1 and the second concave portion CCP2 may be prepared. According to an embodiment, pluralities of the first concave portions CCP1 and second concave portions CCP2 may be provided. The plurality of first concave portions CCP1 and the plurality of second concave portions CCP2 may each form lattice patterns repeatedly arranged in the first direction (for example, the x-axis direction or -x-axis direction) and the second direction (for example, y-axis direction or -y-axis direction).

According to an embodiment, the first concave portion CCP1 and the second concave portion CCP2 may be spaced apart from each other in the first direction (for example, the x-axis direction or -x-axis direction). According to an embodiment, the first concave portion CCP1 and the second concave portion CCP2 may be spaced apart from each other in the second direction (for example, the y-axis direction or -y-axis direction).

The first concave portion CCP1 and the second concave portion CCP2 may each include a center portion and a connection portion. The connection portion may extend between neighboring center portions. According to an embodiment, each center portion may be connected to four connection portions. The four connection portions connected to one center portion extend in different directions, and each connection portion may be connected to another center portion arranged adjacent to the one center portion.

According to an embodiment, the first concave portion CCP1 may include a first center portion CP1, a first connection portion CNP1, and a second connection portion CNP2. The first connection portion CNP1 may extend in the first direction (for example, the x-axis direction or -x-axis direction). The second connection portion CNP2 may extend in the second direction (for example, the y-axis direction or -y-axis direction). The first center portion CP1, the first connection portion CNP1, and the second connection portion CNP2 may be integrated.

According to an embodiment, the second concave portion CCP2 may include a second center portion CP2, a third connection portion CNP3, and a fourth connection portion CNP4. The third connection portion CNP3 may extend in the first direction (for example, the x-axis direction or -x-axis direction). The fourth connection portion CNP4 may extend in the second direction (for example, the y-axis direction or -y-axis direction). The second center portion CP2, the third connection portion CNP3, and the fourth connection portion CNP4 may be integrated.

One of the first connection portion CNP1 and the second connection portion CNP2 may extend from the first center portion CP1 to the second concave portion CCP2. According to an embodiment, the first connection portion CNP1 may extend towards the second center portion CP2. In this case, the first connection portion CNP1 and the third connection portion CNP3 may contact each other and be integrated.

The substrate 100 overlapping the first concave portion CCP1 and the second concave portion CCP2 may be formed on the support substrate SS. The substrate 100 may include the first region AR1, the second region AR2, and the separated region V. The first region AR1 may overlap the first concave portion CCP1. The first region AR1 may include the first external region ER1 as an edge region. The first external region ER1 may extend along an edge of the first region AR1. The first external region ER1 may contact the separated region V.

The second region AR2 may overlap the second concave portion CCP2. The second region AR2 may include the second external region ER2 as an edge region. The second external region ER2 may extend along an edge of the second region AR2. The second external region ER2 may contact the separated region V.

Figure 10B:
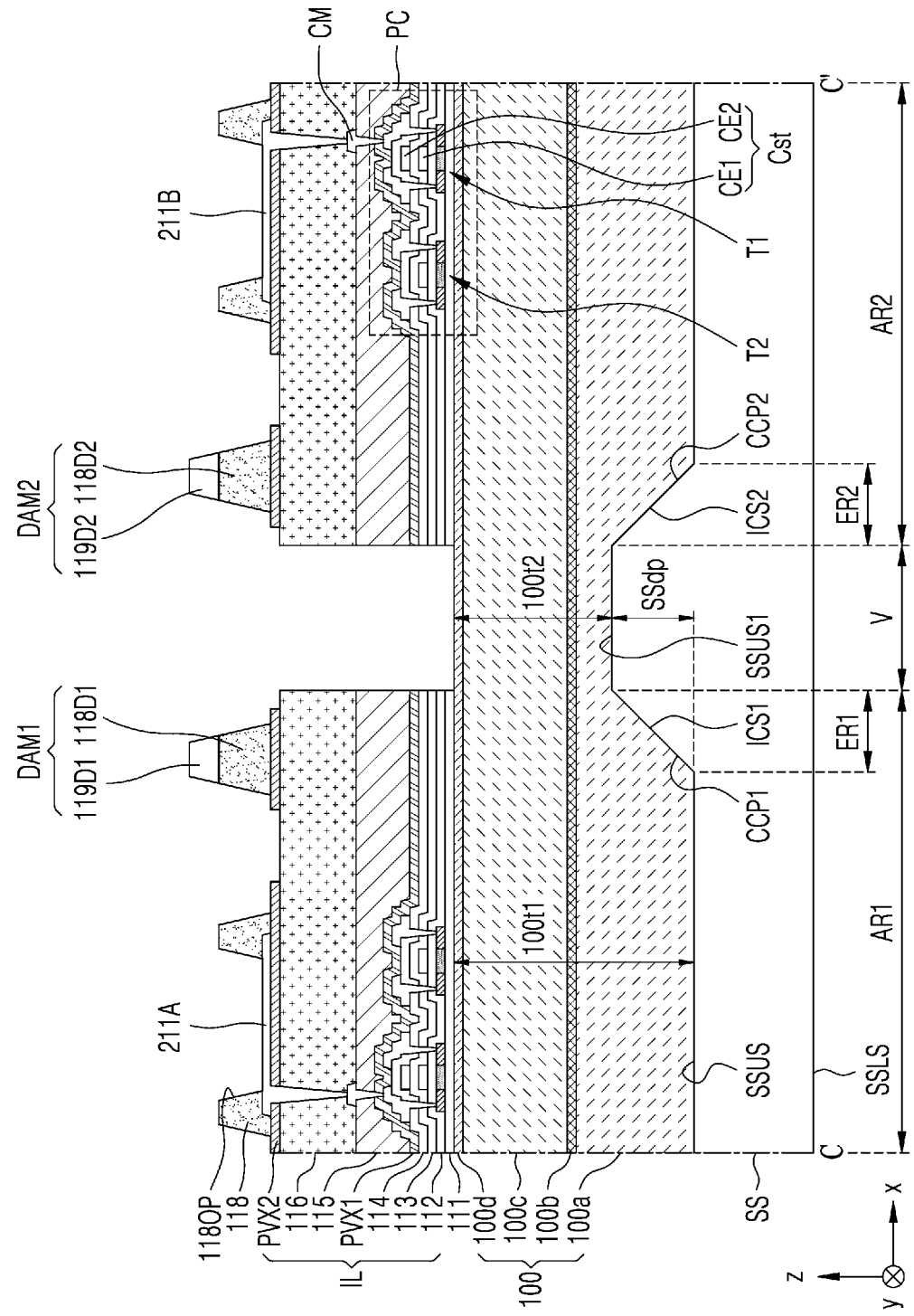

Referring to FIG. 10B, the substrate 100 may include the first base layer 100a, the first barrier layer 100b, the second base layer 100c, and the second barrier layer 100d, which are sequentially stacked on each other in the stated order. According to an embodiment, the substrate 100 may be the substrate 100 according to the second embodiment described with reference to FIG. 2A. According to another embodiment, the substrate 100 may be the substrate 100 according to the first embodiment described with reference to FIGS. 1A through 1C. According to another embodiment, the substrate 100 may be the substrate 100 according to the third embodiment described with reference to FIG. 2B. Hereinafter, a case in which the substrate 100 is the substrate 100 according to the second embodiment described with reference to FIG. 2A will be mainly described.

The buffer layer 111, the insulating layer IL, and the pixel circuit PC may be formed on the second barrier layer 100d. The pixel circuit PC may include the driving thin-film transistor T1, the switching thin-film transistor T2, and the storage capacitor Cst.

The insulating layer IL may be separated from the separated region V. According to an embodiment, the buffer layer 111, the first gate insulating layer 112, the second gate insulating layer 113, and the interlayer insulating layer 114 may each include a hole overlapping the separated region V.

The first organic insulating layer 115, the connection electrode CM, and the second organic insulating layer 116 may be formed on the first inorganic layer PVX1. According to an embodiment, the first organic insulating layer 115 and the second organic insulating layer 116 may be separated from the separated region V. According to another embodiment, at least one of the first organic insulating layer 115 and the second organic insulating layer 116 may overlap the separated region V.

The second inorganic layer PVX2 may be formed on the second organic insulating layer 116. The second inorganic layers PVX2 may be formed to be spaced apart from each other on the second organic insulating layer 116.

The first pixel electrode 211A and the second pixel electrode 211B may be formed on the second inorganic layer PVX2. The first pixel electrode 211A may be arranged on the first region AR1. The first pixel electrode 211A may overlap the first concave portion CCP1. The second pixel electrode 211B may be arranged on the second region AR2. The second pixel electrode 211B may overlap the second concave portion CCP2. The first pixel electrode 211A and the second pixel electrode 211B may be formed on the substrate 100 and spaced apart from each other.

Next, the pixel-defining layer 118, the first pattern layer 118D1, and the second pattern layer 118D2 may be formed. The pixel-defining layer 118 may be formed while covering each of an edge of the first pixel electrode 211A and an edge of the second pixel electrode 211B. The pixel-defining layer 118 may include the opening 118OP exposing each of a center portion of the first pixel electrode 211A and a center portion of the second pixel electrode 211B.

The pixel-defining layer 118, the first pattern layer 118D1, and the second pattern layer 118D2 may be simultaneously formed. According to an embodiment, the pixel-defining layer 118, the first pattern layer 118D1, and the second pattern layer 118D2 may be formed by patterning an organic layer after forming the organic layer entirely on the substrate 100. In this case, the pixel-defining layer 118, the first pattern layer 118D1, and the second pattern layer 118D2 may include a same material.

The first upper pattern layer 119D1 and the second upper pattern layer 119D2 may be respectively formed on the first pattern layer 118D1 and the second pattern layer 118D2. According to an embodiment, the first upper pattern layer 119D1 and the second upper pattern layer 119D2 may be formed by patterning an organic layer after forming the organic layer entirely on the substrate 100. In this case, the first upper pattern layer 119D1 and the second upper pattern layer 119D2 may include a same material.

The first pattern layer 118D1 and the first upper pattern layer 119D1 may form a first dam portion DAM1, and the second pattern layer 118D2 and the second upper pattern layer 119D2 may form a second dam portion DAM2.

According to an embodiment, the support substrate SS may include the first concave portion CCP1 and the second concave portion CCP2, and the substrate 100 may overlap the first concave portion CCP1 and the second concave portion CCP2. Accordingly, a thickness of the substrate 100 may vary according to regions. For example, the thickness 100t1 of the substrate 100 in the first region AR1 may be greater than the thickness 100t2 of the substrate 100 between the first region AR1 and the second region AR2.

Figure 10C:
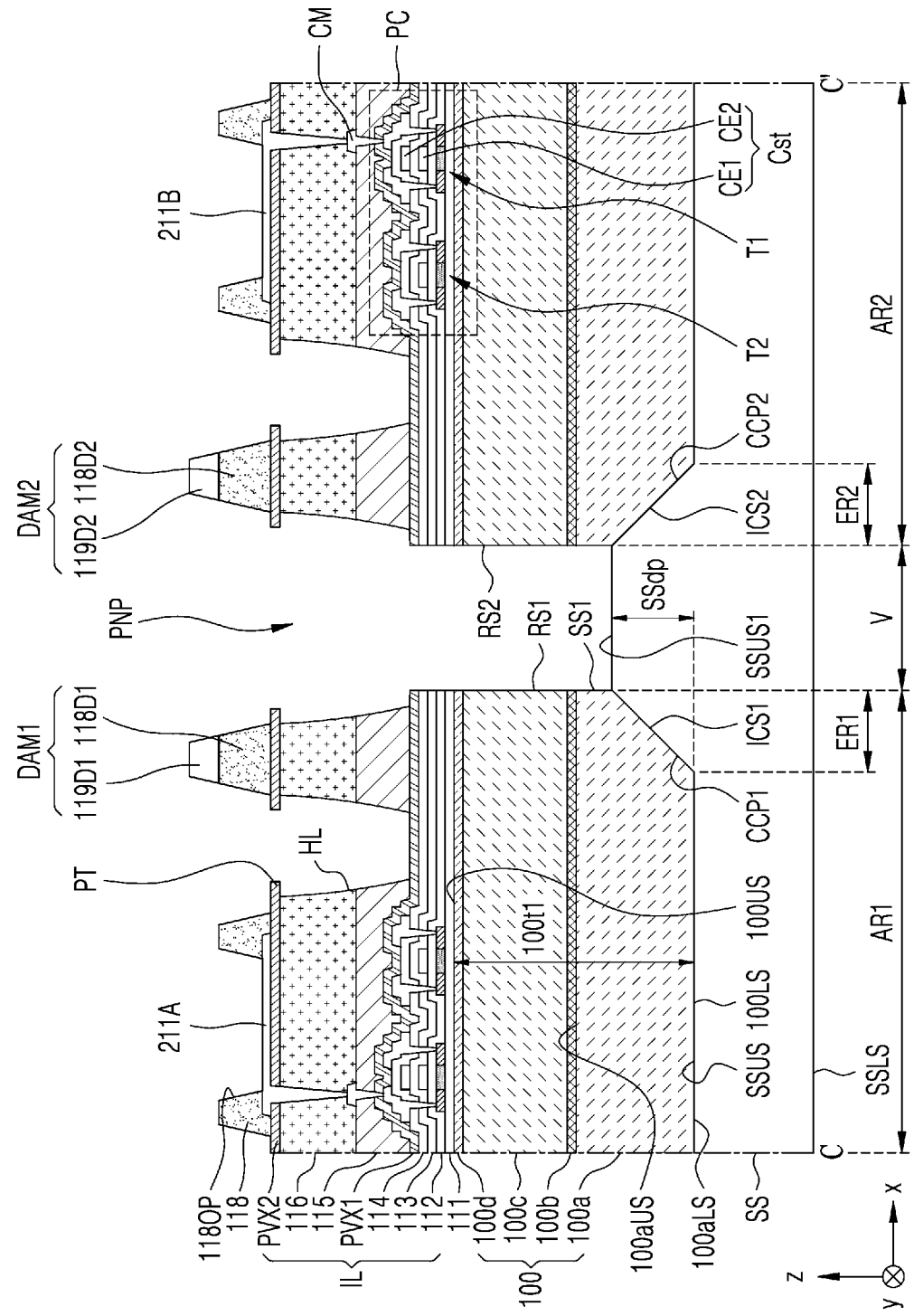

Referring to FIG. 10C, a portion of the substrate 100 overlapping the first upper surface SSUS1 of the support substrate SS may be removed. In other words, a portion of the substrate 100 overlapping the separated region V may be removed. Accordingly, the first upper surface SSUS1 of the support substrate SS may be externally exposed. In other words, the penetrating portion PNP may be formed. The first side surface RS1 of the substrate 100, which is an edge of the first region AR1, and the second side surface RS2 of the substrate 100, which is an edge of the second region AR2, may define at least a portion of the penetrating portion PNP.

According to an embodiment, the substrate 100 may be removed via an etching process. The etching process may be, for example, a dry etching process.

According to an embodiment of the disclosure, the support substrate SS may include the first concave portion CCP1 and the second concave portion CCP2, and the substrate 100 may overlap the first concave portion CCP1 and the second concave portion CCP2. Accordingly, an amount of substrate 100 etched in the separated region V may be reduced. For example, an amount of substrate 100 etched by a depth SSdp of the first concave portion CCP1 and/or the second concave portion CCP2 may be reduced, and a processing time of the display panel and/or the display apparatus may be reduced.

According to an embodiment, the hole HL may be formed at the first organic insulating layer 115 and the second organic insulating layer 116. According to an embodiment, the second organic insulating layer 116 arranged below the second inorganic layer PVX2 may be over-etched. Accordingly, the first organic insulating layer 115 and the second organic insulating layer 116 may have undercut structures. In this case, a lower surface of an end portion of the second inorganic layer PVX2 may be exposed. In other words, a lower surface of the protruding tip PT of the second inorganic layer PVX2, which overlap the hole HL, may be exposed.

Figure 10D:
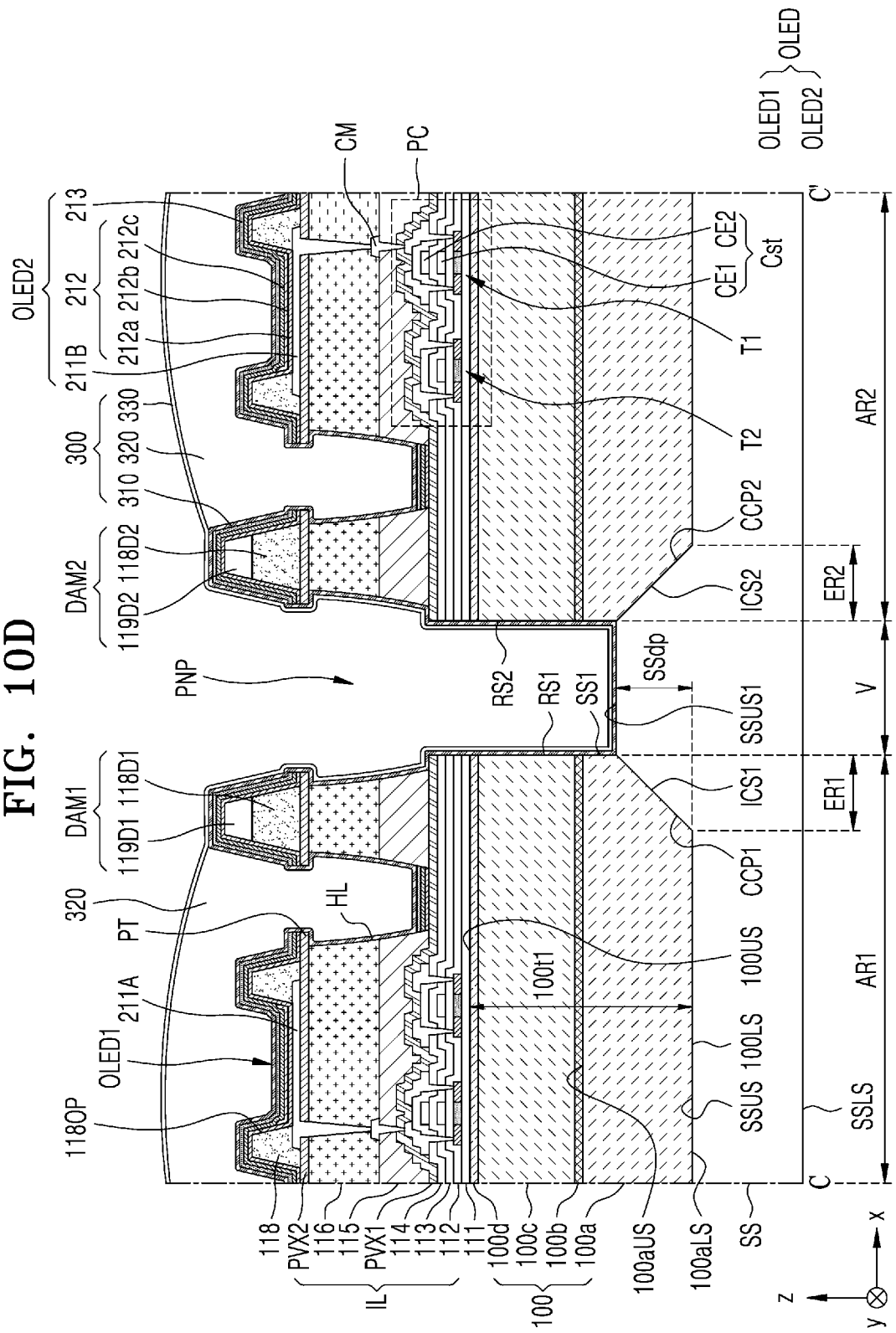

Referring to FIG. 10D, the intermediate layer 212 and the opposing electrode 213 may be formed on the substrate 100. Accordingly, the first organic light-emitting diode OLED1 and the second organic light-emitting diode OLED2 may be formed. Because the second inorganic layer PVX2 includes the protruding tip PT protruding in a center direction of the hole HL, the first functional layer 212a, the second functional layer 212c, and the opposing electrode 213 may be disconnected based on the hole HL. Also, the lower surface of the protruding tip PT of the second inorganic layer PVX2 may not contact the first functional layer 212a, the second functional layer 212c, and the opposing electrode 213. Accordingly, introduction of external moisture and foreign material to the organic light-emitting diode OLED through at least one of the first functional layer 212a and the second functional layer 212c may be prevented or reduced, and the reliability of the display panel may be enhanced.

Next, the encapsulation layer 300 may be formed.

According to an embodiment, the first inorganic encapsulation layer 310 covering the organic light-emitting diode OLED may be formed. The first inorganic encapsulation layer 310 may entirely and continuously cover the substrate 100. The first inorganic encapsulation layer 310 may cover the first organic light-emitting diode OLED1, the hole HL, the first dam portion DAM1, the second dam portion DAM2, and the second organic light-emitting diode OLED2. The first inorganic encapsulation layer 310 may contact the protruding tip PT of the second inorganic layer PVX2. The first inorganic encapsulation layer 310 may contact the first inorganic layer PVX1. Accordingly, moisture or oxygen may be prevented from being introduced from the penetrating portion PNP to the organic light-emitting diode OLED through a layer including an organic material.

Next, the organic encapsulation layer 320 may be formed on the first inorganic encapsulation layer 310. The organic encapsulation layer 320 may overlap the first organic light-emitting diode OLED1 and the second organic light-emitting diode OLED2, and may fill the hole HL. According to an embodiment, the organic encapsulation layer 320 may be separated based on the penetrating portion PNP.

Next, the second inorganic encapsulation layer 330 covering the organic encapsulation layer 320 may be formed. The second inorganic encapsulation layer 330 may entirely and continuously cover the substrate 100. The second inorganic encapsulation layer 330 may contact the first inorganic encapsulation layer 310 on the first dam portion DAM1 and the second dam portion DAM2. Accordingly, the organic encapsulation layer 320 may be separated by the first dam portion DAM1 and the second dam portion DAM2.

Next, the touch electrode layer and/or the optical functional layer may be formed on the encapsulation layer 300. When the touch electrode layer and/or the optical functional layer are formed, processes of forming, exposing and developing a photoresist on the encapsulation layer 300 may be performed. Such processes may be performed after the penetrating portion PNP is formed. Accordingly, the photoresist may be coated not only on the first region AR1 and the second region AR2, but also on the separated region V. The photoresist coated on the separated region V may be removed via a developing process, and a process difficulty level may increase due to a depth of the penetrating portion PNP defined from an upper surface of the encapsulation layer 300 to the upper surface SSUS of the support substrate SS.

According to an embodiment, the support substrate SS may include the first concave portion CCP1 overlapping the first region AR1 and the second concave portion CCP2 overlapping the second region AR2. Accordingly, the depth of the penetrating portion PNP may be defined from the upper surface of the encapsulation layer 300 to the first upper surface SSUS1 of the support substrate SS.

Compared to a case where the support substrate SS does not include the first concave portion CCP1 and the second concave portion CCP2, a height from the upper surface SSUS of the support substrate SS to the upper surface of the encapsulation layer 300 may be decreased by the depth SSdp of the first concave portion CCP1 and/or the second concave portion CCP2. Accordingly, the process difficulty level caused by the depth of the penetrating portion PNP may be reduced. Such an effect has been described based on a case where the photoresist is formed on the encapsulation layer 300, but the process difficulty level may be reduced in a similar manner when an organic layer formed on the encapsulation layer 300 is patterned.

Referring to FIG. 10E, the substrate 100 may be detached from the support substrate SS. According to an embodiment, the substrate 100 may be separated from the support substrate SS according to laser release of irradiating a laser beam onto the substrate 100. The laser beam may be irradiated in a direction from the lower surface SSLS of the support substrate SS to the upper surface SSUS of the support substrate SS. Accordingly, the laser beam may be irradiated towards the lower surface 100LS of the substrate 100 facing the upper surface SSUS of the support substrate SS. The laser beam may be, for example, an excimer laser beam having a wavelength of 308 nm or a solid ultraviolet (UV) laser beam having a wavelength of 343 nm or 355 nm.

The first interval int1 between the first side surface RS1 and the second side surface RS2 from the upper surface 100US of the substrate 100 may be less than the second interval int2 between the first side surface RS1 and the second side surface RS2 from the lower surface 100LS of the substrate 100. The first interval int1 may be an interval from the first point 100P1, where the upper surface 100US of the substrate 100 and the first side surface RS1 contact each other, to the second point 100P2, where the upper surface 100US of the substrate 100 and the second side surface RS2 contact each other. The second interval int2 may be an interval from the third point 100P3, where the lower surface 100LS of the substrate 100 and the first side surface RS1 contact each other, to the fourth point 100P4, where the lower surface 100LS of the substrate 100 and the second side surface RS2 contact each other. Also, the first side surface RS1 and the second side surface RS2 may respectively include the first inclined surface ICS1 and the second inclined surface ICS2. Accordingly, the substrate 100 may be easily detached from the support substrate SS.

Next, a cover window may be arranged on the encapsulation layer 300.

Figure 11:
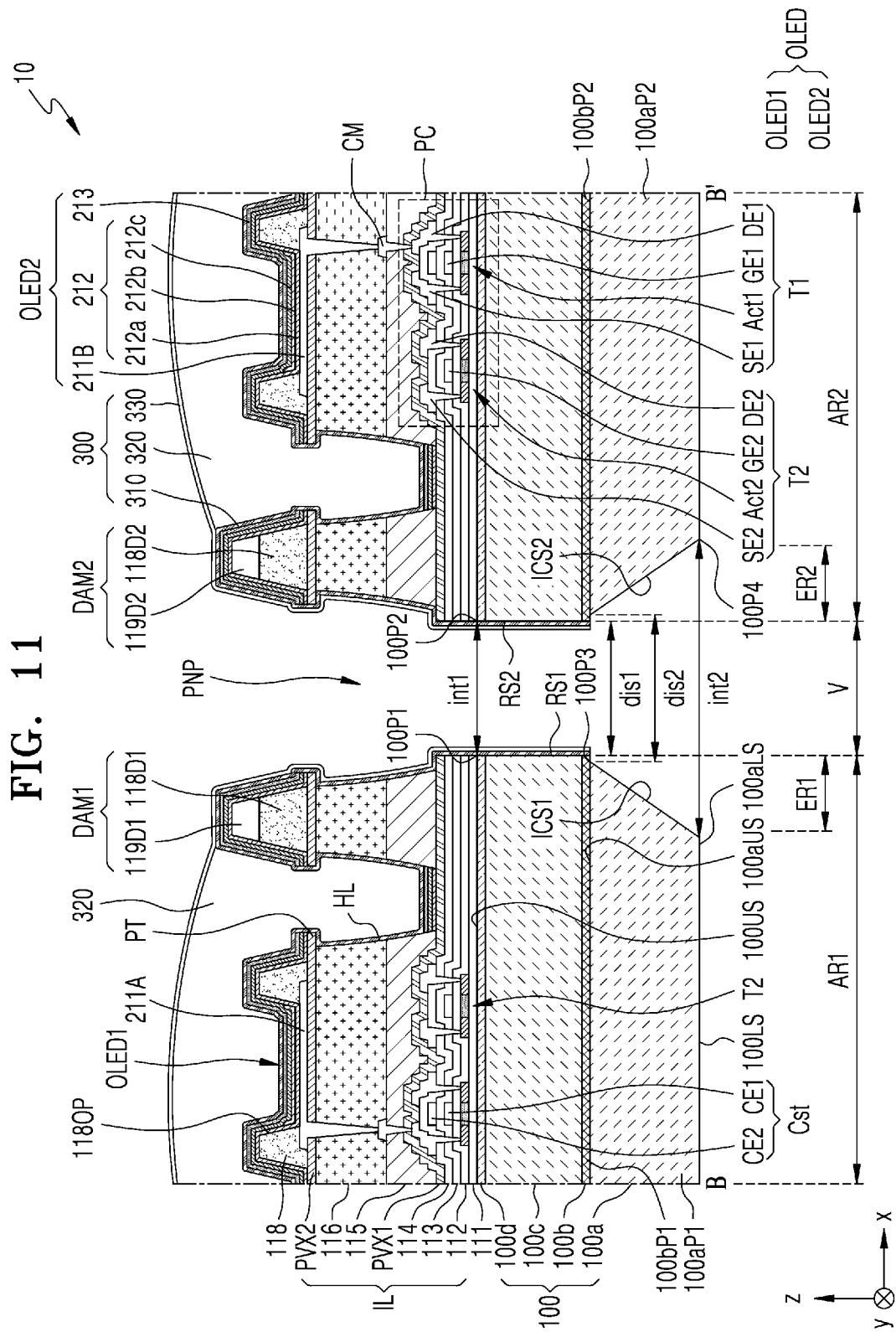
FIG. 11 is a cross-sectional view of a display panel according to another embodiment.

FIG. 11 is a cross-sectional view of the display panel 10 according to another embodiment. FIG. 11 is a cross-sectional view of the display panel 10 taken along the line B-B' of FIG. 7B. In FIG. 11, like reference numerals as FIG. 9 denote like elements, and thus, redundant descriptions thereof will be omitted for ease in explanation of that figure.

Referring to FIG. 11, the display panel 10 may include the penetrating portion PNP. The display panel 10 may include the substrate 100, the buffer layer 111, the pixel circuit PC, the insulating layer IL, the organic light-emitting diode OLED as a display element, and the encapsulation layer 300. The substrate 100 may include the first region AR1 and the second region AR2, which are spaced apart from each other with the penetrating portion PNP therebetween.

The first side surface RS1 of the substrate 100, which is an edge of the first region AR1, and the second side surface RS2 of the substrate 100, which is an edge of the second region AR2, may define at least a portion of the penetrating portion PNP.

The substrate 100 may include the upper surface 100US facing the organic light-emitting diode OLED and the lower surface 100LS opposite to the upper surface 100US. The first interval int1 between the first side surface RS1 and the second side surface RS2 from the upper surface 100US of the substrate 100 may be less than the second interval int2 between the first side surface RS1 and the second side surface RS2 from the lower surface 100LS of the substrate 100.

The substrate 100 may include a base layer and a barrier layer on the base layer. According to an embodiment, the substrate 100 may include the first base layer 100a, the first barrier layer 100b, the second base layer 100c, and the second barrier layer 100d, which are sequentially stacked on each other in the stated order. According to an embodiment, the first base layer 100a may include the first inclined surface ICS1 and the second inclined surface ICS2.

The first side surface RS1 and the second side surface RS2 may respectively include the first inclined surface ICS1 and the second inclined surface ICS2. The first inclined surface ICS1 may overlap the first external region ER1 that is an edge region of the first region AR1. The second inclined surface ICS2 may overlap the second external region ER2 that is an edge region of the second region AR2.

According to an embodiment, the first inclined surface ICS1 may be connected to the lower surface 100LS of the substrate 100 at the first region AR1. The second inclined surface ICS2 may be connected to the lower surface 100LS of the substrate 100 at the second region AR2. According to an embodiment, the distance between the first inclined surface ICS1 and the second inclined surface ICS2 may decrease in a direction from the lower surface 100LS of the substrate 100 to the upper surface 100US of the substrate 100. In other words, the substrate 100 may include an inverted tapered shape based on the penetrating portion PNP.

Hereinafter, because the second region AR2 is similar to the first region AR1, the first region AR1 will be mainly described in detail.

The first base layer 100a may include the upper surface 100aUS of the first base layer 100a, the lower surface 100aLS of the first base layer 100a, and the first inclined surface ICS1.

The upper surface 100aUS of the first base layer 100a may face the organic light-emitting diode OLED. The lower surface 100aLS of the first base layer 100a may be a surface opposite to the upper surface 100aUS of the first base layer 100a.

The first inclined surface ICS1 may contact the lower surface 100aLS of the first base layer 100a. Also, the first inclined surface ICS1 may contact the upper surface 100aUS of the first base layer 100a.

The first base layer 100a may include the first base pattern 100aP1 and the second base pattern 100aP2. The first base pattern 100aP1 may overlap the first region AR1. The second base pattern 100aP2 may overlap the second region AR2. The first base pattern 100aP1 and the second base pattern 100aP2 may be spaced apart from each other.

The first barrier layer 100b may include the first barrier pattern 100bP1 and the second barrier pattern 100bP2, which are spaced apart from each other. The first barrier pattern 100bP1 may be arranged on the first base pattern 100aP1. The second barrier pattern 100bP2 may be arranged on the second base pattern 100aP2.

According to an embodiment, the shortest distance dis1 between the first barrier pattern 100bP1 and the second barrier pattern 100bP2 may be less than the shortest distance dis2 between the first base pattern 100aP1 and the second base pattern 100aP2. Accordingly, the first barrier pattern 100bP1 and the second barrier pattern 100bP2 may prevent or reduce penetration of an external foreign material from the first base pattern 100aP1 and the second base pattern 100aP2 to the organic light-emitting diode OLED.

Figure 12:
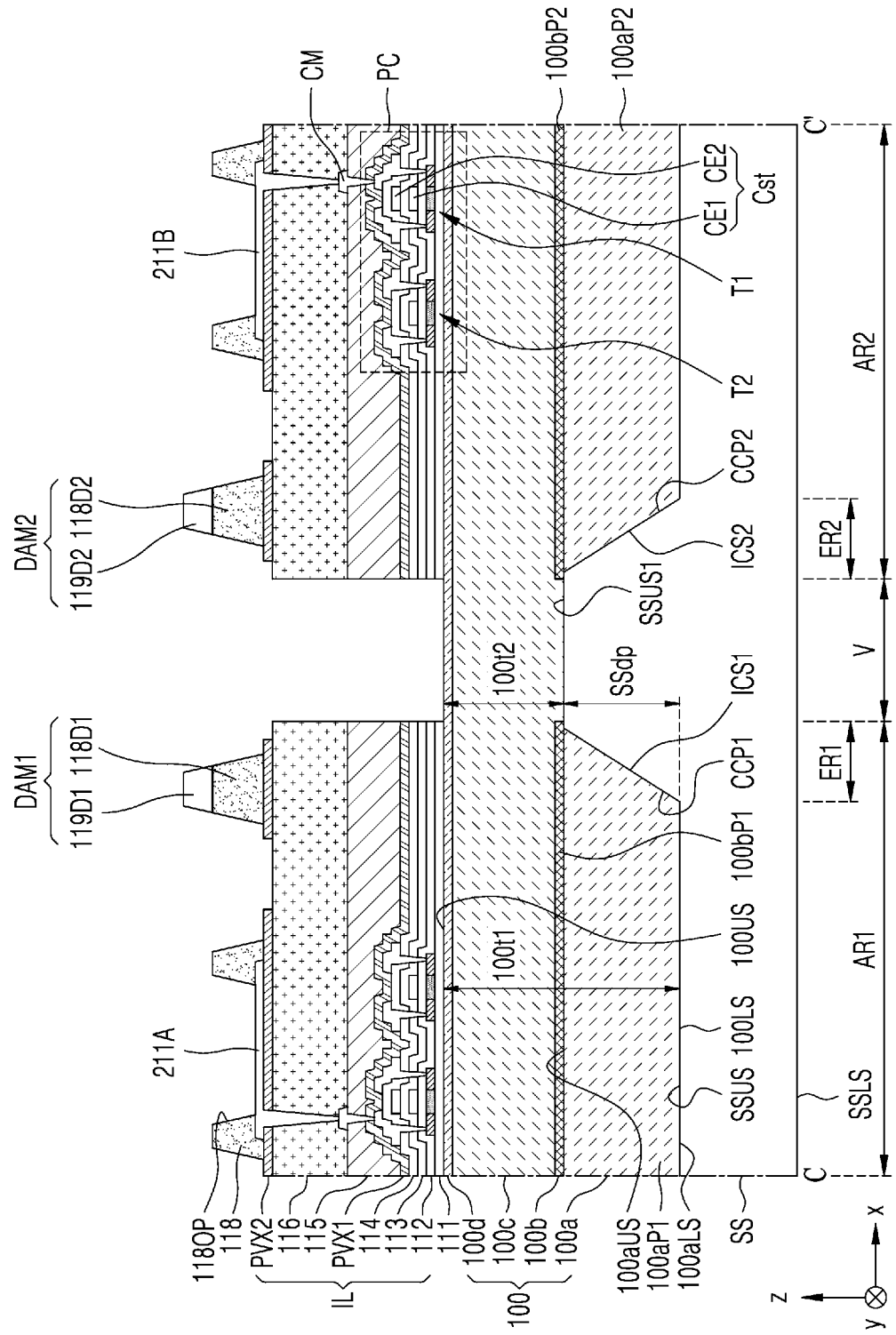
FIG. 12 is a cross-sectional view for describing a method of manufacturing a display apparatus according to another embodiment.

FIG. 12 is a cross-sectional view for describing a method of manufacturing a display apparatus, according to another embodiment. FIG. 12 is a cross-sectional view showing the support substrate SS taken along a line C-C' of FIG. 10A, and a multi-layer film formed on the support substrate SS. In FIG. 12, like reference numerals as FIG. 10B denote like elements, and thus, redundant descriptions thereof will be omitted for ease in explanation of that figure.

Referring to FIG. 12, the support substrate SS including the first concave portion CCP1 and the second concave portion CCP2 may be prepared, and the substrate 100 may be formed to overlap the first concave portion CCP1 and the second concave portion CCP2.

The substrate 100 may include the first base layer 100a, the first barrier layer 100b, the second base layer 100c, and the second barrier layer 100d, which are sequentially stacked on each other in the stated order. According to an embodiment, the substrate 100 may be the substrate 100 according to the fourth embodiment described with reference to FIGS. 3A through 3D. According to another embodiment, the substrate 100 may be the substrate 100 according to the fifth embodiment described with reference to FIG. 5. Hereinafter, a case in which the substrate 100 is the substrate 100 according to the fourth embodiment described with reference to FIGS. 3A through 3D will be mainly described.

According to an embodiment of the disclosure, the support substrate SS may include the first concave portion CCP1 and the second concave portion CCP2, and the substrate 100 may overlap the first concave portion CCP1 and the second concave portion CCP2. Accordingly, an amount of substrate 100 etched in the separated region V may be reduced. For example, an etched amount of the substrate 100 may be reduced by the depth SSdp of the first concave portion CCP1 and/or the second concave portion CCP2. In particular, when only the second base layer 100c and the second barrier layer 100d are etched in the separated region V, the first upper surface SSUS1 of the support substrate SS may be exposed. Accordingly, the processing time of the display panel 10/display apparatus may be reduced.

The method of manufacturing a display apparatus performed thereafter is similar to that described with reference to FIGS. 10B through 10E, and thus details thereof will be omitted for ease in explanation of these figures.

Figure 13:
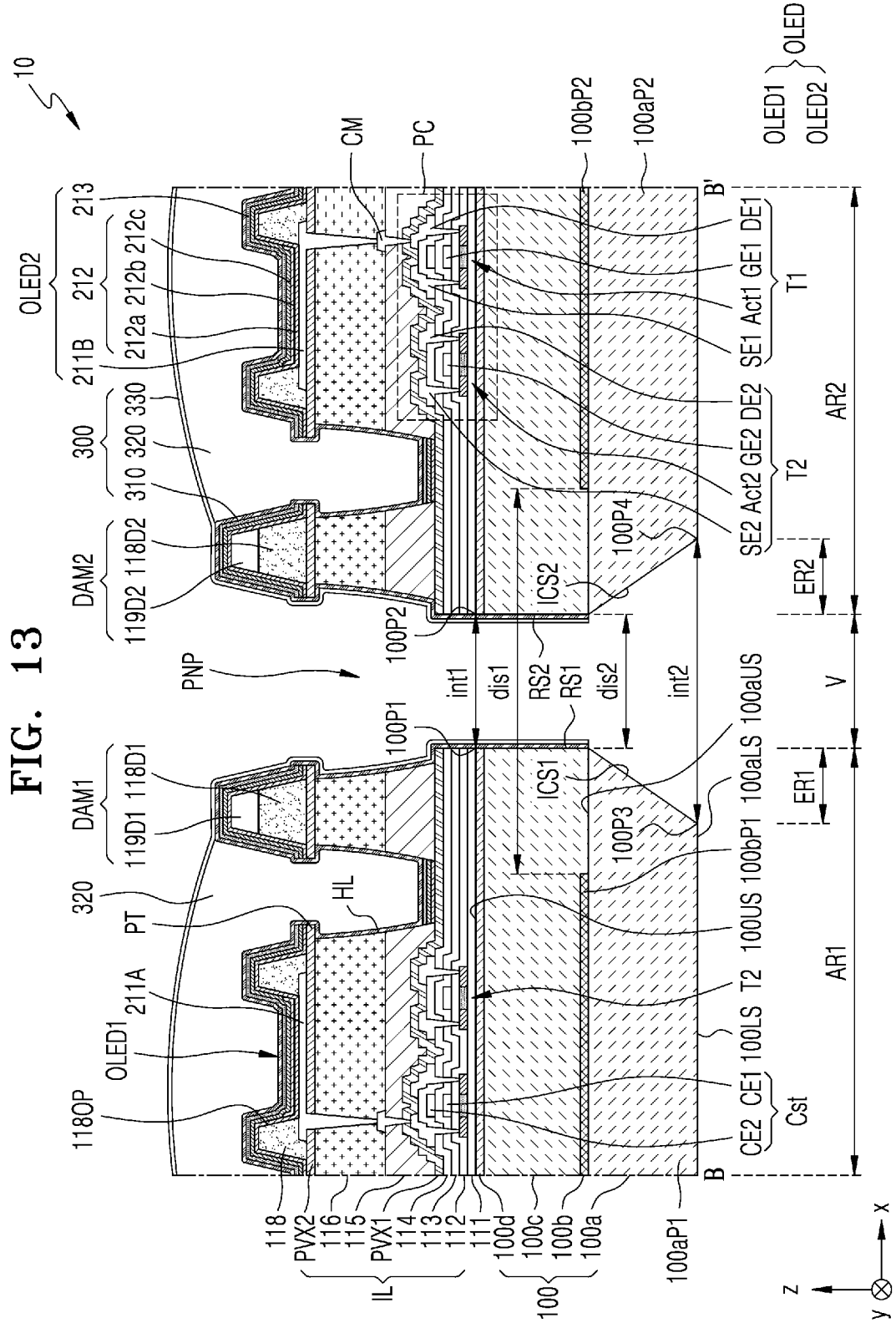
FIG. 13 is a cross-sectional view of a display panel according to another embodiment.

FIG. 13 is a cross-sectional view of the display panel 10 according to another embodiment. FIG. 13 is a cross-sectional view of the display panel 10 taken along the line B-B' of FIG. 7B. In FIG. 13, like reference numerals as FIG. 9 denote like elements, and thus, redundant descriptions thereof will be omitted for ease in explanation of that figure.

Referring to FIG. 13, the display panel 10 may include the penetrating portion PNP. The display panel 10 may include the substrate 100, the buffer layer 111, the pixel circuit PC, the insulating layer IL, the organic light-emitting diode OLED as a display element, and the encapsulation layer 300. The substrate 100 may include the first region AR1 and the second region AR2, which are spaced apart from each other with the penetrating portion PNP therebetween.

The first side surface RS1 of the substrate 100, which is an edge of the first region AR1, and the second side surface RS2 of the substrate 100, which is an edge of the second region AR2, may define at least a portion of the penetrating portion PNP.

The substrate 100 may include the upper surface 100US facing the organic light-emitting diode OLED and the lower surface 100LS opposite to the upper surface 100US. The first interval int1 between the first side surface RS1 and the second side surface RS2 from the upper surface 100US of the substrate 100 may be less than the second interval int2 between the first side surface RS1 and the second side surface RS2 from the lower surface 100LS of the substrate 100.

The substrate 100 may include a base layer and a barrier layer on the base layer. According to an embodiment, the substrate 100 may include the first base layer 100a, the first barrier layer 100b, the second base layer 100c, and the second barrier layer 100d, which are sequentially stacked on each other in the stated order. According to an embodiment, the first base layer 100a may include the first inclined surface ICS1 and the second inclined surface ICS2.

The first side surface RS1 and the second side surface RS2 may respectively include the first inclined surface ICS1 and the second inclined surface ICS2. The first inclined surface ICS1 may overlap the first external region ER1 that is an edge region of the first region AR1. The second inclined surface ICS2 may overlap the second external region ER2 that is an edge region of the second region AR2.

The substrate 100 may include the upper surface 100US facing the organic light-emitting diode OLED and the lower surface 100LS opposite to the upper surface 100US. According to an embodiment, the first inclined surface ICS1 may be connected to the lower surface 100LS of the substrate 100 at the first region AR1. The second inclined surface ICS2 may be connected to the lower surface 100LS of the substrate 100 at the second region AR2. According to an embodiment, the distance between the first inclined surface ICS1 and the second inclined surface ICS2 may decrease in a direction from the lower surface 100LS of the substrate 100 to the upper surface 100US of the substrate 100. In other words, the substrate 100 may include an inverted tapered shape based on the penetrating portion PNP. Hereinafter, because the second region AR2 is similar to the first region AR1, the first region AR1 will be mainly described in detail.

The first base layer 100a may include the upper surface 100aUS of the first base layer 100a, the lower surface 100aLS of the first base layer 100a, and the first inclined surface ICS1.

The upper surface 100aUS of the first base layer 100a may face the organic light-emitting diode OLED. The lower surface 100aLS of the first base layer 100a may be a surface opposite to the upper surface 100aUS of the first base layer 100a.

The first inclined surface ICS1 may contact the lower surface 100aLS of the first base layer 100a. Also, the first inclined surface ICS1 may contact the upper surface 100aUS of the first base layer 100a.

The first base layer 100a may include the first base pattern 100aP1 and the second base pattern 100aP2. The first base pattern 100aP1 may overlap the first region AR1. The second base pattern 100aP2 may overlap the second region AR2. The first base pattern 100aP1 and the second base pattern 100aP2 may be spaced apart from each other.

The first barrier layer 100b may include the first barrier pattern 100bP1 and the second barrier pattern 100bP2, which are spaced apart from each other. The first barrier pattern 100bP1 may be arranged on the first base pattern 100aP1. The second barrier pattern 100bP2 may be arranged on the second base pattern 100aP2.

According to an embodiment, the first barrier pattern 100bP1 may be spaced apart from the first external region ER1. According to an embodiment, the second barrier pattern 100bP2 may be spaced apart from the second external region ER2.

According to an embodiment, the shortest distance dis1 between the first barrier pattern 100bP1 and the second barrier pattern 100bP2 may be greater than the shortest distance dis2 between the first base pattern 100aP1 and the second base pattern 100aP2.

The second base layer 100c may contact at least a portion of the first base layer 100a. According to an embodiment, the second base layer 100c may contact each of the first base pattern 100aP1 and the second base pattern 100aP2. Accordingly, the substrate 100 may have an enhanced adhesive force because the first base layer 100a including an organic material and the second base layer 100c including an organic material contact each other.

Figure 14:
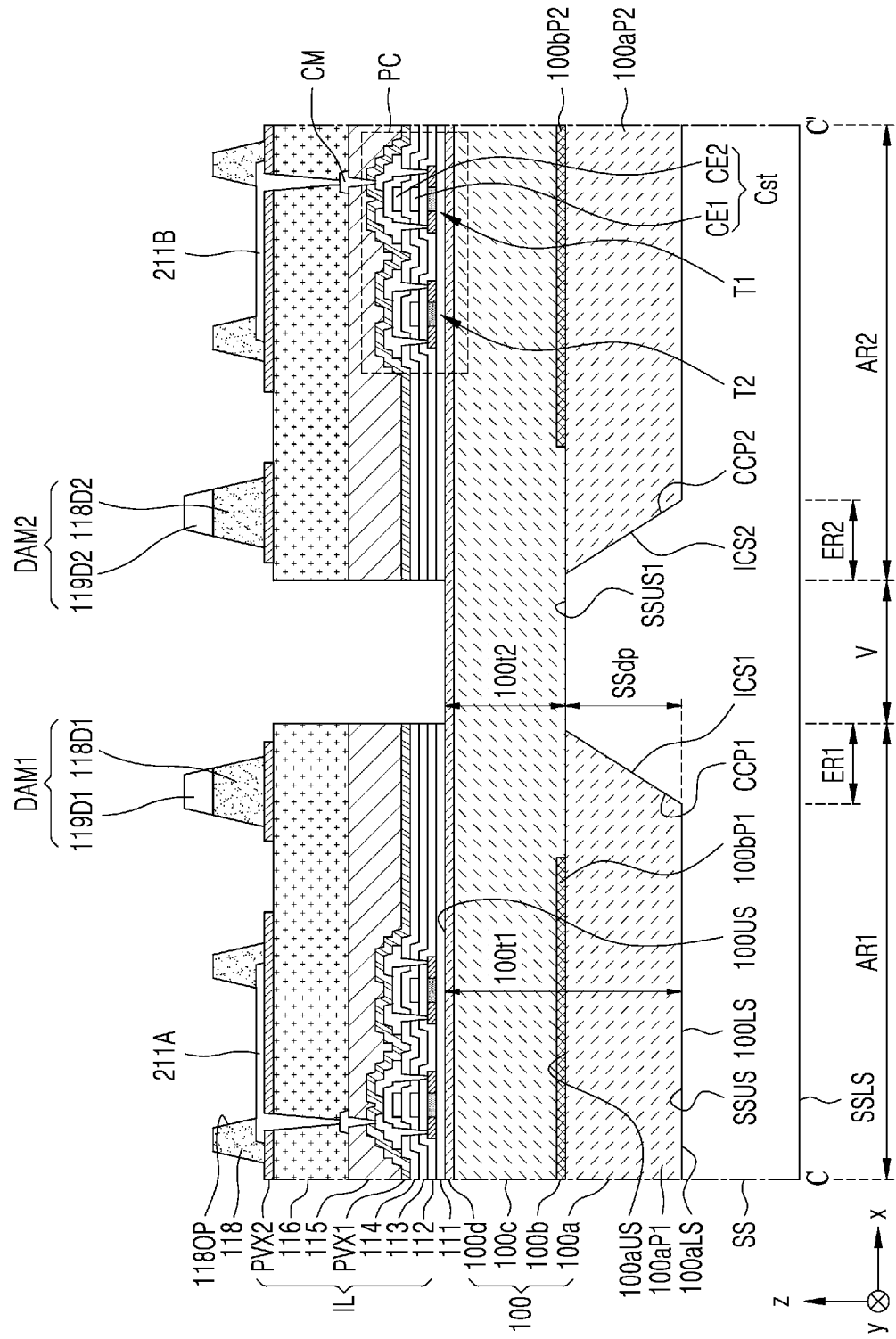
FIG. 14 is a cross-sectional view for describing a method of manufacturing a display apparatus according to another embodiment.

FIG. 14 is a cross-sectional view for describing a method of manufacturing a display apparatus, according to another embodiment. FIG. 14 is a cross-sectional view showing the support substrate SS taken along a line C-C' of FIG. 10A, and a multi-layer film formed on the support substrate SS. In FIG. 14, like reference numerals as FIG. 10B denote like elements, and thus, redundant descriptions thereof will be omitted for ease in explanation of that figure.

Referring to FIG. 14, the support substrate SS including the first concave portion CCP1 and the second concave portion CCP2 may be prepared, and the substrate 100 may be formed to overlap the first concave portion CCP1 and the second concave portion CCP2.

The substrate 100 may include the first base layer 100a, the first barrier layer 100b, the second base layer 100c, and the second barrier layer 100d, which are sequentially stacked on each other in the stated order. According to an embodiment, the substrate 100 may be the substrate 100 according to the sixth embodiment described with reference to FIGS. 5A through 5C.

The second base layer 100c may contact at least a portion of the first base layer 100a. According to an embodiment, the second base layer 100c may contact each of the first base pattern 100aP1 and the second base pattern 100aP2. Accordingly, the substrate 100 may have an enhanced adhesive force because the first base layer 100a including an organic material and the second base layer 100c including an organic material contact each other.

According to an embodiment, the support substrate SS may include the first concave portion CCP1 and the second concave portion CCP2, and the substrate 100 may overlap the first concave portion CCP1 and the second concave portion CCP2. Accordingly, an amount of substrate 100 etched in the separated region V may be reduced. For example, an etched amount of the substrate 100 may be reduced by the depth SSdp of the first concave portion CCP1 and/or the second concave portion CCP2. In particular, when only the second base layer 100c and the second barrier layer 100d are etched in the separated region V, the first upper surface SSUS1 of the support substrate SS may be exposed. Accordingly, the processing time of the display panel 10/display apparatus may be reduced.

The method of manufacturing a display apparatus performed thereafter is similar to that described with reference to FIGS. 10B through 10E, and thus details thereof will be omitted for ease in explanation of these figures.

Figure 15:
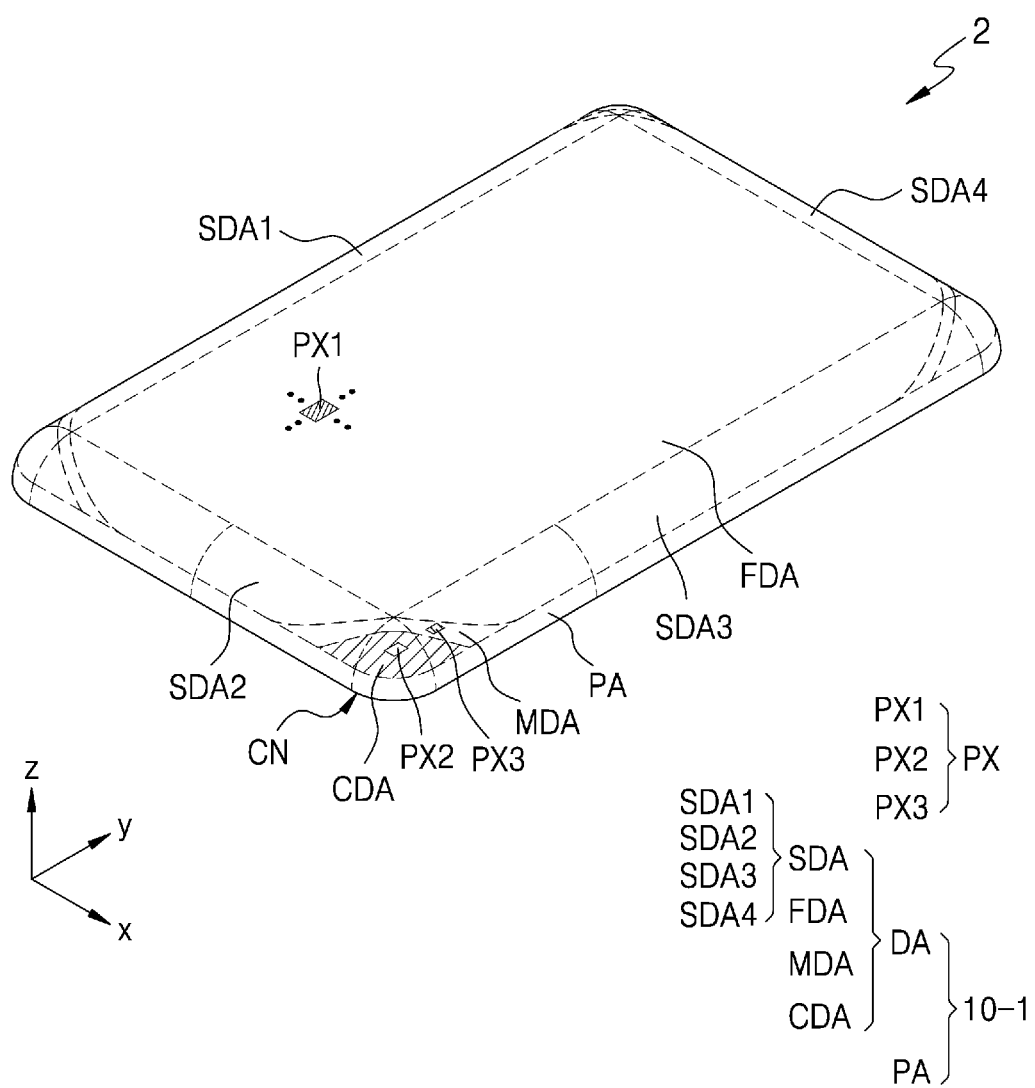
FIG. 15 is a perspective view of a display apparatus according to an embodiment.
Figure 16A:
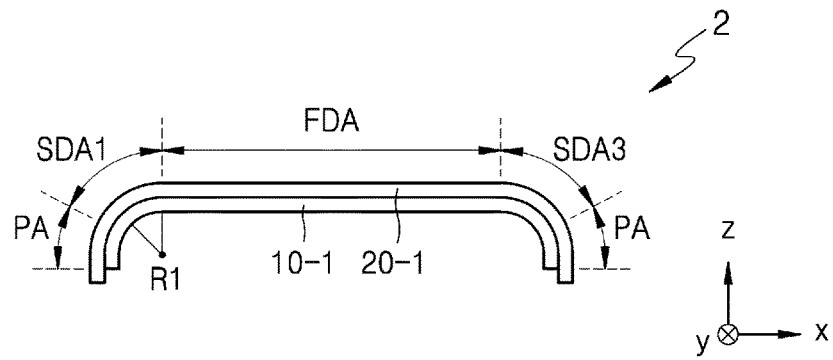
FIGS. 16A, 16B, and 16C are cross-sectional views of a display apparatus, according to embodiments.
Figure 16B:
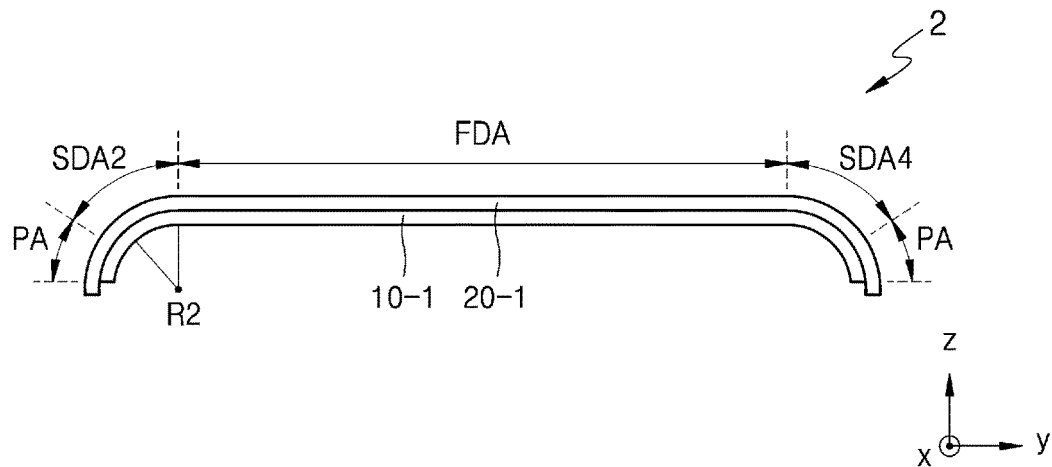
Figure 16C:
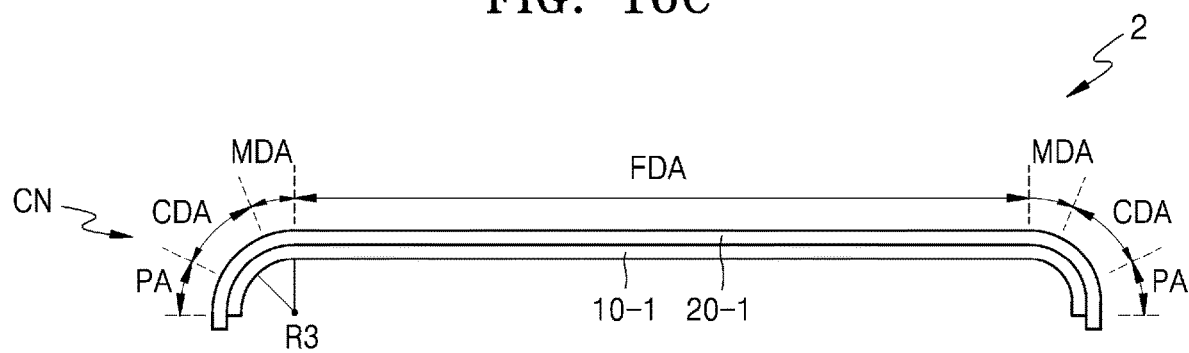

FIG. 15 is a perspective view of a display apparatus 2 according to an embodiment. FIGS. 16A through 16C are cross-sectional views of the display apparatus 2, according to embodiments. FIG. 16A illustrates a cross sectional of the display apparatus 2 in an x-axis direction of FIG. 15. FIG. 16B illustrates a cross sectional of the display apparatus 2 in a y-axis direction of FIG. 15. FIG. 16C illustrates a cross section of the display apparatus 2 where a corner display area CDA is arranged on both sides of a front display area FDA.

Referring to FIGS. 15 and 16A through 16C, the display apparatus 2 may have short sides in a first direction (for example, the x-axis or −x-axis direction) and long sides in a second direction (for example, the y-axis or −y-axis direction). According to another embodiment, lengths of sides of the display apparatus 2 in the first direction (for example, the x-axis or −x-axis direction) and lengths of sides of the display apparatus 2 in the second direction (for example, the y-axis or −y-axis direction) may be the same. According to another embodiment, the display apparatus 2 may have long sides in the first direction (for example, the x-axis or −x-axis direction) and short sides in the second direction (for example, the y-axis or −y-axis direction).

Corners where the short sides in the first direction (for example, the x-axis or −x-axis direction) and the long sides in the second direction (for example, the y-axis or −y-axis direction) meet may be curved in a certain curvature.

The display apparatus 2 may include a display panel 10-1 and a cover window 20-1. The cover window 20-1 may be arranged on the display panel 10-1. The cover window 20-1 of FIG. 15 is similar to the cover window 20 of FIG. 6, and thus details thereof will be omitted for ease in explanation of that figure.

The display panel 10-1 may include a display area DA displaying an image and a peripheral area PA surrounding the display area DA. The plurality of pixels PX may be arranged in the display area DA and the image may be displayed through the plurality of pixels PX.

The display area DA may include the front display area FDA, a side display area SDA, the corner display area CDA, and a middle display area MDA. The plurality of pixels PX arranged in each display area DA may display the image.

The front display area FDA is a flat display area and a first pixel PX1 including a display element may be arranged therein. According to an embodiment, the front display area FDA may provide most images.

The pixel PX including a display element may be arranged in the side display area SDA. Accordingly, the side display area SDA may display the image. According to an embodiment, the side display area SDA may include a first side display area SDA1, a second side display area SDA2, a third side display area SDA3, and a fourth side display area SDA4. According to some embodiments, at least one of the first side display area SDA1, the second side display area SDA2, the third side display area SDA3, and the fourth side display area SDA4 may be omitted.

The first side display area SDA1 and the third side display area SDA3 may be connected to the front display area FDA in the first direction (for example, the x-axis or −x-axis direction). For example, the first side display area SDA1 may be connected in the −x-axis direction from the front display area FDA and the third side display area SDA3 may be connected in the x-axis direction from the front display area FDA.

The first side display area SDA1 and the third side display area SDA3 may be bent with a radius of curvature. According to an embodiment, the first side display area SDA1 and the third side display area SDA3 may have different radii of curvature. According to another embodiment, the first side display area SDA1 and the third side display area SDA3 may have a same radius of curvature. Hereinafter, a case where the radii of curvature of the first side display area SDA1 and third side display area SDA3 are the same, i.e., a first radius of curvature R1, will be mainly described in detail. Also, because the first side display area SDA1 and the third side display area SDA3 are the same or similar, the first side display area SDA1 will be mainly described in detail.

The second side display area SDA2 and the fourth side display area SDA4 may be connected to the front display area FDA in the second direction (for example, y-axis or −y-axis direction). For example, the second side display area SDA2 may be connected in the −y-axis direction from the front display area FDA and the front display area FDA may be connected in the y-axis direction from the front display area FDA.

The second side display area SDA2 and the fourth side display area SDA4 may be bent with a radius of curvature. According to an embodiment, the second side display area SDA2 and the fourth side display area SDA4 may have different radii of curvature. According to another embodiment, the second side display area SDA2 and the fourth side display area SDA4 may have a same radius of curvature. Hereinafter, a case where the radii of curvature of the second side display area SDA2 and the fourth side display area SDA4 are the same, i.e., a second radius of curvature R2, will be mainly described in detail. Also, because the second side display area SDA2 and the fourth side display area SDA4 are the same or similar, the second side display area SDA2 will be mainly described in detail.

According to an embodiment, the first radius of curvature R1 of the first side display area SDA1 may be different from the second radius of curvature R2 of the second side display area SDA2. According to another embodiment, the first radius of curvature R1 of the first first side display area SDA1 may be the same as the second radius of curvature R2 of the second side display area SDA2. Hereinafter, a case where the first radius of curvature R1 is less than the second radius of curvature R2 will be mainly described.

The corner display area CDA may be arranged at a corner CN of the display panel 10-1 and/or the display apparatus 2 and bent. In other words, the corner display area CDA may be arranged to correspond to the corner CN. Here, the corner CN may be a portion where the short side of the display apparatus 2 and/or display panel 10-1 in the first direction (for example, the x-axis or −x-axis direction) and the long side of the display apparatus 2 and/or display panel 10-1 in the second direction (for example, the y-axis or −y-axis direction) meet. The corner display area CDA may be arranged between the neighboring side display areas SDA. For example, the corner display area CDA may be arranged between the first side display area SDA1 and the second side display area SDA2. Alternatively, the corner display area CDA may be arranged between the second side display area SDA2 and the third side display area SDA3, between the third side display area SDA3 and the fourth side display area SDA4, or between the fourth side display area SDA4 and the first side display area SDA1. Accordingly, the side display area SDA and the corner display area CDA may be bent while surrounding at least a portion of the front display area FDA.

A second pixel PX2 including a display element may be arranged in the corner display area CDA. Accordingly, the corner display area CDA may display the image.

When the first radius of curvature R1 of the first side display area SDA1 and the second radius of curvature R2 of the second side display area SDA2 are different from each other, a radius of curvature at the corner display area CDA may gradually change. According to an embodiment, when the first radius of curvature R1 of the first side display area SDA1 is less than the second radius of curvature R2 of the second side display area SDA2, the radius of curvature of the corner display area CDA may gradually increase in a direction from the first side display area SDA1 to the second side display area SDA2. For example, a third radius of curvature R3 of the corner display area CDA may be greater than the first radius of curvature R1 and less than the second radius of curvature R2.

The middle display area MDA may be arranged between the corner display area CDA and the front display area FDA. According to an embodiment, the middle display area MDA may extend between the side display area SDA and the corner display area CDA. For example, the middle display area MDA may extend between the first side display area SDA1 and the corner display area CDA. Also, the middle display area MDA may extend between the second side display area SDA2 and the corner display area CDA.

The middle display area MDA may include a third pixel PX3. According to an embodiment, a driving circuit for providing an electric signal and/or a power supply wire for providing a voltage may be provided in the middle display area MDA, and the third pixel PX3 may overlap the driving circuit and the power supply wire. In this case, a display element of the third pixel PX3 may be arranged in an upper portion of the driving circuit and/or the power supply wire. According to some embodiments, the driving circuit and/or the power supply wire may be arranged in the peripheral area PA and the third pixel PX3 may not overlap the driving circuit or the power supply wire.

The display apparatus 2 may display the image not only in the front display area FDA, but also in the side display area SDA, the corner display area CDA, and the middle display area MDA. Accordingly, a proportion occupied by the display area DA among the display apparatus 2 may increase. Also, the display apparatus 2 includes the corner display area CDA that is bent at a corner and displays the image, and thus may have enhanced esthetics.

Figure 17:
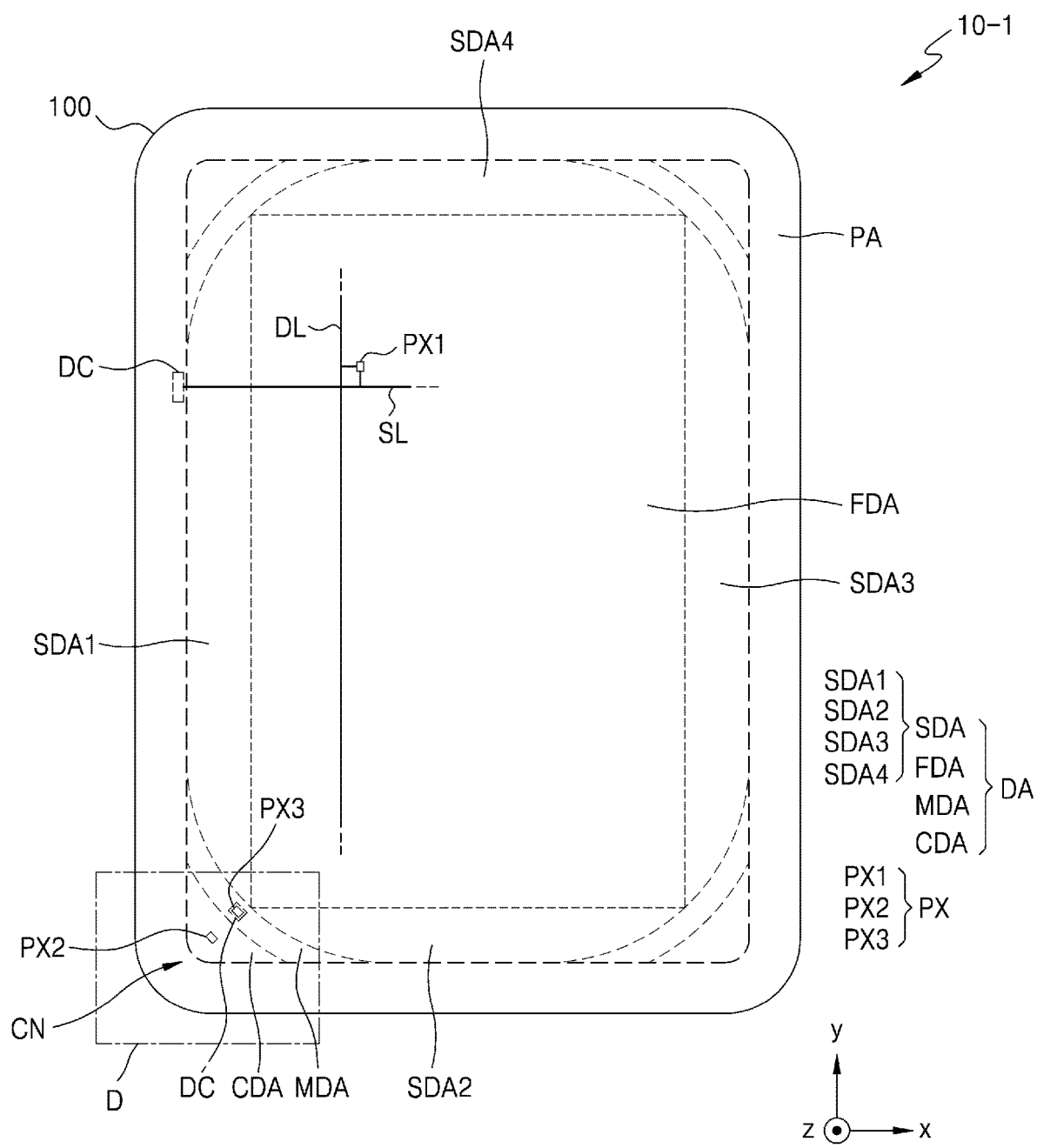
FIG. 17 is a plan view of a display panel according to an embodiment.

FIG. 17 is a plan view of the display panel 10-1 according to an embodiment. FIG. 17 is a plan view of a shape of the display panel 10-1 before the corner display area CDA is bent, i.e., an unbent shape of the display panel 10-1.

Referring to FIG. 17, the display panel 10-1 may include the display area DA and the peripheral area PA. The display area DA is an area where the plurality of pixels PX display an image, and the peripheral area PA is an area surrounding at least a portion of the display area DA. According to an embodiment, the peripheral area PA may entirely surround the display area DA. The display area DA may include the front display area FDA, the side display area SDA, the corner display area CDA, and the middle display area MDA.

The display panel 10-1 may include the substrate 100 and a multi-layer film arranged on the substrate 100. Here, the display area DA and the peripheral area PA may be defined in the substrate 100 and/or the multi-layer film. In other words, the substrate 100 and/or the multi-layer film may include the front display area FDA, the side display area SDA, the corner display area CDA, the middle display area MDA, and the peripheral area PA. Hereinafter, a case where the front display area FDA, the side display area SDA, the corner display area CDA, the middle display area MDA, and the peripheral area PA are defined in the substrate 100 will be mainly described in detail.

The peripheral area PA may an area that does not provide an image and may be a non-display area. A driving circuit DC for providing an electric signal to the pixels PX, a power supply wire for providing power, or the like may be arranged in the peripheral area PA. For example, the driving circuit DC may be a scan driving circuit providing a scan signal to each pixel PX via the scan line SL. Alternatively, the driving circuit DC may be a data driving circuit providing a data signal to each pixel PX via the data line DL. According to an embodiment, the data driving circuit may be arranged adjacent to one side surface of the display panel 10-1. For example, the data driving circuit in the peripheral area PA may be arranged to correspond to the first side display area SDA1.

The peripheral area PA may include a pad portion that is a region where an electronic device, a printed circuit board, or the like may be electrically connected. The pad portion may be exposed without being covered by an insulating layer to be electrically connected to a flexible printed circuit board (FPCB). The FPCB may electrically connect a controller and the pad portion, and supply as signal or power received from the controller. According to some embodiments, the data driving circuit may be arranged on the FPCB.

The first pixel PX1 including a display element may be arranged in the front display area FDA. The front display area FDA may be a flat portion. According to an embodiment, the front display area FDA may provide most images.

The pixel PX including a display element may be arranged in the side display area SDA, and the side display area SDA may be bent. In other words, as described above with reference to FIG. 15, the side display area SDA may be a region bent from the front display area FDA. The side display area SDA may include the first side display area SDA1, the second side display area SDA2, the third side display area SDA3, and the fourth side display area SDA4.

The first side display area SDA1 and the third side display area SDA3 may extend from the front display area FDA in the first direction (for example, the x-axis or −x-axis direction). Also, the second side display area SDA2 and the fourth side display area SDA4 may extend from the front display area FDA in the second direction (for example, y-axis or −y-axis direction).

The corner display area CDA may be arranged at the corner CN of the display panel 10-1. Here, the corner CN of the display panel 10-1 may be a portion where a short side in the first direction (for example, the x-axis or −x-axis direction) among an edge of the display panel 10-1 and a long side in the second direction (for example, the y-axis or −y-axis direction) among the edge of the display panel 10-1 meet.

The corner display area CDA may be arranged between the neighboring side display areas SDA. For example, the corner display area CDA may be arranged between the first side display area SDA1 and the second side display area SDA2. Alternatively, the corner display area CDA may be arranged between the second side display area SDA2 and the third side display area SDA3, between the third side display area SDA3 and the fourth side display area SDA4, or between the fourth side display area SDA4 and the first side display area SDA1.

The corner display area CDA may surround at least a portion of the front display area FDA. For example, the corner display area CDA may be arranged between the first side display area SDA1 and the second side display area SDA2 to surround at least a portion of the front display area FDA.

The second pixel PX2 including a display element may be arranged in the corner display area CDA and the corner display area CDA may be bent. In other words, as described above with reference to FIG. 15, the corner display area CDA may be arranged to correspond to the corner display area CDA and may be a region bent from the front display area FDA.

The middle display area MDA may be arranged between the front display area FDA and the corner display area CDA. According to an embodiment, the middle display area MDA may extend between the side display area SDA and the corner display area CDA. For example, the middle display area MDA may extend between the first side display area SDA1 and the corner display area CDA and/or between the second side display area SDA2 and the corner display area CDA. According to an embodiment the middle display area MDA may be bent.

The third pixel PX3 including a display element may be arranged in the middle display area MDA. Also, according to an embodiment, the driving circuit DC providing an electric signal or a power supply wire providing a voltage may also be arranged in the middle display area MDA. According to an embodiment, the driving circuit DC may be arranged along the middle display area MDA and/or the peripheral area PA. In this case, the third pixel PX3 arranged in the middle display area MDA may overlap the driving circuit DC or the power supply wire. According to another embodiment, the third pixel PX3 may not overlap the driving circuit DC or the power supply wire. In this case, the driving circuit DC may be arranged along the peripheral area PA.

At least one of the side display area SDA, the corner display area CDA, and the middle display area MDA may be bent. In this case, the first side display area SDA1 among the side display area SDA may be bent with a first radius of curvature, and the second side display area SDA2 among the side display area SDA may be bent with a second radius of curvature. When the first radius of curvature is less than the second radius of curvature, a radius of curvature for bending the corner display area CDA may gradually increase in a direction from the first side display area SDA1 to the second side display area SDA2.

When the corner display area CDA is bent, compressive strain may be greater than tensile strain in the corner display area CDA. In this case, a contractible substrate and a multi-layer film structure may need to be applied to the corner display area CDA. Accordingly, a stack structure of a multi-layer film or the shape of the substrate 100 arranged in the corner display area CDA may be different from a stack structure of a multi-layer film or the shape of the substrate 100 arranged in the front display area FDA.

Figure 18:
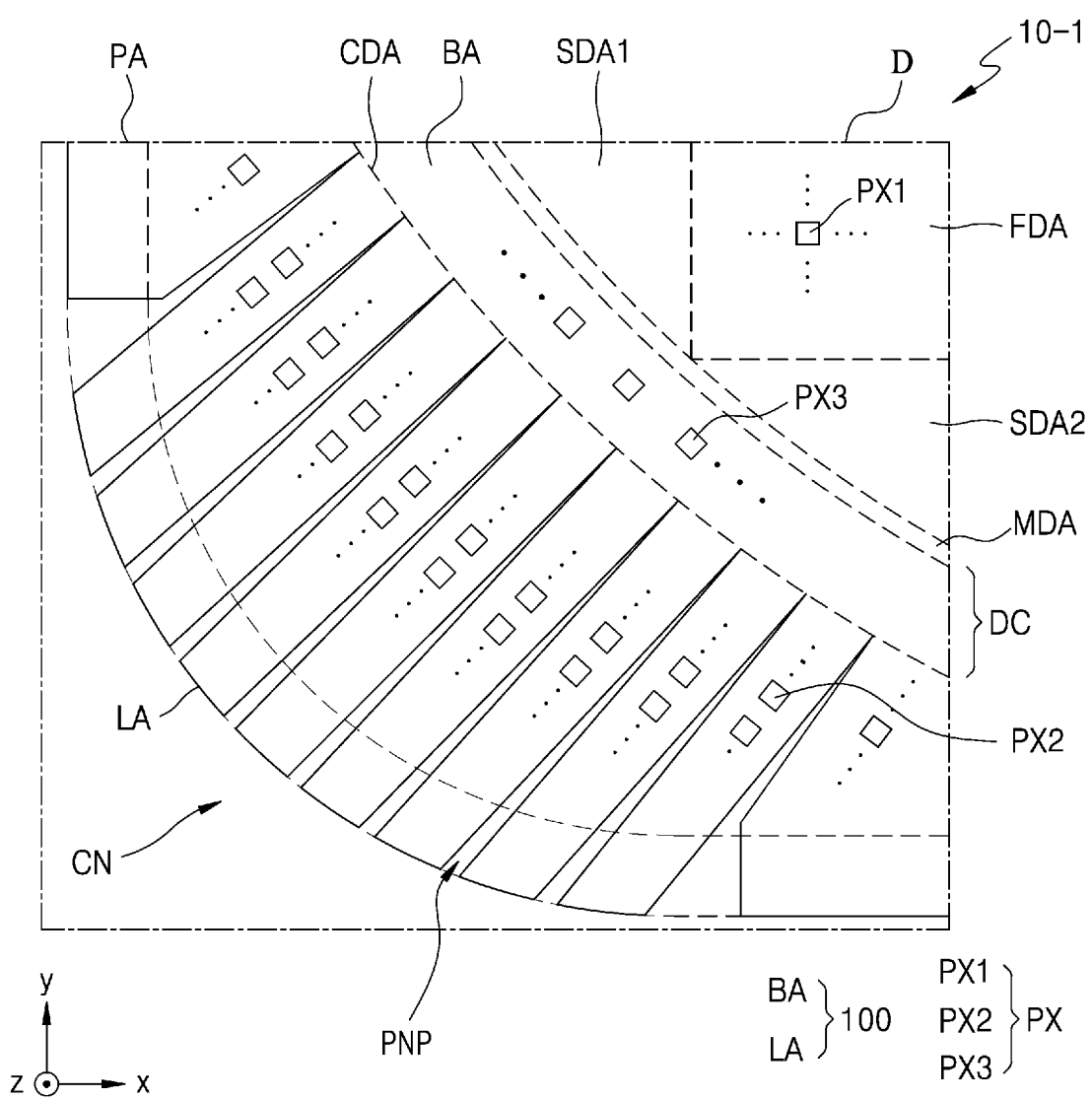
FIG. 18 is an enlarged view of a corner of a display panel according to an embodiment.

FIG. 18 is an enlarged view of the corner CN of the display panel 10-1, according to an embodiment. FIG. 18 is an enlarged view of a region D of FIG. 17. In FIG. 18, like reference numerals as FIG. 17 denote like elements, and thus, redundant descriptions thereof will be omitted for ease in explanation of that figure.

Referring to FIG. 18, the display panel 10-1 may include the corner CN. Here, the substrate 100 may include the front display area FDA, the first side display area SDA1, the second side display area SDA2, the corner display area CDA, the middle display area MDA, and the peripheral area PA. The corner display area CDA may be arranged at the corner CN of the display panel 10-1. Also, the corner display area CDA may be arranged between the front display area FDA and the peripheral area PA. The middle display area MDA may be arranged between the corner display area CDA and the front display area FDA.

The first pixel PX1 may be arranged in the front display area FDA. The second pixel PX2 may be arranged in the corner display area CDA. The driving circuit DC and the third pixel PX3 overlapping the driving circuit DC may be arranged on the middle display area MDA. According to some embodiments, the driving circuit DC may be omitted.

The substrate 100 may include a plurality of extending areas LA at least partially overlapping the corner display area CDA. The plurality of extending areas LA may each extend in a direction away from the front display area FDA. In other words, the substrate 100 may include a body area BA and the extending area LA. The body area BA may overlap the front display area FDA, the first side display area SDA1, the second side display area SDA2, and the middle display area MDA.

The plurality of extending areas LA may each extend in a direction away from the body area BA. According to an embodiment, the plurality of extending areas LA may overlap the corner display area CDA and the peripheral area PA. In this case, the second pixel PX2 may be arranged on the extending area LA. The plurality of second pixels PX2 may be arranged in parallel along an extending direction of the extending area LA.

The penetrating portion PNP may be defined between the adjacent extending areas LA. The penetrating portion PNP may penetrate the display panel 10-1. When the corner display area CDA is bent at the corner display area CDA, compressive strain may be greater than tensile strain in the corner display area CDA. Because the penetrating portion PNP is defined between the adjacent extending areas LA, the plurality of extending areas LA may contract. Accordingly, when the corner display area CDA is bent, the display panel 10-1 may be bent without damage.

Figure 19:
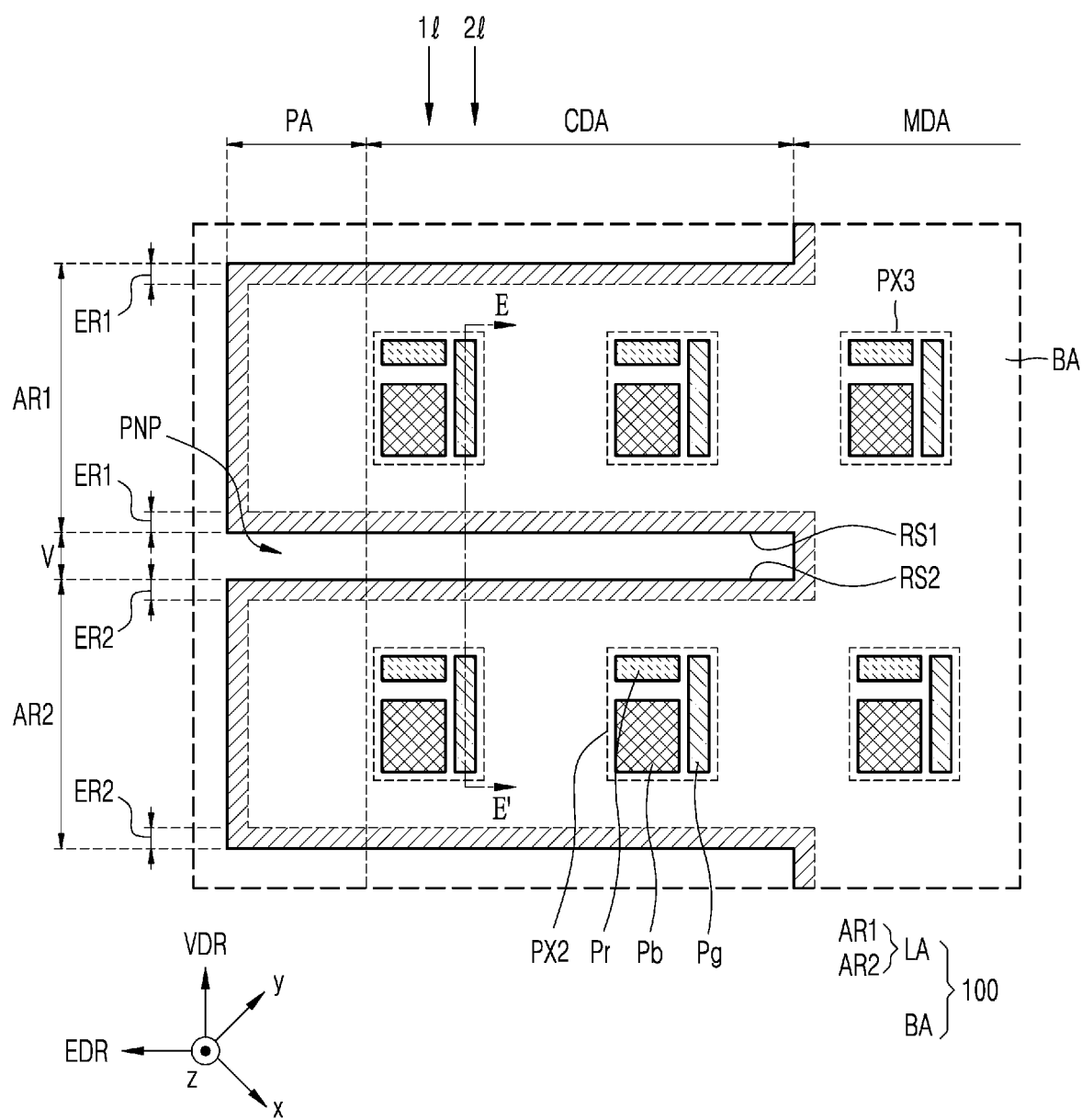
FIG. 19 is a plan view of a body area and an extending area according to an embodiment.

FIG. 19 is a plan view of the body area BA and the extending area LA according to an embodiment.

Referring to FIG. 19, the display panel 10-1 may include the substrate 100 and the pixel PX arranged on the substrate 100. The substrate 100 may include the plurality of extending areas LA extending in a direction away from the front display area FDA. In other words, the substrate 100 may include the body area BA and the extending area LA. The body area BA may overlap the middle display area MDA.

The plurality of extending areas LA may each extend in a direction away from the body area BA. The extending area LA may extend in the direction away from the front display area FDA. The extending area LA may at least partially overlap the corner display area CDA.

The extending area LA may extend along an extending direction EDR. According to an embodiment, the extending direction EDR may be a direction where the first direction (for example, the x-axis or −x-axis direction) and the second direction (for example, the y-axis or −y-axis direction) cross each other.

The extending area LA may include the first region AR1 and the second region AR2. According to an embodiment, the first region AR1 and the second region AR2 may at least partially overlap the corner display area CDA.

According to an embodiment, the first region AR1 and the second region AR2 may extend in a direction away from the front display area FDA. According to an embodiment, the first region AR1 and the second region AR2 may extend in a direction away from the middle display area MDA and/or the body area BA.

According to an embodiment, the first region AR1 and the second region AR2 may extend in different directions. According to another embodiment, the first region AR1 and the second region AR2 may extend in a same direction. Hereinafter, a case where the first region AR1 and the second region AR2 extend in the same extending direction EDR will be mainly described in detail.

The first region AR1 and the second region AR2 may be spaced apart from each other in a vertical direction VDR. According to an embodiment, the vertical direction VDR may be a direction perpendicular to the extending direction EDR.

The first region AR1 may include the first external region ER1 as an edge region. The first external region ER1 may extend along an edge of the first region AR1. The first external region ER1 may include the first side surface RS1 that is an edge of the first region AR1.

The second region AR2 may include the second external region ER2 as an edge region. The second external region ER2 may extend along an edge of the second region AR2. The second external region ER2 may include the second side surface RS2 that is an edge of the second region AR2. According to an embodiment, the first side surface RS1 and the second side surface RS2 may face each other.

According to an embodiment, the first side surface RS1 and the second side surface RS2 may respectively include the first inclined surface and the second inclined surface. This will be described later.

The first region AR1 and the second region AR2 may be spaced apart from each other with the penetrating portion PNP therebetween. According to an embodiment, a component of the display panel 10-1 may not be arranged between the first region AR1 and the second region AR2. In other words, the separated region V of the substrate 100 may be defined between the first region AR1 and the second region AR2. The separated region V may overlap the penetrating portion PNP.

The first side surface RS1 of the substrate 100, which is an edge of the first region AR1, and the second side surface RS2 of the substrate 100, which is an edge of the second region AR2, may define at least a portion of the penetrating portion PNP. Also, the first side surface RS1 of the substrate 100, which is an edge of the first region AR1, and the second side surface RS2 of the substrate 100, which is an edge of the second region AR2, may define the separated region V.

The second pixel PX2 may be arranged in the corner display area CDA. According to an embodiment, the second pixel PX2 may be arranged in parallel along the extending direction EDR of the extending area LA.

The plurality of third pixels PX3 may be arranged in the middle display area MDA. According to an embodiment, the plurality of third pixels PX3 may be arranged in parallel along the extending direction EDR of the extending area LA. In this case, the plurality of third pixels PX3 may be arranged in parallel to the plurality of second pixels PX2.

The second pixel PX2 and the third pixel PX3 may each include the red sub-pixel Pr, the green sub-pixel Pg, and the blue sub-pixel Pb. The red sub-pixel Pr, the green sub-pixel Pg, and the blue sub-pixel Pb may emit red light, green light, and blue light, respectively.

A sub-pixel arrangement structure of the second pixel PX2 and a sub-pixel arrangement structure of the third pixel PX3 may include an S-stripe structure. The second pixel PX2 and the third pixel PX3 may each include the red sub-pixel Pr, the green sub-pixel Pg, and the blue sub-pixel Pb.

The red sub-pixel Pr and the blue sub-pixel Pb may be arranged in a first column 1*l*, and the green sub-pixel Pg may be arranged in an adjacent second column 2*l*. Here, the red sub-pixel Pr and the blue sub-pixel Pb may be arranged in a rectangular shape, and the green sub-pixel Pg may be arranged in a rectangular shape having long sides in the vertical direction VDR. In other words, sides of the red sub-pixel Pr and blue sub-pixel Pb may be arranged to face long sides of the green sub-pixel Pg. According to an embodiment, a length of a side of the red sub-pixel Pr in the vertical direction VDR perpendicular to the extending direction EDR may be less than a length of a side of the blue sub-pixel Pb in the vertical direction VDR.

According to another embodiment, the sub-pixel arrangement structure of the second pixel PX2 and the sub-pixel arrangement structure of the third pixel PX3 may be a pentile type. According to another embodiment, the sub-pixel arrangement structure of the second pixel PX2 and the sub-pixel arrangement structure of the third pixel PX3 may be a stripe type.

Figure 20:
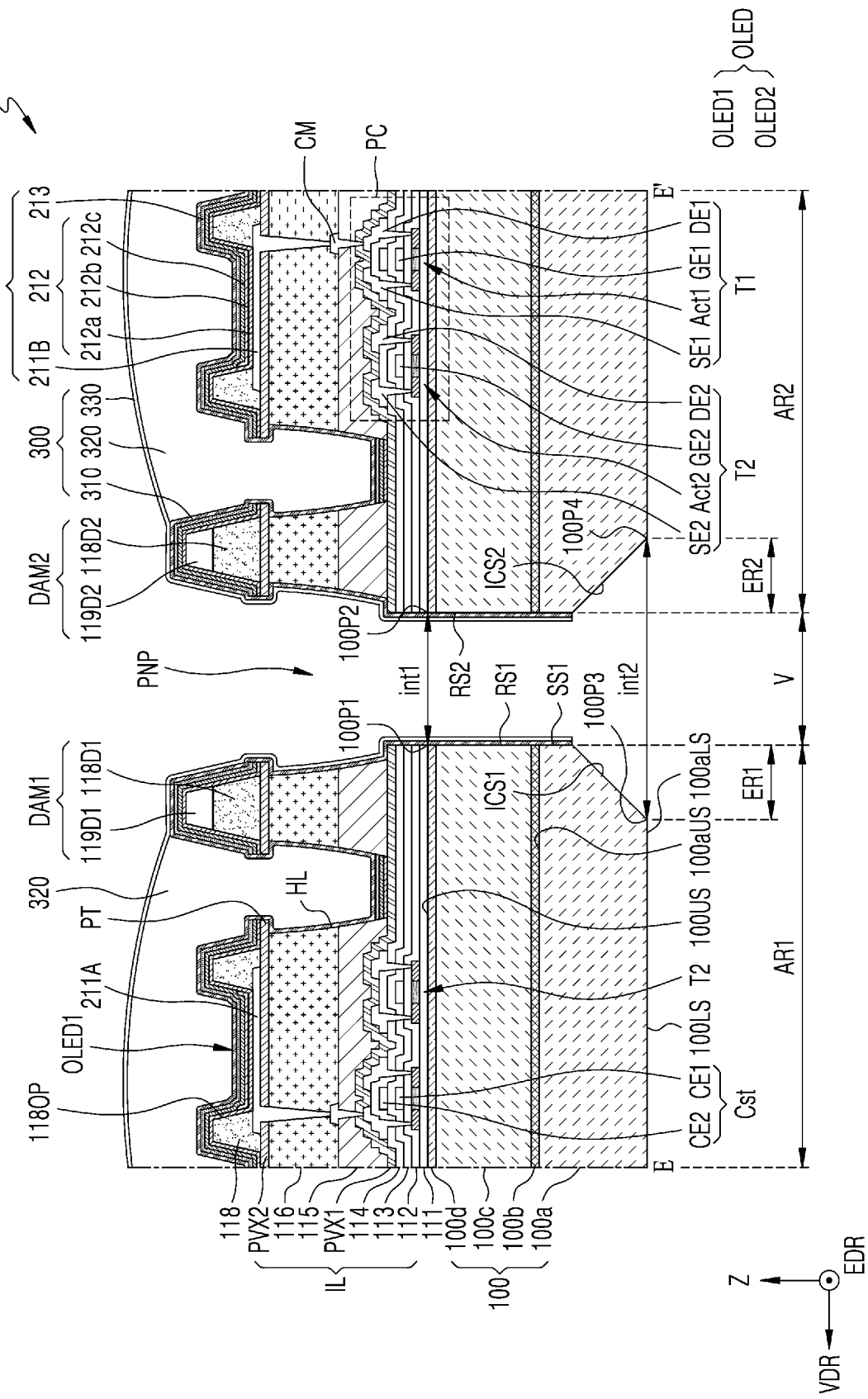
FIG. 20 is a cross-sectional view of a display panel according to an embodiment.

FIG. 20 is a cross-sectional view of the display panel 10-1 according to an embodiment. FIG. 20 is a cross-sectional view of the display panel 10-1 taken along a line E-E' of FIG. 19. In FIG. 20, like reference numerals as FIG. 9 denote like elements, and thus, redundant descriptions thereof will be omitted for ease in explanation of that figure.

Referring to FIG. 20, the display panel 10-1 may include the penetrating portion PNP. Components of the display panel 10-1 may not be arranged in the penetrating portion PNP. The penetrating portion PNP may be defined as an edge of the components of the display panel 10-1. For example, the penetrating portion PNP may be defined as an edge of the substrate 100.

The display panel 10-1 may include the substrate 100, the buffer layer 111, the pixel circuit PC, the insulating layer IL, the organic light-emitting diode OLED as a display element, and the encapsulation layer 300. The substrate 100 may include the first region AR1 and the second region AR2, which are spaced apart from each other with the penetrating portion PNP therebetween.

The first side surface RS1 of the substrate 100, which is an edge of the first region AR1, and the second side surface RS2 of the substrate 100, which is an edge of the second region AR2, may define at least a portion of the penetrating portion PNP. According to an embodiment, a space between the first side surface RS1 and the second side surface RS2, which face each other, may be defined as the separated region V of the substrate 100. The separated region V may overlap the penetrating portion PNP.

The substrate 100 may include the upper surface 100US facing the organic light-emitting diode OLED and the lower surface 100LS opposite to the upper surface 100US. The first interval int1 between the first side surface RS1 and the second side surface RS2 from the upper surface 100US of the substrate 100 may be less than the second interval int2 between the first side surface RS1 and the second side surface RS2 from the lower surface 100LS of the substrate 100. The first interval int1 may be an interval from the first point 100P1, where the upper surface 100US of the substrate 100 and the first side surface RS1 contact each other, to the second point 100P2, where the upper surface 100US of the substrate 100 and the second side surface RS2 contact each other. The second interval int2 may be an interval from the third point 100P3, where the lower surface 100LS of the substrate 100 and the first side surface RS1 contact each other, to the fourth point 100P4, where the lower surface 100LS of the substrate 100 and the second side surface RS2 contact each other.

The substrate 100 may include a base layer and a barrier layer on the base layer. According to an embodiment, the substrate 100 may include the first base layer 100*a*, the first barrier layer 100*b*, the second base layer 100*c*, and the second barrier layer 100*d*, which are sequentially stacked on each other in the stated order. According to an embodiment, the first base layer 100*a* may include the first inclined surface ICS1 and the second inclined surface ICS2.

The first side surface RS1 and the second side surface RS2 may respectively include the first inclined surface ICS1 and the second inclined surface ICS2. The first inclined surface ICS1 may overlap the first external region ER1 that is an edge region of the first region AR1. The second inclined surface ICS2 may overlap the second external region ER2 that is an edge region of the second region AR2.

According to an embodiment, the first inclined surface ICS1 may be connected to the lower surface 100LS of the substrate 100 at the first region AR1. The second inclined surface ICS2 may be connected to the lower surface 100LS of the substrate 100 at the second region AR2. According to an embodiment, the distance between the first inclined surface ICS1 and the second inclined surface ICS2 may decrease in a direction from the lower surface 100LS of the substrate 100 to the upper surface 100US of the substrate 100. In other words, the substrate 100 may include an inverted tapered shape based on the penetrating portion PNP.

The first base layer 100*a* may include the upper surface 100*a*US of the first base layer 100*a*, the lower surface 100*a*LS of the first base layer 100*a*, the first inclined surface ICS1, and the first surface SS1 of the first base layer 100*a*.

The upper surface 100*a*US of the first base layer 100*a* may face the organic light-emitting diode OLED. The lower surface 100*a*LS of the first base layer 100*a* may be a surface opposite to the upper surface 100*a*US of the first base layer 100*a*. The first inclined surface ICS1 may contact the lower surface 100*a*LS of the first base layer 100*a*.

The first surface SS1 of the first base layer 100*a* may cross the upper surface 100*a*US of the first base layer 100*a* and the first inclined surface ICS1. The first surface SS1 of the first base layer 100*a* may contact the upper surface 100*a*US of the first base layer 100*a* and the first inclined surface ICS1.

For example, one side of the first surface SS1 of the first base layer 100a may contact the upper surface 100aUS of the first base layer 100a, and the other side of the first surface SS1 of the first base layer 100a may contact the first inclined surface ICS1. The first surface SS1 of the first base layer 100a may be a surface formed via an etching process.

The buffer layer 111 may be arranged on the substrate 100.

The pixel circuit PC may include the driving thin-film transistor T1, the switching thin-film transistor T2, and the storage capacitor Cst.

The insulating layer IL may include the first gate insulating layer 112, the second gate insulating layer 113, the interlayer insulating layer 114, the first inorganic layer PVX1, the first organic insulating layer 115, the second organic insulating layer 116, and the second inorganic layer PVX2.

The organic light-emitting diode OLED may be arranged on the second organic insulating layer 116. The organic light-emitting diode OLED may include the first organic light-emitting diode OLED1 and the second organic light-emitting diode OLED2. The first organic light-emitting diode OLED1 may overlap the first region AR1, as the first display element. The second organic light-emitting diode OLED2 may overlap the second region AR2, as the second display element.

The first organic light-emitting diode OLED1 may include the first pixel electrode 211A, the intermediate layer 212, and the opposing electrode 213. The second organic light-emitting diode OLED2 may include the second pixel electrode 211B, the intermediate layer 212, and the opposing electrode 213.

The first inorganic encapsulation layer 310 may cover the organic light-emitting diode OLED. The first inorganic encapsulation layer 310 may entirely and continuously cover the substrate 100. The first inorganic encapsulation layer 310 may cover the first organic light-emitting diode OLED1, the hole HL, the first dam portion DAM1, the second dam portion DAM2, and the second organic light-emitting diode OLED2. The first inorganic encapsulation layer 310 may contact the protruding tip PT of the second inorganic layer PVX2. The first inorganic encapsulation layer 310 may contact the first inorganic layer PVX1. Accordingly, moisture or oxygen may be prevented from being introduced from the penetrating portion PNP to the organic light-emitting diode OLED through a layer including an organic material.

The organic encapsulation layer 320 may be arranged on the first inorganic encapsulation layer 310. The organic encapsulation layer 320 may overlap the first organic light-emitting diode OLED1 and the second organic light-emitting diode OLED2, and may fill the hole HL. According to an embodiment, the organic encapsulation layer 320 may be separated based on the penetrating portion PNP. Because the first dam portion DAM1 and the second dam portion DAM2 protrude in the thickness direction of the substrate 100 from the upper surface of the second inorganic layer PVX2, a flow of the organic encapsulation layer 320 may be controlled.

The second inorganic encapsulation layer 330 may cover the organic encapsulation layer 320. The second inorganic encapsulation layer 330 may entirely and continuously cover the substrate 100. The second inorganic encapsulation layer 330 may contact the first inorganic encapsulation layer 310 on the first dam portion DAM1 and the second dam portion DAM2. Accordingly, the organic encapsulation layer 320 may be separated by the first dam portion DAM1 and the second dam portion DAM2.

According to an embodiment, the penetrating portion PNP may be defined in the display panel 10-1 and enhance flexibility of the display panel 10-1. The penetrating portion PNP may be defined by the first side surface RS1 of the substrate 100, which is the edge of the first region AR1, and the second side surface RS2 of the substrate 100, which is the edge of the second region AR2. The first side surface RS1 and the second side surface RS2 may respectively include the first inclined surface ICS1 and the second inclined surface ICS2.

According to an embodiment, the first interval int1 may be less than the second interval int2, and the substrate 100 includes the first inclined surface ICS1 and the second inclined surface ICS2. Accordingly, the amount of substrate 100 etched in the separated region V may be reduced, thereby reducing the processing time of the display panel 10-1.

Figure 21A:
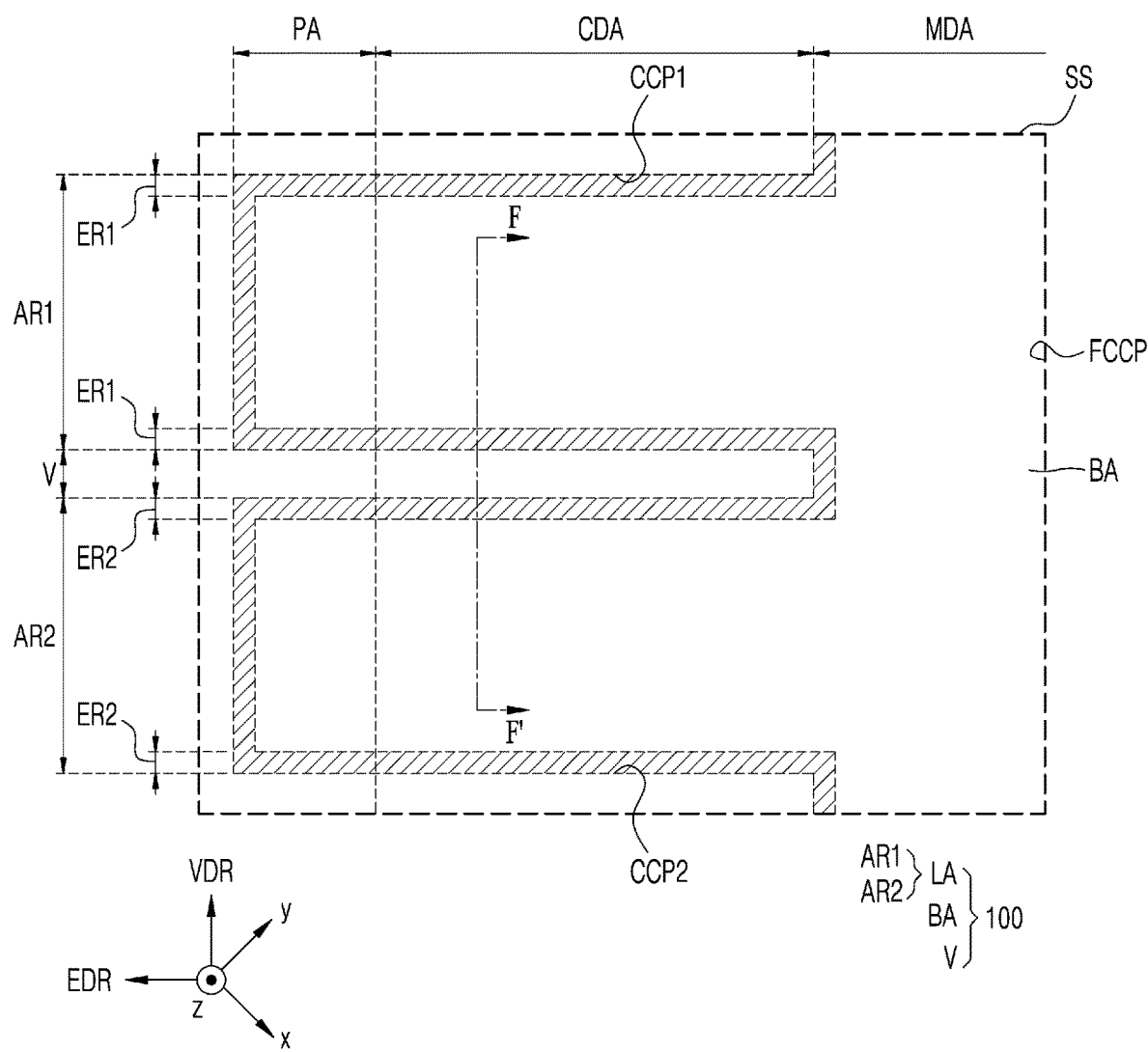
FIG. 21A is a plan view for describing a method of manufacturing a display apparatus according to an embodiment.
Figure 21B:
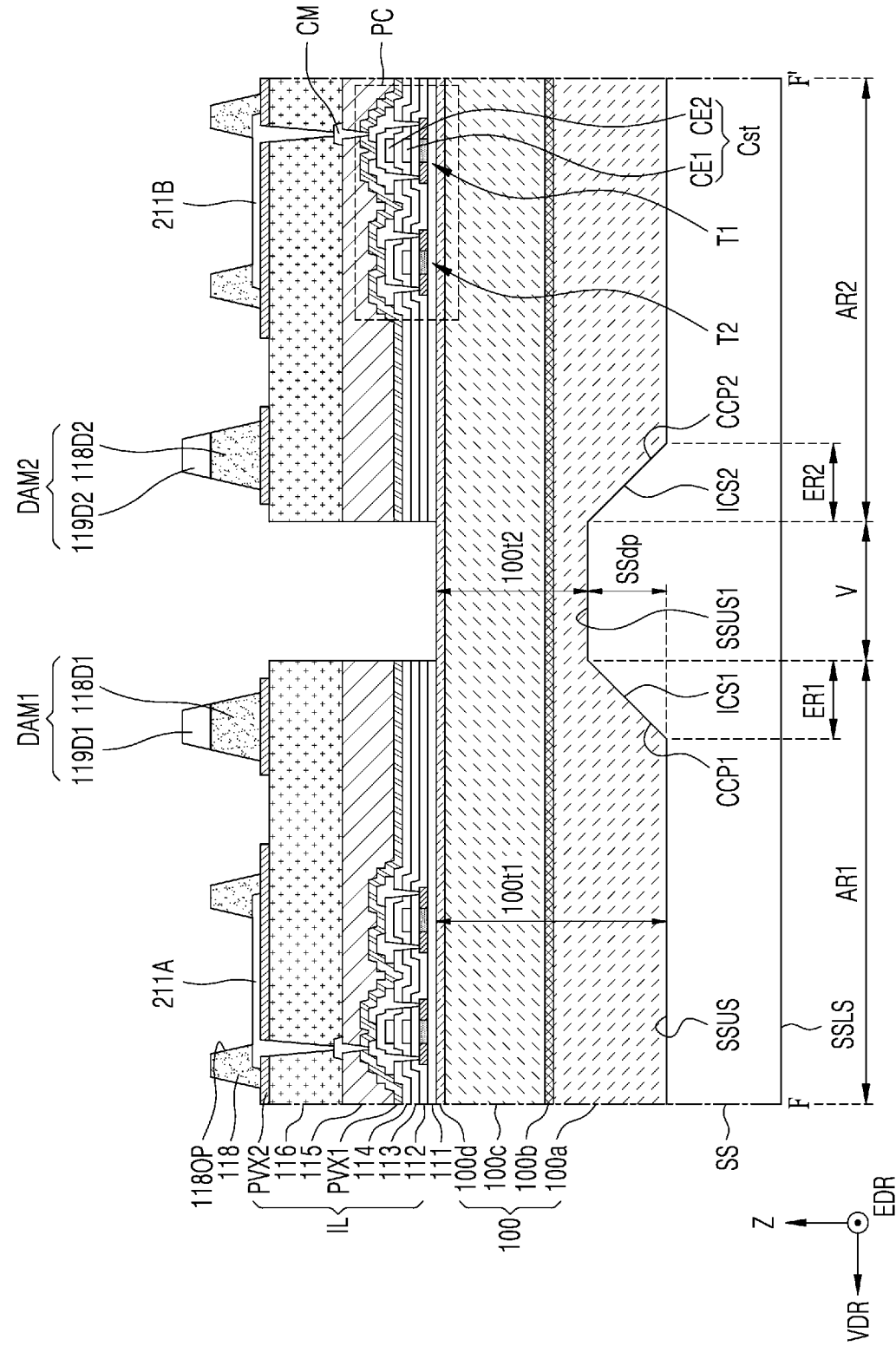
FIGS. 21B, 21C, and 21D are cross-sectional views for describing a method of manufacturing a display apparatus according to an embodiment.
Figure 21C:
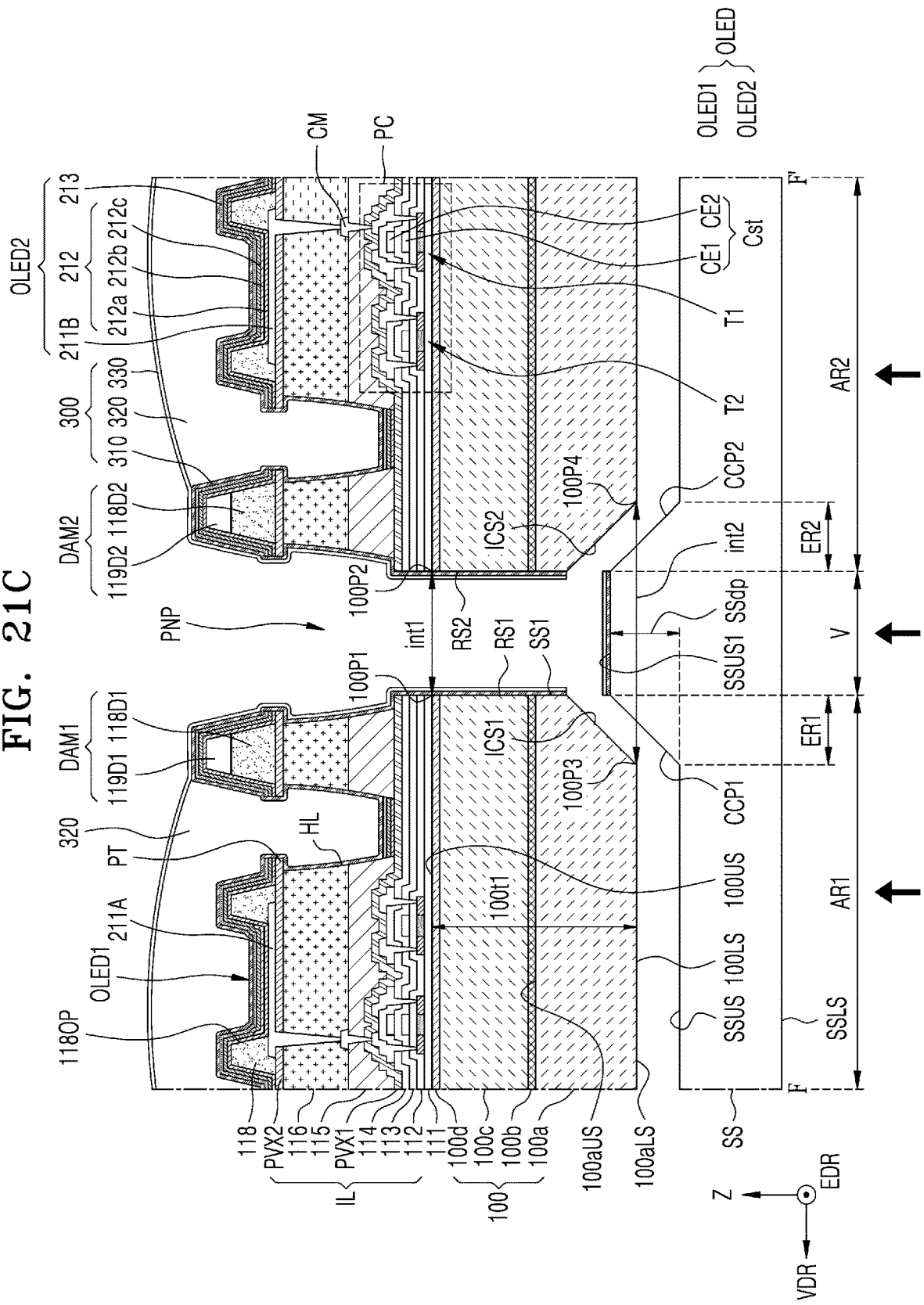
Figure 21D:
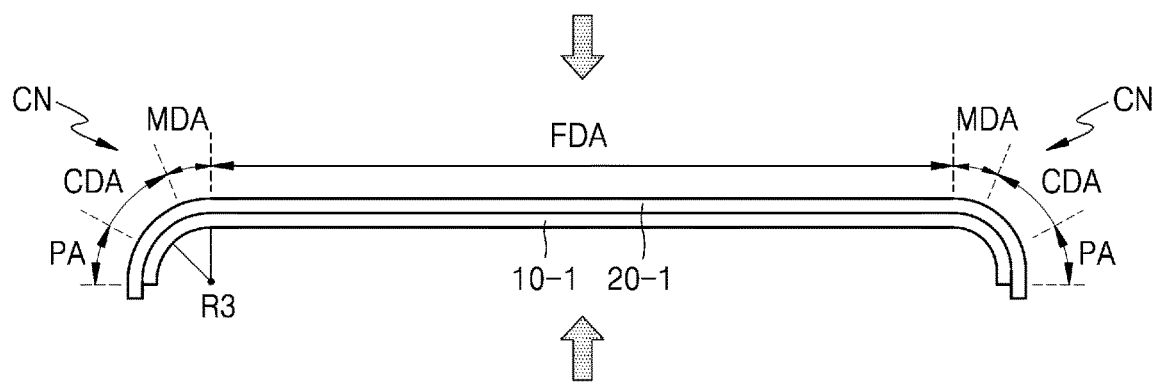

FIG. 21A is a plan view for describing a method of manufacturing a display apparatus according to an embodiment. FIGS. 21B through 21D are cross-sectional views for describing a method of manufacturing a display apparatus according to an embodiment of the disclosure. FIGS. 21B through 21D are cross-sectional views showing the support substrate SS taken along a line F-F' of FIG. 21A, and a multi-layer film formed on the support substrate SS. In FIGS. 21A through 21D, like reference numerals as FIGS. 10A through 10E denote like elements, and thus, redundant descriptions thereof will be omitted for ease in explanation of these figures.

Referring to FIG. 21A, the support substrate SS including the first concave portion CCP1 and the second concave portion CCP2 may be prepared. The support substrate SS may further include a front concave portion FCCP. The front concave portion FCCP may be integrated with the first concave portion CCP1 and the second concave portion CCP2. The first concave portion CCP1 and the second concave portion CCP2 may extend in a direction away from the front concave portion FCCP.

The substrate 100 overlapping the first concave portion CCP1 and the second concave portion CCP2 may be formed on the support substrate SS. The substrate 100 may include the body area BA, the first region AR1, the second region AR2, and the separated region V. The body area BA may overlap the front concave portion FCCP.

The first region AR1 may overlap the first concave portion CCP1. The first region AR1 may include the first external region ER1 that is an edge region. The first external region ER1 may extend along the edge of the first region AR1. The first external region ER1 may contact the separated region V.

The second region AR2 may overlap the second concave portion CCP2. The second region AR2 may include the second external region ER2 that is an edge region. The second external region ER2 may extend along the edge of the second region AR2. The second external region ER2 may contact the separated region V.

Referring to FIG. 21B, the substrate 100 may include the first base layer 100a, the first barrier layer 100b, the second base layer 100c, and the second barrier layer 100d, which are sequentially stacked on each other in the stated order. According to an embodiment, the substrate 100 may be the substrate 100 according to the second embodiment described with reference to FIG. 2A. According to another embodiment, the substrate 100 may be one of the substrate 100 according to the first embodiment described with reference to FIGS. 1A through 1C, the substrate 100 according to the third embodiment described with reference to FIG. 2B, the substrate 100 according to the fourth embodiment described with reference to FIGS. 3A through 3D, the substrate 100 according to the fifth embodiment described with reference to FIG. 4, and the substrate 100 according to the sixth embodiment described with reference to FIGS. 5A through 5C. Hereinafter, a case in which the substrate 100 is the substrate 100 according to the second embodiment described with reference to FIG. 2A will be mainly described.

According to an embodiment, the support substrate SS may include the first concave portion CCP1 and the second concave portion CCP2, and the substrate 100 may overlap the first concave portion CCP1 and the second concave portion CCP2. Accordingly, a thickness of the substrate 100 may vary according to regions. For example, the thickness 100t1 of the substrate 100 in the first region AR1 may be greater than the thickness 100t2 of the substrate 100 between the first region AR1 and the second region AR2.

Referring to FIG. 21C, a portion of the substrate 100 overlapping the first upper surface SSUS1 of the support substrate SS may be removed. In other words, a portion of the substrate 100 overlapping the separated region V may be removed. Accordingly, the first upper surface SSUS1 of the support substrate SS may be externally exposed.

The penetrating portion PNP may be formed when the portion of the substrate 100 overlapping the first upper surface SSUS1 of the support substrate SS is removed. The first side surface RS1 of the substrate 100, which is an edge of the first region AR1, and the second side surface RS2 of the substrate 100, which is an edge of the second region AR2, may define at least a portion of the penetrating portion PNP.

According to an embodiment, the support substrate SS may include the first concave portion CCP1 and the second concave portion CCP2, and the substrate 100 may overlap the first concave portion CCP1 and the second concave portion CCP2. Accordingly, an amount of substrate 100 etched in the separated region V may be reduced. For example, an amount of substrate 100 etched by a depth SSdp of the first concave portion CCP1 and/or the second concave portion CCP2 may be reduced, and a processing time of the display panel and/or a display apparatus may be reduced.

Next, the intermediate layer 212 and the opposing electrode 213 may be formed on the substrate 100. Accordingly, the first organic light-emitting diode OLED1 and the second organic light-emitting diode OLED2 may be formed. Next, the encapsulation layer 300 may be formed.

According to an embodiment, the support substrate SS may include the first concave portion CCP1 overlapping the first region AR1 and the second concave portion CCP2 overlapping the second region AR2. Accordingly, the depth of the penetrating portion PNP may be defined from the upper surface of the encapsulation layer 300 to the first upper surface SSUS1 of the support substrate SS.

Compared to a case where the support substrate SS does not include the first concave portion CCP1 and the second concave portion CCP2, the height from the upper surface SSUS of the support substrate SS to the upper surface of the encapsulation layer 300 may be decreased by the depth SSdp of the first concave portion CCP1 and/or the second concave portion CCP2. Accordingly, the process difficulty level caused by the depth of the penetrating portion PNP may be reduced.

Then, the substrate 100 may be detached from the support substrate SS. According to an embodiment, the substrate 100 may be separated from the support substrate SS according to a laser release of irradiating a laser beam onto the substrate 100.

The first interval int1 between the first side surface RS1 and the second side surface RS2 from the upper surface 100US of the substrate 100 may be less than the second interval int2 between the first side surface RS1 and the second side surface RS2 from the lower surface 100LS of the substrate 100. Also, the first side surface RS1 and the second side surface RS2 may respectively include the first inclined surface ICS1 and the second inclined surface ICS2. Accordingly, the substrate 100 may be easily detached from the support substrate SS.

Referring to FIG. 21D, the manufactured display panel 10-1 may be bent. In particular, the corner display area CDA overlapping the corner CN of the manufactured display panel 10-1 may be bent. According to an embodiment, the corner display area CDA may have the third radius of curvature R3. According to an embodiment, the corner display area CDA may be bent in a vacuum state after a guide film is arranged below the manufactured display panel 10-1. According to an embodiment, the corner display area CDA may be bent via a thermoforming method.

Then, the cover window 20-1 may be arranged on the display panel 10-1 manufactured as above. The manufactured display panel 10-1 may be adhered to the cover window 20-1. According to an embodiment, the manufactured display panel 10-1 may be connected to the cover window 20-1 via an optical transparent adhesive. The manufactured display panel 10-1 may be adhered to the cover window 20-1 via a lamination process. As such, the cover window 20-1 may be arranged on the corner display area CDA.

Figure 22:
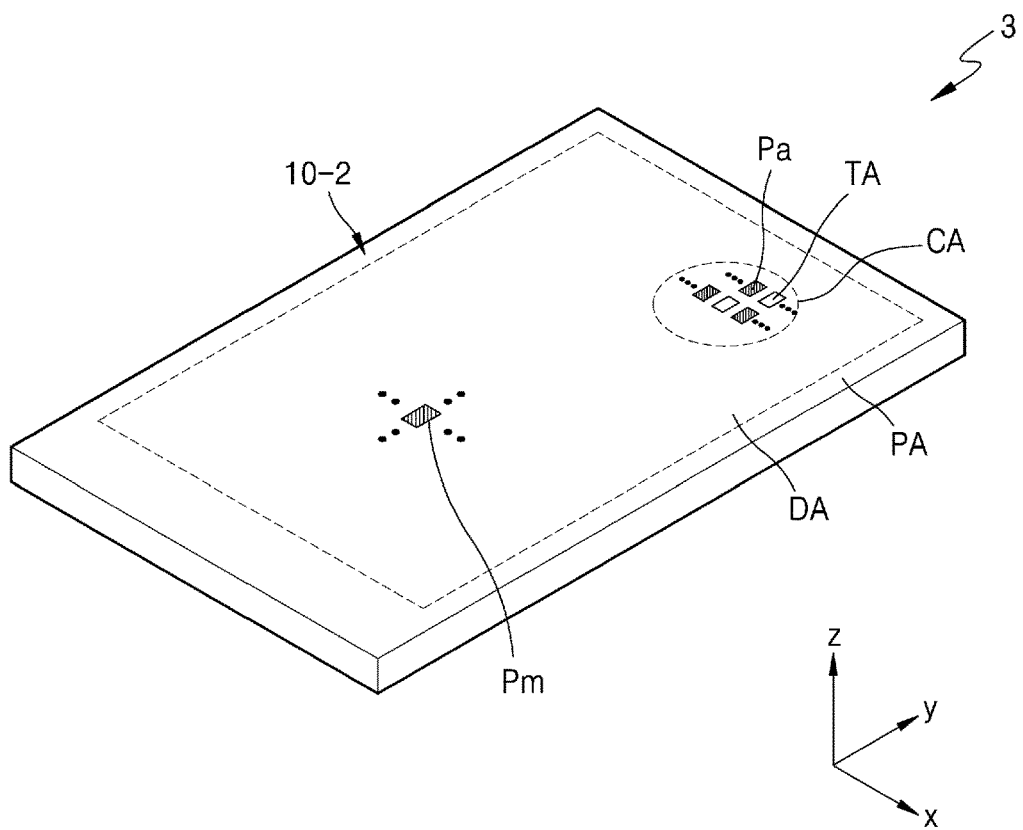
FIG. 22 is a perspective view of a display apparatus according to an embodiment of the disclosure.

FIG. 22 is a perspective view of a display apparatus 3 according to an embodiment. In FIG. 22, like reference numerals as FIG. 15 denote like elements, and thus, redundant descriptions thereof will be omitted for ease in explanation of that figure.

Referring to FIG. 22, the display apparatus 3 may include a display panel 10-2. The display panel 10-2 may include a component area CA, the display area DA and the peripheral area PA.

The component area CA realizes an image and a component may be arranged therein. An auxiliary pixel Pa and a plurality of transmission areas TA may be arranged in the component area CA. The auxiliary pixel Pa may include an auxiliary display element. According to an embodiment, the auxiliary pixel Pa may be arranged between the adjacent transmission areas TA.

The display area DA may realize an image. The display area DA may surround at least a portion of the component area CA. According to an embodiment, the display area DA may entirely cover the component area CA. A main pixel Pm may be arranged in the display area DA. The main pixel Pm may include a main display element. According to an embodiment, the plurality of main pixels Pm may be arranged in the display area DA.

Figure 23:
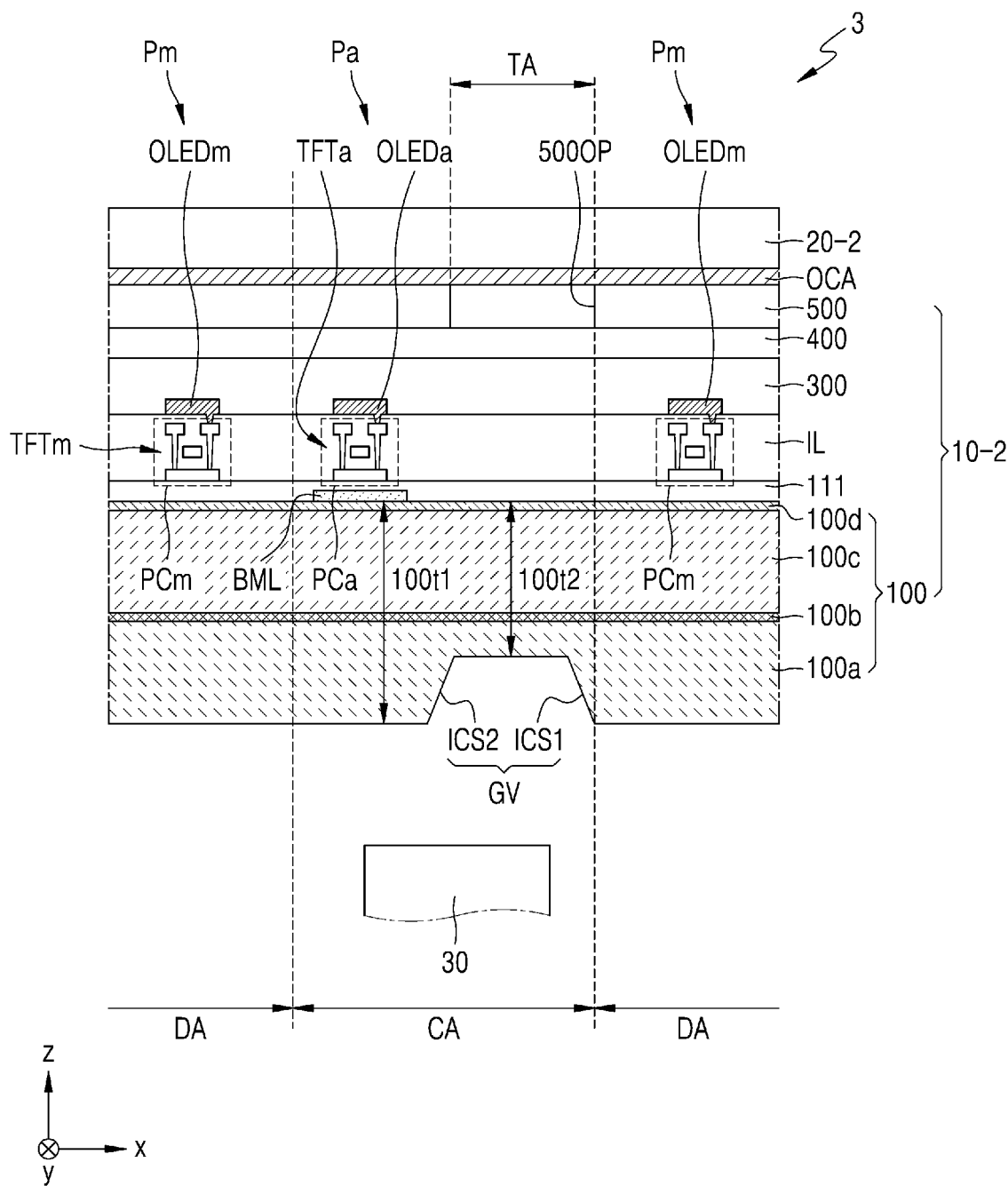
FIG. 23 is a cross-sectional view of a display apparatus according to an embodiment.

FIG. 23 is a cross-sectional view of the display apparatus 3, according to an embodiment.

Referring to FIG. 23, the display apparatus 3 may include the display panel 10-2, a cover window 20-2, and a component 30.

The display panel 10-2 may include the substrate 100 and a multi-layer film arranged on the substrate 100. According to an embodiment, the display panel 10-2 may include the substrate 100, a bottom metal layer BML, the buffer layer 111, the insulating layer IL, the encapsulation layer 300, a touch electrode layer 400, and an optical functional layer 500.

The display area DA and the component area CA may be defined in the substrate 100 and/or the multi-layer film. In other words, the display area DA and the component area CA may be defined in the substrate 100 and/or the multi-layer film. Hereinafter, a case where the display area DA and the component area CA are defined in the substrate 100 will be mainly described in detail.

According to an embodiment, the substrate 100 may be the substrate 100 according to the second embodiment described with reference to FIG. 2A. According to another embodiment, the substrate 100 may be one of the substrate 100 according to the first embodiment described with reference to FIGS. 1A through 1C, the substrate 100 according to the third embodiment described with reference to FIG. 2B, the substrate 100 according to the fourth embodiment described with reference to FIGS. 3A through 3D, the substrate 100 according to the fifth embodiment described with reference to FIG. 4, and the substrate 100 according to the sixth embodiment described with reference to FIGS. 5A through 5C. Hereinafter, a case in which the substrate 100 is the substrate 100 according to the second embodiment described with reference to FIG. 2A will be mainly described.

The substrate 100 may include the first base layer 100a, the first barrier layer 100b, the second base layer 100c, and the second barrier layer 100d, which are sequentially stacked on each other in the stated order. According to an embodiment, the first base layer 100a may include the first inclined surface ICS1 and the second inclined surface ICS2. According to an embodiment, the first inclined surface ICS1 and the second inclined surface ICS2 may define a groove GV. Accordingly, a thickness of the substrate 100 may vary according to regions. For example, the thickness 100t2 of the substrate 100 at the groove GV may be less than the thickness 100t1 of the substrate 100 at the display area DA.

The main pixel Pm may be arranged in the display area DA. The main pixel Pm may include a main pixel circuit PCm and a main organic light-emitting diode OLEDm connected thereto. The main pixel circuit PCm may include at least one main thin-film transistor TFTm.

The component area CA may include the plurality of transmission areas TA and the auxiliary pixel Pa may be arranged between the adjacent transmission areas TA. The auxiliary pixel Pa may include an auxiliary pixel circuit PCa and an auxiliary organic light-emitting diode OLEDa connected thereto. The auxiliary pixel circuit PCa may include at least one auxiliary thin-film transistor TFTa. In other words, the auxiliary organic light-emitting diode OLEDa may be arranged on the component area CA and spaced apart from the transmission area TA.

The plurality of transmission areas TA may overlap the component 30. FIG. 23 illustrates only one transmission area TA. The plurality of transmission areas TA may be a region where a light/signal emitted from the component 30 or a light/signal incident on the component 30 is transmitted.

According to an embodiment, the groove GV may overlap the transmission area TA and face the component 30. According to an embodiment, the first inclined surface ICS1 and the second inclined surface ICS2 may face the component 30. Accordingly, because a thickness of the first base layer 100a at the groove GV is less than a thickness of the first base layer 100a at the display area DA, light transmittance in the transmission area TA may be enhanced.

The bottom metal layer BML may be arranged in the component area CA. The bottom metal layer BML may be arranged to correspond to a bottom of the auxiliary thin-film transistor TFTa. The bottom metal layer BML may prevent an external light from reaching the auxiliary thin-film transistor TFTa. According to some embodiments, a constant voltage or signal may be applied to the bottom metal layer BML, thereby preventing damage to a pixel circuit caused by electrostatic discharge. In FIG. 23, the bottom metal layer BML is arranged on the substrate 100 but according to some embodiments, the bottom metal layer BML may be inserted into the substrate 100.

The encapsulation layer 300 may cover the auxiliary organic light-emitting diode OLEDa and the main organic light-emitting diode OLEDm. According to an embodiment, the encapsulation layer 300 may include at least one inorganic encapsulation layer and at least one organic encapsulation layer. The at least one inorganic encapsulation layer may include at least one inorganic material from among Al2O3, TiO2, Ta2O5, ZnO, SiO2, SiNx, and SiON. The at least one organic encapsulation layer may include a polymer-based material. Examples of the polymer-based material may include an acrylic resin, an epoxy resin, polyimide, and/or polyethylene. According to an embodiment, the at least one organic encapsulation layer may include acrylate.

According to another embodiment, the encapsulation layer 300 may have a structure in which the substrate 100 and an upper substrate of a transparent member are combined via a sealing member, thereby sealing an internal space between the substrate 100 and the upper substrate. Here, a moisture absorbent or filler may be located in the internal space. The sealing member may be a sealant, and according to another embodiment, the sealing member may include a material hardened by a laser beam. For example, the sealing member may be a frit. In detail, the sealing member may include a urethane-based resin, an epoxy-based resin, or an acryl-based resin, which is an organic sealant, or a silicone that is an inorganic sealant. The urethane-based resin may use, for example, urethane acrylate. The acryl-based resin may use, for example, butyl acrylate or ethylhexyl acrylate. Meanwhile, the sealing member may include a material hardened by heat.

The touch electrode layer 400 may be arranged on the encapsulation layer 300. The touch electrode layer 400 may obtain coordinate information according to an external input, for example, a touch event.

The optical functional layer 500 may be arranged on the touch electrode layer 400. The optical functional layer 500 may reduce reflectance of a light (external light) incident from the outside towards the display apparatus 3, and/or enhance color purity of a light emitted from the display apparatus 3.

According to an embodiment, the optical functional layer 500 may include an opening 500OP overlapping the plurality of transmission areas TA. Accordingly, light transmittance of the plurality of transmission areas TA may be enhanced. A transparent material, such as an optically clear resin (OCR), may be filled in the opening 500OP overlapping the plurality of transmission areas TA.

The cover window 20-2 may be arranged on the display panel 10-2. The cover window 20-2 may be adhered to the display panel 10-2 by a transparent adhesive member, such as an optically clear adhesive (OCA). The cover window 20-2 of FIG. 23 is similar to the cover window 20 of FIG. 6, and thus details thereof will be omitted for ease in explanation of that figure.

The component 30 may overlap the component area CA. The component 30 may include an electronic element. For example, the component 30 may be an electronic element using light or sound. For example, the electronic element may include a sensor receiving and using a light, such as an infrared sensor, a camera capturing an image by receiving a light, a sensor measuring a distance by outputting and detecting a light or sound, or recognizing a fingerprint, a small lamp outputting a light, or a speaker outputting sound. The electronic element using light may use light of various wavelength bands, such as visible light, infrared light, or ultraviolet light.

As described above, a display panel according to an embodiment may be flexible by including a first side surface and a second side surface, which define a penetrating portion, and may have enhanced reliability because a distance between the first side surface and the second side surface at an upper surface of a substrate is less than a distance between the first side surface and the second side surface at a lower surface of the substrate.

Also, a display apparatus according to an embodiment of the disclosure may have enhanced light transmittance in a transmission area because a thickness of a first base layer at a groove is less than a thickness of the first base layer at a display area.

In addition, in a method of manufacturing a display apparatus, according to an embodiment, the display apparatus having enhanced reliability may be manufactured by forming a substrate overlapping a first concave portion and a second concave portion on a support substrate including the first concave portion and the second concave portion.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display panel comprising:
   a substrate including a first region and a second region, which are spaced apart from each other with a penetrating portion provided therebetween; and
   a display element arranged on the substrate and including a first display element overlapping the first region and a second display element overlapping the second region,
   wherein a first side surface of the substrate that corresponds to an edge of the first region, and a second side surface of the substrate that corresponds to an edge of the second region, respectively define at least first and second portions of the penetrating portion, and
   an interval between the first side surface and the second side surface closest to an upper surface of the substrate that faces the display element, is different from an interval between the first side surface and the second side surface closest to a lower surface of the substrate, the lower surface being opposite to the upper surface of the substrate and does not face the display element.

2. The display panel of claim 1, wherein the substrate comprises a first base layer and a first barrier layer arranged on the first base layer, and
   the first side surface and the second side surface respectively comprise a first inclined surface of the first base layer and a second inclined surface of the first base layer.

3. The display panel of claim 2, wherein the first base layer further comprises an upper surface of the first base layer that faces the display element, a lower surface of the first base layer and that is opposite to the upper surface of the first base layer and connected to the first inclined surface, and a first surface connected to the upper surface of the first base layer and the first inclined surface and crossing the first inclined surface and the upper surface of the first base layer.

4. The display panel of claim 2, wherein the first base layer further comprises an upper surface of the first base layer that faces the display element, and a lower surface of the first base layer that is opposite to the upper surface of the first base layer and that is connected to the first inclined surface,
   wherein the first inclined surface is connected to the upper surface of the first base layer.

5. The display panel of claim 2, wherein the substrate further comprises a second base layer and second barrier layer that cover the first barrier layer,
   wherein the second base layer contacts at least a portion of the first base layer.

6. The display panel of claim 2, wherein the first base layer comprises a first base pattern overlapping the first region and a second base pattern overlapping the second region and spaced apart from the first base pattern,
   the first barrier layer comprises a first barrier pattern arranged on the first base pattern and a second barrier pattern arranged on the first base layer and spaced apart from the first barrier pattern, and
   a shortest distance between the first barrier pattern and the second barrier pattern is different from a shortest distance between the first base pattern and the second base pattern.

7. The display panel of claim 2, wherein a distance between the first inclined surface and the second inclined surface decreases in a direction from a lower surface of the first base layer towards an upper surface of the first base layer.

8. The display panel of claim 1, further comprising at least one inorganic layer and at least one organic layer,
   wherein the at least one organic layer includes a first organic layer region and a second organic layer region separated from each other based on the penetrating portion being disposed therebetween.

9. The display panel of claim 1, wherein the first region comprises a first center region, a first connection region extending from the first center region in a first direction, and a second connection region extending in a second direction crossing the first direction, and
   one of the first connection region and the second connection region extends from the first center region to the second region.

10. The display panel of claim 1, wherein each of the first region and the second region comprises a center region and connection regions, and
    each center region is connected to four connection regions extending in different directions from each other.

11. The display panel of claim 10, wherein each of the four connection regions comprises at least a curved portion and a straight portion.

* * * * *